US012613472B2

(12) United States Patent
Jiang et al.

(10) Patent No.: US 12,613,472 B2
(45) Date of Patent: Apr. 28, 2026

(54) PROCESS WINDOW BASED ON A FAILURE RATE MODEL

(71) Applicant: ASML NETHERLANDS B.V., Veldhoven (NL)

(72) Inventors: Aiqin Jiang, Duanesburg, NY (US); Sudharshanan Raghunathan, Fremont, CA (US); Jill Elizabeth Freeman, San Jose, CA (US); Fuming Wang, Santa Clara, CA (US); Fei Yan, Shenzhen (CN)

(73) Assignee: ASML NETHERLANDS B.V., Veldhoven (NL)

( * ) Notice: Subject to any disclaimer, the term of this patent is extended or adjusted under 35 U.S.C. 154(b) by 472 days.

(21) Appl. No.: 18/008,765

(22) PCT Filed: Jun. 17, 2021

(86) PCT No.: PCT/EP2021/066324
§ 371 (c)(1),
(2) Date: Dec. 7, 2022

(87) PCT Pub. No.: WO2022/002599
PCT Pub. Date: Jan. 6, 2022

(65) Prior Publication Data
US 2023/0221652 A1     Jul. 13, 2023

(30) Foreign Application Priority Data

Jul. 3, 2020   (WO) ................ PCT/CN2020/100137
Mar. 16, 2021   (WO) ................ PCT/CN2021/081068

(51) Int. Cl.
*G03F 7/00*           (2006.01)

(52) U.S. Cl.
CPC .......... *G03F 7/705* (2013.01); *G03F 7/70625* (2013.01); *G03F 7/7065* (2013.01); *G03F 7/706837* (2023.05); *G03F 7/706839* (2023.05)

(58) Field of Classification Search
CPC ...................................................... G03F 7/705
(Continued)

(56) References Cited

U.S. PATENT DOCUMENTS 6,961,116 B2   11/2005   Den Boef et al.
7,587,704 B2   9/2009   Ye et al.
(Continued)

FOREIGN PATENT DOCUMENTS

CN         101751502      6/2010
CN         106325005      1/2017
(Continued)

OTHER PUBLICATIONS

Office Action issued in corresponding Korean Patent Application No. 10-2023-7000226, dated Oct. 17, 2024.
(Continued)

*Primary Examiner* — Md Azad
(74) *Attorney, Agent, or Firm* — Pillsbury Winthrop Shaw Pittman LLP

(57) ABSTRACT

A method for determining a process window of a patterning process based on a failure rate. The method includes obtaining a plurality of features printed on a substrate, grouping, based on a metric, the features into a plurality of groups, and generating, based on measurement data associated with a group of features, a base failure rate model for the group of features, wherein the base failure rate model identifies the process window related to the failure rate of the group of features. The method can further include generating, using the base failure rate model, a feature-specific failure rate (Continued)

model for a specific feature, wherein the feature-specific failure rate model identifies a feature-specific process window such that an estimated failure rate of the specific feature is below a specified threshold.

20 Claims, 34 Drawing Sheets

(58) Field of Classification Search
    USPC ....................................................... 700/120
    See application file for complete search history.

(56) References Cited

U.S. PATENT DOCUMENTS

| | | | |
|---|---|---|---|
| 9,360,766 | B2 | 6/2016 | Ye et al. |
| 10,459,345 | B2 | 10/2019 | Hunsche et al. |
| 11,348,018 | B2 * | 5/2022 | Rao ...................... G05B 23/024 |
| 11,354,484 | B2 | 6/2022 | Hansen |
| 2006/0066855 | A1 | 3/2006 | Boef et al. |
| 2007/0061772 | A1 | 3/2007 | Ye et al. |
| 2008/0024766 | A1 * | 1/2008 | Mieher ................ G03F 9/7088 356/73 |
| 2009/0157360 | A1 | 6/2009 | Ye et al. |
| 2010/0293413 | A1 * | 11/2010 | Borjon ...................... G03F 1/36 714/E11.178 |
| 2011/0027704 | A1 * | 2/2011 | Cramer ............... G03F 7/70625 430/30 |
| 2011/0043791 | A1 | 2/2011 | Smilde et al. |
| 2012/0242970 | A1 | 9/2012 | Smilde et al. |
| 2016/0162626 | A1 | 6/2016 | Hermann et al. |
| 2016/0180003 | A1 | 6/2016 | Greco et al. |
| 2019/0188584 | A1 * | 6/2019 | Rao ........................ G06Q 10/00 |
| 2021/0018850 | A1 | 1/2021 | Slachter et al. |
| 2021/0374033 | A1 * | 12/2021 | Yang ................... G06F 11/3452 |

FOREIGN PATENT DOCUMENTS

| | | | | |
|---|---|---|---|---|
| TW | 200931200 | 7/2009 | | |
| TW | 201704886 | 2/2017 | | |
| TW | 202024772 | 7/2020 | | |
| WO | 2009/078708 | 6/2009 | | |
| WO | 2009/106279 | 9/2009 | | |
| WO | 2019/121486 | 6/2019 | | |
| WO | 2020/064544 | 4/2020 | | |
| WO | 2020/094389 | 5/2020 | | |
| WO | WO-2020094389 A1 * | 5/2020 | ............ | G03F 7/705 |

OTHER PUBLICATIONS

Office Action issued in corresponding Taiwanese Patent Application No. 111133718, dated May 12, 2023.

International Search Report and Written Opinion dated Oct. 11, 2021, issued in corresponding International Application No. PCT/EP2021/066324, pp. 1-11.

Office Action dated Feb. 23, 2022, issued in corresponding Taiwanese Patent Application No. 110122290, pp. 1-6.

Sturtevant et al., "Process window-based feature and die failure rate prediction", Proc of SPIE, vol. 10962 (Mar. 20, 2019).

Maslow et al., "Understanding the Significance of Local Variability in Defect Aware Process Windows", IEEE Transactions on Semiconductor Manufacturing, vol. 33, No. 1, pp. 42-52 (Dec. 16, 2019).

Anonymous, "Process Window Based on Failure Rate", Research Disclosure, vol. 676, No. 68 (Aug. 2020).

Wallace et al., "Assessment of Stochastic Fail Rate using E-Beam Massive Metrology", Proc. of SPIE, vol. 11611, pp. 1-7 (Feb. 22, 2021).

Office Action issued in corresponding Chinese Patent Application No. 202180046736.0, dated Dec. 17, 2025.

* cited by examiner

771
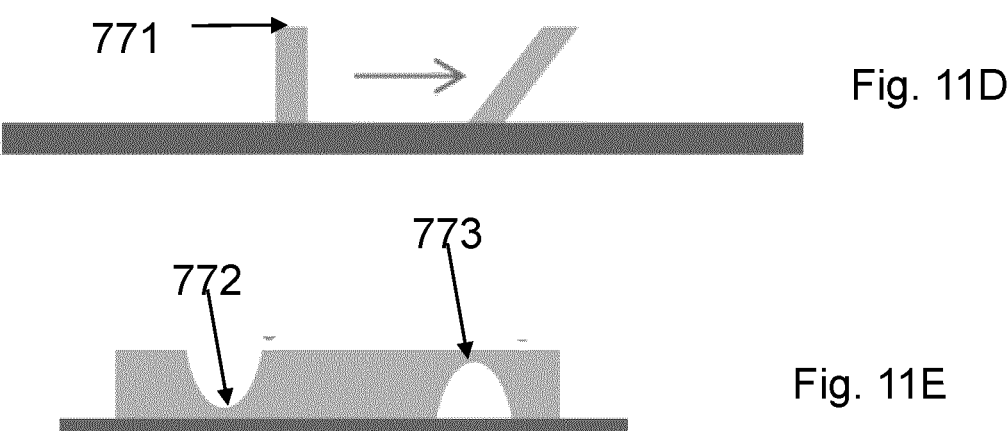
Fig. 11D
772        773
Fig. 11E
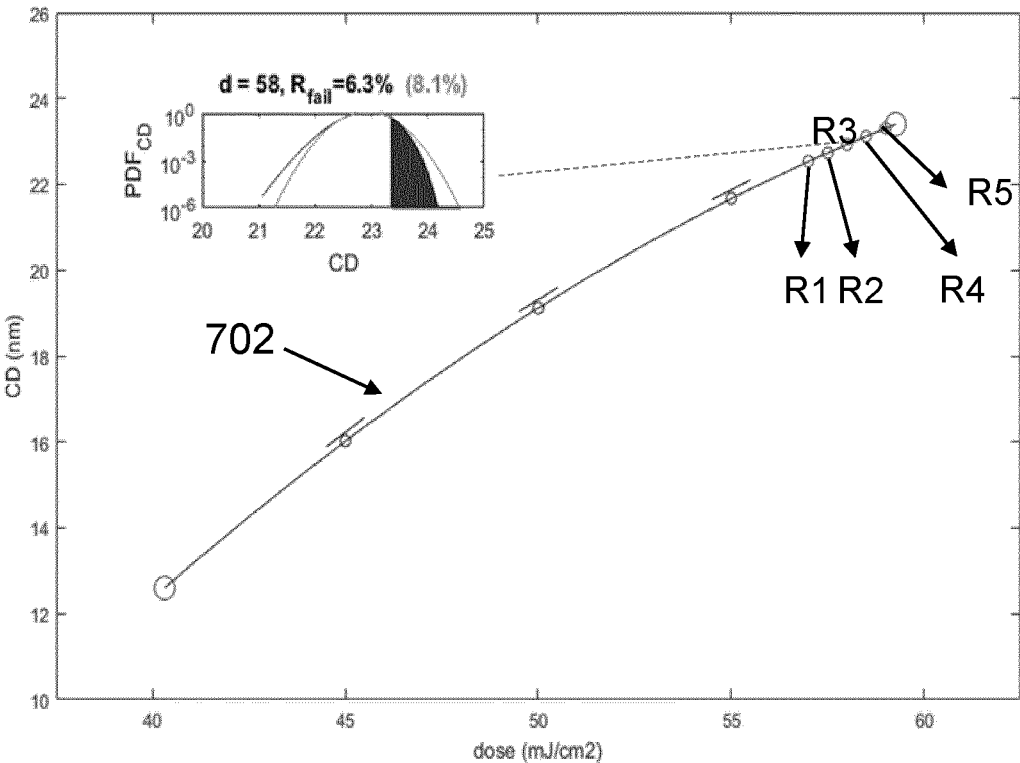
Fig. 11F

1605

1610

1615

1650

1851

1910

PROCESS WINDOW BASED ON A FAILURE RATE MODEL

CROSS-REFERENCE TO RELATED APPLICATIONS

This application is the U.S. national phase entry of PCT patent application no. PCT/EP2021/066324 which was filed on Jun. 17, 2021, which claims priority of PCT patent application no. PCT/CN2020/100137 which was filed on Jul. 3, 2020, and of PCT patent application no. PCT/CN2021/081068 which was filed on Mar. 16, 2021, and which are incorporated herein in their entireties by reference.

FIELD

The present disclosure relates to techniques of improving the performance of a device manufacturing process. The techniques may be used in connection with a lithographic apparatus or a metrology apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

According to an embodiment of the present disclosure, there is provided a non-transitory computer-readable media comprising instructions that, when executed by a computer, cause the computer to execute a method for determining a process window of a patterning process based on a failure rate of a feature. The method includes obtaining a plurality of features printed on a substrate; grouping, based on a metric, the features into a plurality of groups; and generating, based on measurement data associated with a group of features, a base failure rate model for the group of features, wherein the base failure rate model identifies the process window related to the failure rate of the group of features.

In some embodiments, the metric includes: (a) a process window of each feature of the features, wherein the process window is a function of process variables associated with the corresponding feature, and (b) a parameter associated with the corresponding feature.

In some embodiments, the process variables include a focus and dose value associated with an apparatus used for the patterning process, and wherein the parameter includes a critical dimension (CD) value of the corresponding feature.

In some embodiments, grouping the features includes: (a) for each feature of the features, obtaining as a metric value a mean CD value of the corresponding feature and a plurality of dose values and focus values associated with the mean CD at an edge of a process window of the corresponding feature, and (b) clustering the features into the groups of features based on the metric values for the features, wherein features within a specific group have metric values that vary within a first threshold.

In some embodiments, the clustering the features includes clustering the features using k-means algorithm.

In some embodiments, obtaining the features includes: obtaining a plurality of images having the features printed on the substrate, and analyzing the images to select those of the features that satisfy a specified criterion as the plurality of features.

In some embodiments, the specified criterion includes a number of occurrences of a feature across the substrate being below a first threshold or a number of occurrences of the feature in an image of the images being below a second threshold.

In some embodiments, generating the base failure rate model for the group of features includes: (a) obtaining mean CD of the group of features, (b) determining local CD uniformity (LCDU) data of the group of features as the measurement data associated with the group of features, (c) obtaining, based on the LCDU data, (i) a probability density function of CD of the group of features defined as a function of the mean CD, a dose value and a variance of the dose value of the patterning process, and (ii) a CD limit of the patterning process based on failure rate measurements of features in the group of features, (d) determining an estimated failure rate of the group of features based on the CD limit and the probability density function of the CD, and (e) generating the base failure rate model, which identifies the process window related to the dose value such that the estimated failure rate of the group of features is less than a predetermined threshold.

In some embodiments, determining the LCDU data of the group of features includes determining the LCDU data of the group by: (a) obtaining the LCDU data of each feature in the group across the plurality of images, (b) obtaining CD mean of each feature for each image of the plurality of images, and (c) removing the CD mean from the LCDU data.

In some embodiments, obtaining the probability density function of the CD of the group of features includes determining the probability density function of a dose for the dose value based on a variance of the dose value, and converting the probability density function of the dose to the probability density function of the CD based on a conversion function, wherein the conversion function is determined based on the function of the dose.

In some embodiments, the failure rate is related to one or more failures of a feature, the one or more failure including a physical failure, a transfer failure, and/or postponed failure of the feature.

In some embodiments, the method further includes storing the base failure rate model in a database, wherein the database includes a plurality of base failure rate models in which each base failure rate model corresponds to a group of features with a specified metric value.

In some embodiments, the method further includes generating, using the base failure rate model, a feature-specific failure rate model for a specific feature, wherein the feature-specific failure rate model identifies a feature-specific process window such that an estimated failure rate of the specific feature is below a specified threshold.

In some embodiments, the method further includes generating, using the base failure rate model, a feature group-specific failure rate model for a specified group of features, wherein the feature group-specific failure rate model identifies a feature group-specific process window such that an estimated failure rate of the specified group of features is below a specified threshold.

In some embodiments, generating the feature specific failure rate model includes: (a) receiving measurement data associated with the specified feature, wherein the measurement data includes CD value of the specified feature for a plurality of dose and focus values, (b) determining a specified metric value from the measurement data, wherein the specified metric value is determined as a function of a specified mean CD value and a plurality of dose values and focus values associated with the specified mean CD value at an edge of a process window associated with the specified feature, and (c) selecting, from the database, a specified base failure rate model whose metric value matches the specified metric value.

In some embodiments, generating the feature specific failure model further includes: obtaining a base probability density function of CD from the specified base failure rate model, and adjusting a mean CD of the base probability density function based on the specified mean CD value to generate an adjusted probability density function.

In some embodiments, the method further includes determining at least one of a first CD limit or a second CD limit of the patterning process using the adjusted probability density function, wherein the estimated failure rate of the specified feature is within the specified threshold if a CD of the specified feature is above the first CD limit or below the second CD limit.

In some embodiments, the method further includes obtaining at least one of an interfield CD variation, intrafield CD variation, a probability density function of CD of the specified feature as CD profile data, and convoluting the adjusted probability density function with the CD profile data to generate a convoluted probability density function.

In some embodiments, the method further includes determining the estimated failure rate of the specific feature based on the first CD limit, the second CD limit and the convoluted probability density function, and generating the feature-specific failure rate model, which identifies the feature-specific process window such that the estimated failure rate of the specified feature is less than the specified threshold.

In some embodiments, the method further includes adjusting of one or more apparatuses of the patterning process based on the process window related to the specified feature to minimize a failure rate associated with the specified feature.

Further, in some embodiments, there is provided a non-transitory computer readable medium having instructions that, when executed by a computer, cause the computer to execute a method for determining a process window of a patterning process based on a failure rate. The method includes (a) selecting a plurality of features printed on a substrate; (b) grouping, based on a metric, the features into a plurality of groups, wherein each group of the plurality of groups includes a subset of the features; (c) generating a base failure rate model for a group of the plurality of groups based on measurement data associated with features in the group, wherein the base failure rate model identifies a process window related to an estimated failure rate of the group of features; and (d) generating, using the base failure rate model and measurement data associated with a specified feature, a feature-specific failure rate model for the specified feature, wherein the feature-specific failure rate model identifies a feature-specific process window such that an estimated failure rate of the specified feature is below a specified threshold.

In some embodiments, grouping the features includes: (a) for each feature of the features, obtaining a mean CD value of the corresponding feature and a plurality of dose values associated with the mean CD at an edge of a process window of the corresponding feature, and (b) clustering the features into the groups based on metric values for the features, wherein the features within a specific group have metric values that vary within a first threshold.

In some embodiments, the method further includes: storing the base failure rate model in a database, wherein the database includes a plurality of base failure rate models, wherein each base failure rate model corresponds to a group of features with a specified metric value.

In some embodiments, generating the feature-specific failure rate model includes: (a) receiving measurement data associated with the specified feature, wherein the measurement data includes mean CD value of the specified feature for a plurality of dose and focus values, (b) determining a specified metric value from the measurement data associated with the specified feature, wherein the specified metric value is determined as a function of a specified mean CD value and a dose value associated with the specified mean CD value at an edge of a process window associated with the specified feature for a specified focus value, and (c) selecting, from the database, a specified base failure rate model whose metric value matches the specified metric value.

In some embodiments, the method further includes obtaining a base probability density function of CD from the specified base failure rate model, and adjusting a mean CD of the base probability density function based on the specified mean CD value to generate an adjusted probability density function.

In some embodiments, the method further includes: determining a first CD limit or a second CD limit of the patterning process using the adjusted probability density function, wherein, when a CD of the specified feature is above the first CD limit or below the second CD limit, the estimated failure rate of the specified feature is within the specified threshold.

In some embodiments, the method further includes obtaining at least one of an interfield CD variation, intrafield CD variation, a probability density function of CD of the specified feature as CD profile data, and convoluting the adjusted probability density function with the CD profile data to generate a convoluted probability density function.

In some embodiments, the method further includes: determining the estimated failure rate of the specific feature based on the first CD limit, the second CD limit and the convoluted probability density function, and generating the feature-specific failure rate model, which identifies the feature-specific process window such that the estimated failure rate of the specified feature is less than the specified threshold.

In some embodiments, the method further includes: adjusting of one or more apparatuses of the patterning process based on the process window related to the specified feature to minimize a failure rate associated with the specified feature.

In some embodiments, the one or more apparatuses includes a lithographic apparatus configured to perform patterning on the substrate based on the feature-specific process window.

Further, in some embodiments, there is provided a method for determining a process window of a patterning process based on a failure rate. The method includes obtaining a plurality of features printed on a substrate; grouping, based on a metric, the features into a plurality of groups; and generating, based on measurement data associated with a group of features, a base failure rate model for the group of features, wherein the base failure rate model identifies the process window related to the failure rate of the group of features.

Further, in some embodiments, there is provided a method for determining a process window of a patterning process based on a failure rate. The method includes obtaining a plurality of features printed on a substrate; grouping, based on a metric, the set of features into a plurality of groups, wherein each group of the plurality of groups includes a subset of the features; generating a base failure rate model for a group of the plurality of groups based on measurement data associated with features in the group, wherein the base failure rate model identifies a process window related to an estimated failure rate of the group of features; and generating, using the base failure rate model and measurement data associated with a specified feature, a feature-specific failure rate model for the specified feature, wherein the feature-specific failure rate model identifies a feature-specific process window such that an estimated failure rate of the specified feature is below a specified threshold.

Further, in some embodiments, there is provided a non-transitory computer-readable media comprising instructions that, when executed by a computer, cause the computer to execute a method for determining process windows of a patterning process. The method includes obtaining measurement data of a plurality of features printed on a substrate;

deriving a characteristic parameter of the plurality of features from the measurement data, wherein the measurement data comprise data indicative of placement errors of the plurality of features; and generating, based on the characteristic parameter associated with the features, a failure rate model for the features, wherein the failure rate model is configured to determine a process window corresponding to a failure rate of the features.

Further, in some embodiments, there is provided a non-transitory computer-readable media comprising instructions that, when executed by a computer, cause the computer to execute a method for determining process windows of a patterning process. The method includes obtaining measurement data of a plurality of features printed on a substrate, wherein the measurement data includes one or more of a CD value, an edge placement error (EPE) value, or a placement error (PE) value associated with a feature of the features; deriving a characteristic parameter of the plurality of features, wherein the characteristic parameter includes a CDe parameter derived from the CD value and the PE value; and generating, based on the characteristic parameter associated with the features, a failure rate model for the features, wherein the failure rate model is configured to identify a process window related to a failure rate of the features.

Further, in some embodiments, there is provided a non-transitory computer-readable media comprising instructions that, when executed by a computer, cause the computer to execute a method for determining process windows of a patterning process. The method includes obtaining measurement data of a plurality of features printed on a substrate, wherein the measurement data includes one or more of a CD value, an edge placement error (EPE) value, or a placement error (PE) value associated with a feature of the features; deriving a characteristic parameter of the features, wherein the characteristic parameter includes a PEe parameter derived from a target CD value and the PE value; and generating, based on the characteristic parameter associated with the features, a failure rate model for the features, wherein the failure rate model is configured to identify a process window related to a failure rate of the features.

Further, in some embodiments, there is provided a non-transitory computer readable medium having instructions that, when executed by a computer, cause the computer to execute a method for determining critical features printed on a substrate. The method includes: obtaining measurement data of a plurality of features printed on a substrate; obtaining, based on the measurement data, a first set of process windows of the features, wherein the first set of process windows is representative of a first characteristic parameter of the features for a first set of dose and focus values, wherein the first set of process windows includes a first process window of a first feature of the features; obtaining multiple process window metrics for each of the features based on the first set of process windows; and determining those of the features with the one or more of the process window metrics satisfying a specified threshold as critical features.

Further, in some embodiments, there is provided a non-transitory computer readable medium having instructions that, when executed by a computer, cause the computer to execute a method for determining critical features printed on a substrate. The method includes: obtaining measurement data of a plurality of features printed on a substrate; obtaining, based on the measurement data, a first set of process windows of the features, wherein the first set of process windows is representative of a first characteristic parameter of the features for a first set of dose and focus values, wherein the first set of process windows includes a first process window of a first feature of the features; obtaining, based on the measurement data, a second set of process windows of the features, wherein the second set of process windows is representative of a second characteristic parameter of the features for a second set of dose and focus values, wherein the second characteristic parameter is different from the first characteristic parameter, wherein the second set of process windows includes a second process window of the first feature; performing an overlapping operation with the first process window and the second process window to generate a first overlapped processed window, wherein the first overlapped processed window is an intersection of shapes of the first process window and the second process window on a graph; obtaining multiple process window metrics for each of the features based on an overlapped process window of the corresponding feature; and determining those of the features with the one or more of the process window metrics satisfying a specified threshold as critical features.

Furthermore, there is provided a non-transitory computer-readable medium having instructions recorded thereon, the instructions when executed by a computer implementing the method of any of the above methods.

BRIEF DESCRIPTION OF THE DRAWINGS

FIG. 11D illustrates an example failure mode, according to an embodiment.

FIG. 11E illustrates another example failure mode, according to an embodiment.

FIG. 11F illustrates an example parameter limit at a dose setting, according to an embodiment.

DETAILED DESCRIPTION

Figures 1, 2:
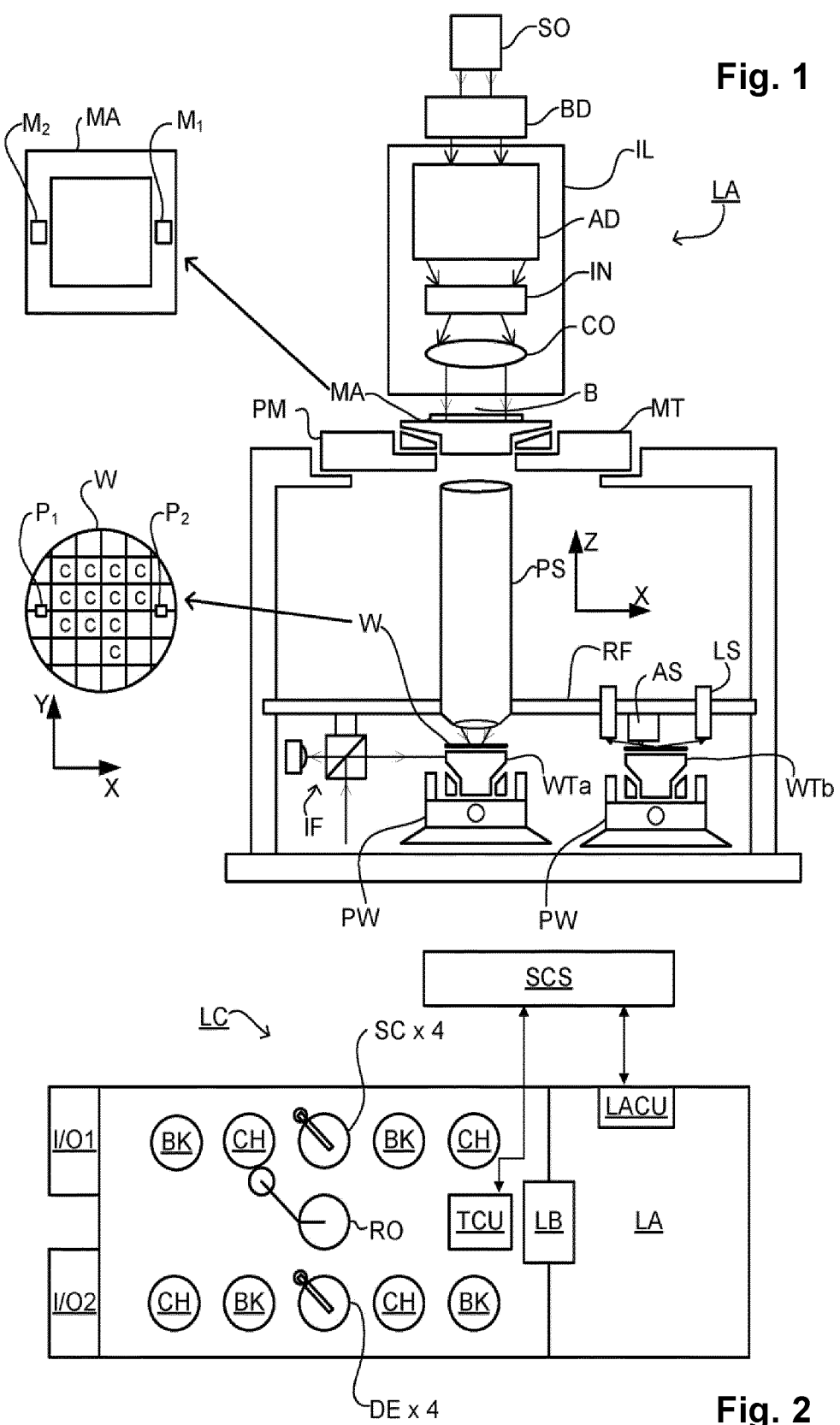
FIG. 1 schematically depicts a lithography apparatus according to an embodiment.
FIG. 2 schematically depicts an embodiment of a lithographic cell or cluster.

A lithographic apparatus is a machine that applies a desired pattern onto a target portion of a substrate. This process of transferring the desired pattern to the substrate is called a patterning process. In a device fabrication process (e.g., a patterning process or a lithography process), the substrate may be subjected to various types of measurement during or after the process. The measurement may determine whether the substrate is defective, and may establish adjustments to the process and apparatuses used in the process.

Failure rate modelling determines a process window based on defect criteria ("defect-based process window") for one or more features. For example, the defect-based process window can be a set of dose and/or focus values for which a defect/failure rate of a feature (e.g., critical dimension (CD) of a feature varying beyond a desired range) is within a desired threshold. The failure rate modelling may require a large amount of measurement data of features (e.g., CD data) in order for the estimated/predicted failure rate to be accurate. Such amount of sampling may be achievable for dense features (e.g., features that are repetitive or whose number of occurrences on the substrate exceed a threshold, such as features on static random access memory (SRAM) and dynamic RAM (DRAM)), by taking advantage of metrology with high throughput inspection tools (e.g., scanning electron microscope (SEM)). However, such sampling may be a challenge for features in random logic structures due to the fact that (a) there may not be enough occurrences of the features per pattern or per portion of the substrate, (b) they may be less repetitive from one portion of the substrate to another, (c) too many different features (e.g., millions or more) appearing on the substrate, or (d) their appearances on the substrate are too sparse, which can result in the inspection tool taking significant amount of time and other resources. With a very small number of instances of the features appearing within a SEM image, it may be difficult to have accurate local CD uniformity, capture a full CD variation per focus/dose value. Therefore, a new method may be needed to determine a defect-based process window for developed for features in the random logic structures.

The present disclosure describes a method to obtain a defect-based process window for features in random logic structures. For example, the process groups the features (e.g., features that are less repetitive, occurs randomly on the substrate) into feature groups based on a metric (e.g., process window and CD mean associated with the features), determines a base failure rate (FR) model for each feature group as a function of measurement data associated with the features in that feature group. The base FR model is indicative of a defect-based process window for the features in a specific feature group, which is determined based on the local CD uniformity of features within the specific feature group. The base FR model can then be used to generate a feature-specific FR model, which is specific to a given feature, by convoluting the base model with measurement data associated with the given feature. The base FR model can also be used to generate a feature group-specific FR model, which is specific to a given group of features.

In the patterning process, some features may be more critical than other features. For example, features with smaller process windows are more critical than others. Identifying these critical features and ensuring that the base FR models are generated for these critical features may help in minimizing the defects in the patterning process and therefore, in improving the yield of the patterning process. In some embodiments, the random logic structures may have a significant number of features (e.g., millions) and identifying the critical features in such logic structures may have a significant bearing on improving the yield.

The present disclosure describes a method for ranking the features based on one or more metrics (e.g., process window metrics). After the features are ranked, features having metrics satisfying a threshold (e.g., below a threshold) may be identified as critical features. The feature groups (e.g., which are generated as described above) may be analyzed to identify those of the feature groups having a critical feature, and a base FR model may be generated for the identified feature groups.

Before describing embodiments in detail, it is instructive to present an example environment in which embodiments may be implemented.

FIG. 1 schematically depicts an embodiment of a lithographic apparatus LA. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1$^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
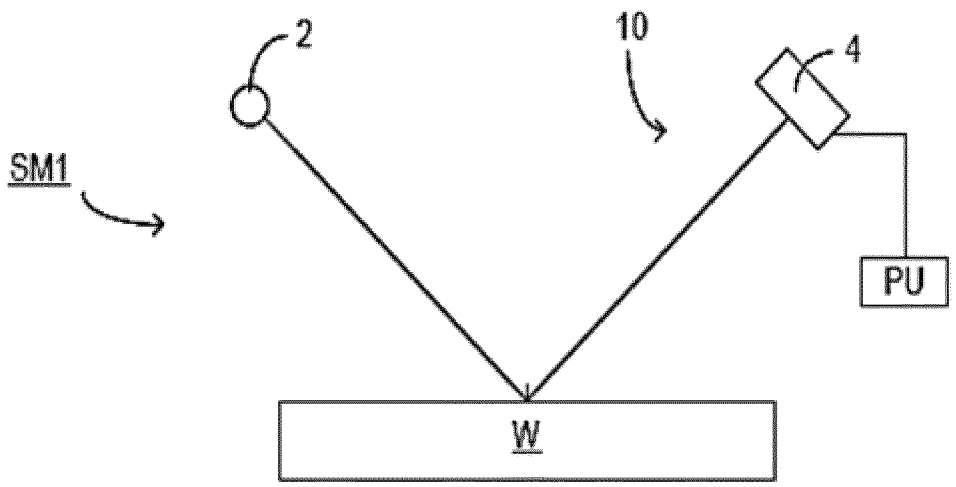
FIG. 3 schematically depicts an example inspection apparatus and metrology technique.
Figure 3:
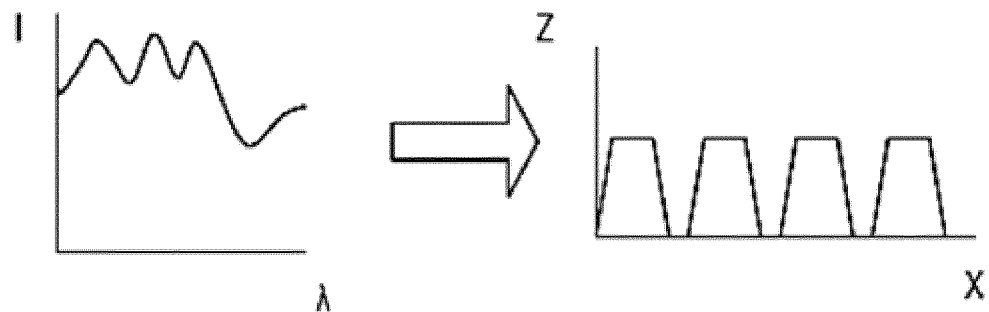

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figures 4, 5:
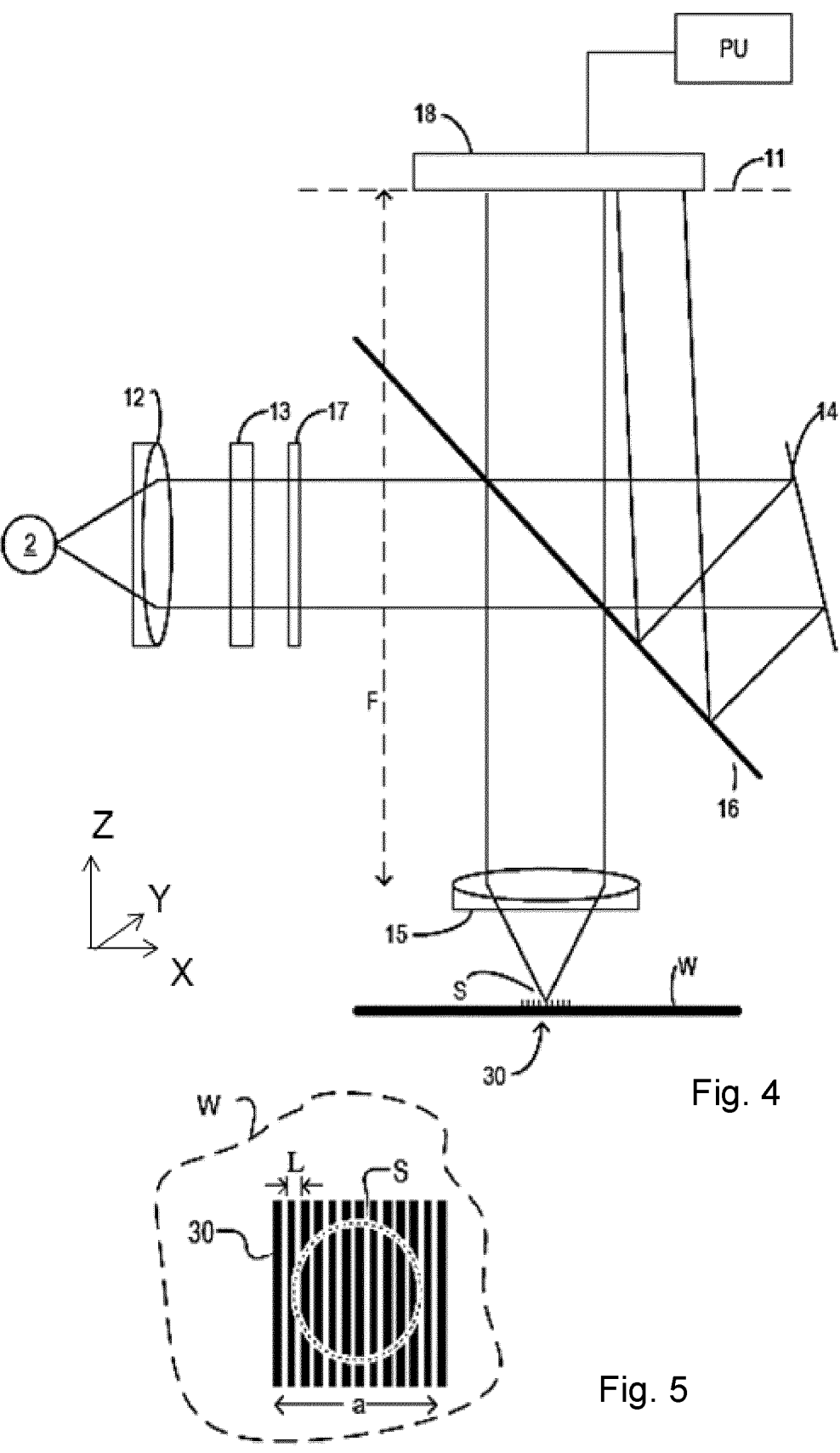
FIG. 4 schematically depicts an example inspection apparatus.
FIG. 5 illustrates the relationship between an illumination spot of an inspection apparatus and a metrology target.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 6:
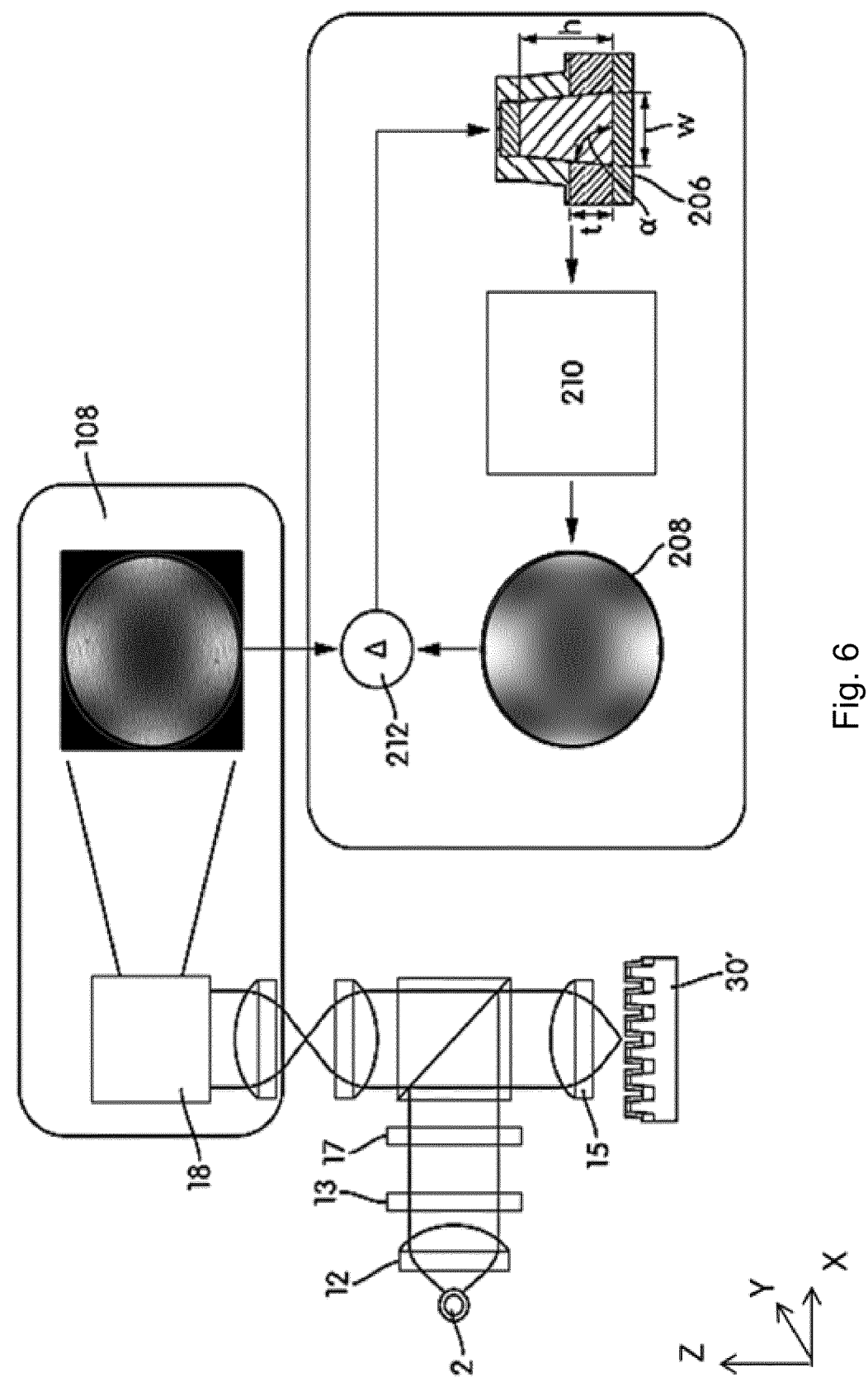
FIG. 6 schematically depicts a process of deriving a plurality of variables of interest based on measurement data.

FIG. 6 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

Figure 7:
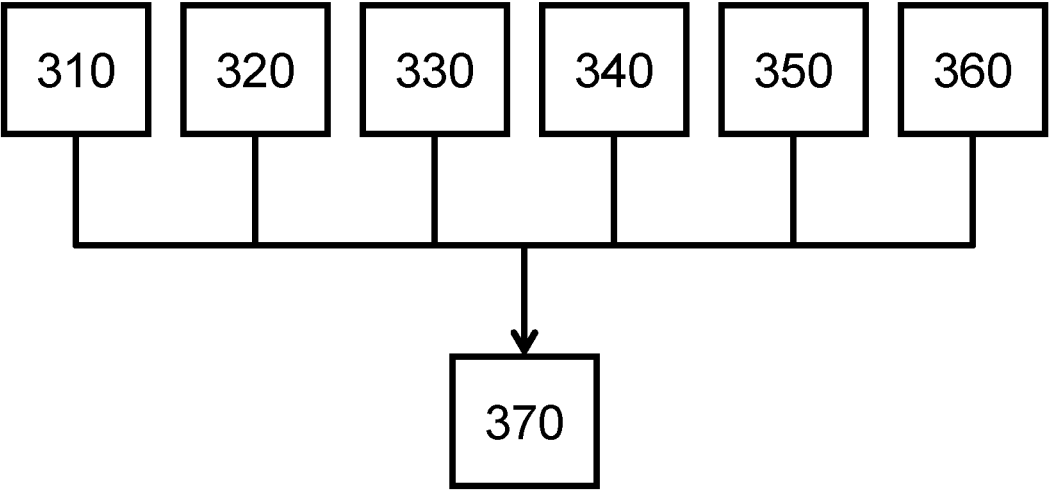
FIG. 7 shows example categories of processing variables.

Variables of a patterning process are called "processing variables." The patterning process may include processes upstream and downstream to the actual transfer of the pattern in a lithography apparatus. FIG. 7 shows example categories of the processing variables 370. The first category may be variables 310 of the lithography apparatus or any other apparatuses used in the lithography process. Examples of this category include variables of the illumination, projection system, substrate stage, etc. of a lithography apparatus. The second category may be variables 320 of one or more procedures performed in the patterning process. Examples of this category include focus control or focus measurement, dose control or dose measurement, bandwidth, exposure duration, development temperature, chemical composition used in development, etc. The third category may be variables 330 of the design layout and its implementation in, or using, a patterning device. Examples of this category may include shapes and/or locations of assist features, adjustments applied by a resolution enhancement technique (RET), CD of mask features, etc. The fourth category may be variables 340 of the substrate. Examples include characteristics of structures under a resist layer, chemical composition and/or physical dimension of the resist layer, etc. The fifth category may be characteristics 350 of temporal variation of one or more variables of the patterning process. Examples of this category include a characteristic of high frequency stage movement (e.g., frequency, amplitude, etc.), high frequency laser bandwidth change (e.g., frequency, amplitude, etc.) and/or high frequency laser wavelength change. These high frequency changes or movements are those above the response time of mechanisms to adjust the underlying variables (e.g., stage position, laser intensity). The sixth category may be characteristics 360 of processes upstream of, or downstream to, pattern transfer in a lithographic apparatus, such as spin coating, post-exposure bake (PEB), development, etching, deposition, doping and/or packaging.

As will be appreciated, many, if not all of these variables, will have an effect on a parameter of the patterning process and often a parameter of interest. Non-limiting examples of parameters of the patterning process may include critical dimension (CD), critical dimension uniformity (CDU), focus, overlay, edge position or placement, sidewall angle, pattern shift, etc. Often, these parameters express an error from a nominal value (e.g., a design value, an average value, etc.). The parameter values may be the values of a characteristic of individual patterns or a statistic (e.g., average, variance, etc.) of the characteristic of a group of patterns.

The values of some or all of the processing variables, or a parameter related thereto, may be determined by a suitable method. For example, the values may be determined from data obtained with various metrology tools (e.g., a substrate metrology tool). The values may be obtained from various sensors or systems of an apparatus in the patterning process (e.g., a sensor, such as a leveling sensor or alignment sensor, of a lithography apparatus, a control system (e.g., a substrate or patterning device table control system) of a lithography apparatus, a sensor in a track tool, etc.). The values may be from an operator of the patterning process.

Figure 8:
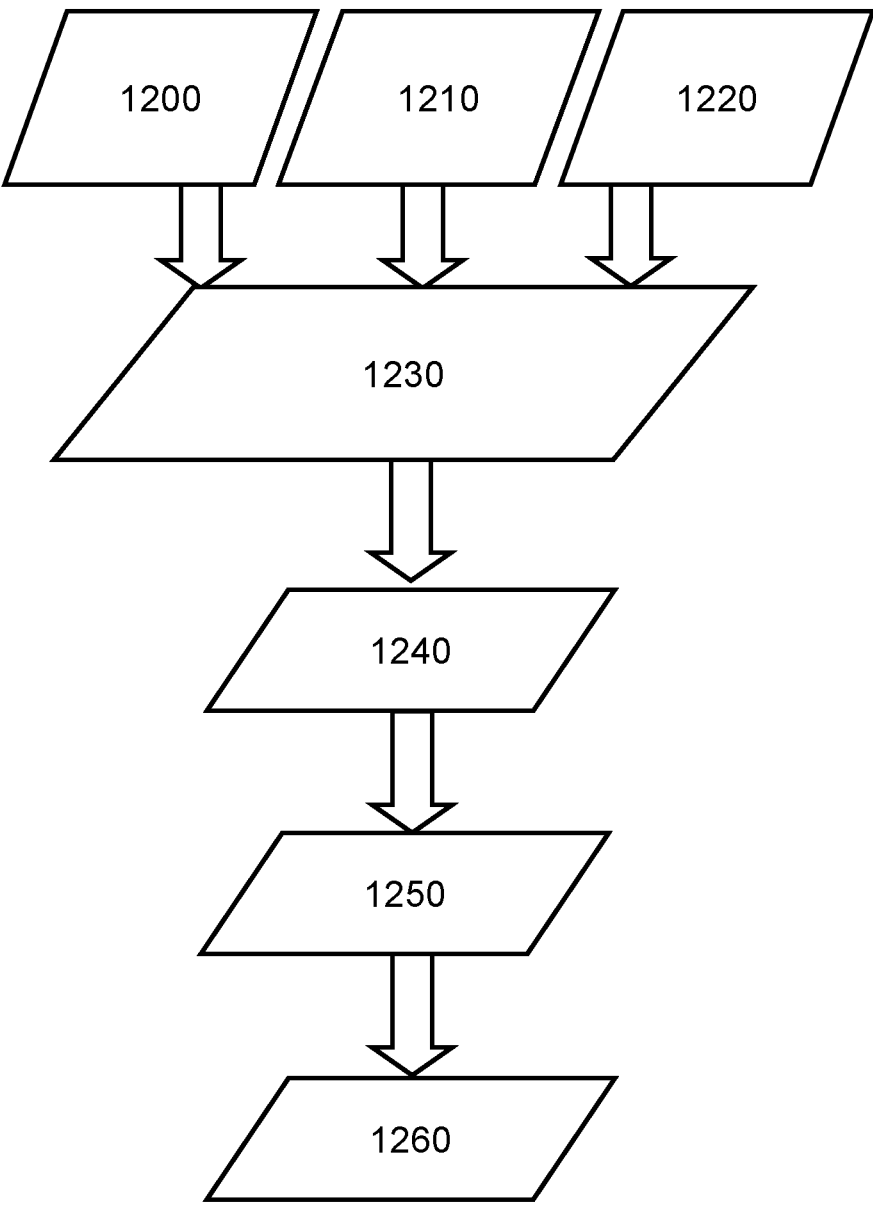
FIG. 8 schematically shows a flow for a patterning simulation method, according to an embodiment.

An exemplary flow chart for modelling and/or simulating parts of a patterning process is illustrated in FIG. 8. As will be appreciated, the models may represent a different patterning process and need not comprise all the models described below. A source model 1200 represents optical characteristics (including radiation intensity distribution, bandwidth and/or phase distribution) of the illumination of a patterning device. The source model 1200 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where σ (or sigma) is outer radial extent of the illuminator.

A projection optics model 1210 represents optical characteristics (including changes to the radiation intensity distribution and/or the phase distribution caused by the projection optics) of the projection optics. The projection optics model 1210 can represent the optical characteristics of the projection optics, including aberration, distortion, one or more refractive indexes, one or more physical sizes, one or more physical dimensions, etc.

The patterning device/design layout model module 1220 captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module 1220 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image 1230 can be simulated from the source model 1200, the projection optics model 1210 and the patterning device/design layout model 1220. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1250 can be simulated from the aerial image 1230 using a resist model 1240. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1210.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 1260. The post-pattern transfer process model 1260 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Figure 9:
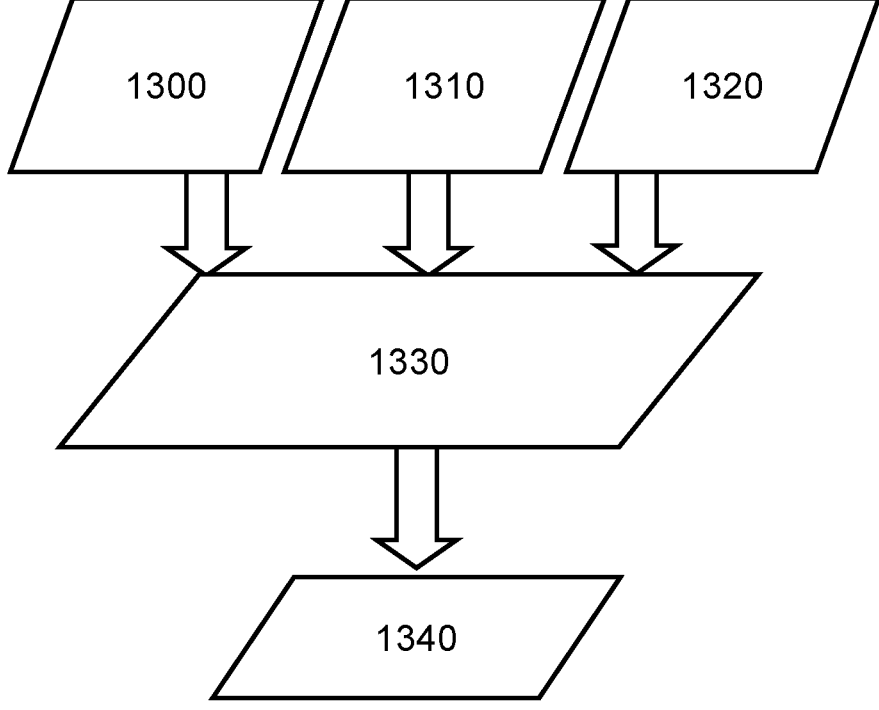
FIG. 9 schematically shows a flow for a measurement simulation method, according to an embodiment.

An exemplary flow chart for modelling and/or simulating a metrology process is illustrated in FIG. 9. As will be appreciated, the following models may represent a different metrology process and need not comprise all the models described below (e.g., some may be combined). A source model 1300 represents optical characteristics (including radiation intensity distribution, radiation wavelength, polarization, etc.) of the illumination of a metrology target. The source model 1300 can represent the optical characteristics of the illumination that include, but not limited to, wavelength, polarization, illumination sigma (a) settings (where 6 (or sigma) is a radial extent of illumination in the illuminator), any particular illumination shape (e.g. off-axis radiation shape such as annular, quadrupole, dipole, etc.), etc.

A metrology optics model 1310 represents optical characteristics (including changes to the radiation intensity distribution and/or the phase distribution caused by the metrology optics) of the metrology optics. The metrology optics model 1310 can represent the optical characteristics of the illumination of the metrology target by metrology optics and the optical characteristics of the transfer of the redirected radiation from the metrology target toward the metrology apparatus detector. The metrology optics model can represent various characteristics involving the illumination of the target and the transfer of the redirected radiation from the metrology target toward the detector, including aberration, distortion, one or more refractive indexes, one or more physical sizes, one or more physical dimensions, etc.

A metrology target model 1320 can represent the optical characteristics of the illumination being redirected by the metrology target (including changes to the illumination radiation intensity distribution and/or phase distribution caused by the metrology target). Thus, the metrology target model 1320 can model the conversion of illumination radiation into redirected radiation by the metrology target. Thus, the metrology target model can simulate the resulting illumination distribution of redirected radiation from the metrology target. The metrology target model can represent various characteristics involving the illumination of the target and the creation of the redirected radiation from the metrology, including one or more refractive indexes, one or more physical sizes of the metrology, the physical layout of the metrology target, etc. Since the metrology target used can be changed, it is desirable to separate the optical properties of the metrology target from the optical properties of the rest of the metrology apparatus including at least the illumination and projection optics and the detector. The objective of the simulation is often to accurately predict, for example, intensity, phase, etc., which can then be used to derive a parameter of interest of the patterning process, such overlay, CD, focus, etc.

A pupil or aerial image 1330 can be simulated from the source model 1300, the metrology optics model 1310 and the metrology target model 1320. A pupil or aerial image is the radiation intensity distribution at the detector level. Optical properties of the metrology optics and metrology target (e.g., properties of the illumination, the metrology target and the metrology optics) dictate the pupil or aerial image.

A detector of the metrology apparatus is exposed to the pupil or aerial image and detects one or more optical properties (e.g., intensity, phase, etc.) of the pupil or aerial image. A detection model module 1340 represents how the radiation from the metrology optics is detected by the detector of the metrology apparatus. The detection model can describe how the detector detects the pupil or aerial image and can include signal to noise, sensitivity to incident radiation on the detector, etc. So, in general, the connection between the metrology optics model and the detector model is a simulated pupil or aerial image, which arises from the illumination of the metrology target by the optics, redirection of the radiation by the target and transfer of the redirected radiation to the detectors. The radiation distribution (pupil or aerial image) is turned into detection signal by absorption of incident energy on the detector.

Simulation of the metrology process can, for example, predict spatial intensity signals, spatial phase signals, etc. at the detector or other calculated values from the detection system, such as an overlay, CD, etc. value based on the detection by the detector of the pupil or aerial image. Thus, the objective of the simulation is to accurately predict, for example, detector signals or derived values such overlay, CD, corresponding to the metrology target. These values can be compared against an intended design value to, e.g., correct the patterning process, identify where a defect is predicted to occur, etc.

Thus, the model formulation describes most, if not all, of the known physics and chemistry of the overall metrology process, and each of the model parameters desirably corresponds to a distinct physical and/or chemical effect in the metrology process.

Various patterns on or provided by a patterning device may have different process windows. i.e., a space of processing variables under which a pattern will be produced within a specification. Examples of pattern specifications that relate to potential systematic defects include checks for necking, line pull back, line thinning, CD, edge placement, overlapping, resist top loss, resist undercut and/or bridging. Typically, a process window is defined over two processing variables i.e., dose and focus such that the CD obtained after patterning may be within ±10% of the desired CD of a feature of the pattern. The process window of all the patterns on a patterning device or an area thereof may be obtained by merging (e.g., overlapping) process windows of each individual pattern.

Typically, a pattern can include several instances of one or more features (e.g., $10^6$ instances of feature A, $10^4$ instances of feature B, etc.) arranged in a certain manner to form the pattern. During the patterning process, one or more features may fail at certain, for example, dose/focus settings, leading to a defect in the substrate thereby affecting the yield of the patterning process. Hence, selection of an appropriate range of dose/focus values or processing window is desired (or selected) to achieve a desired yield or a selected yield. For example, a high yield (e.g., 99.9%) may be selected or a range of yield (e.g., 98%-99.99%) may be selected by, for example, a designer or a manufacturer.

The following describes a method to obtain a process window based on a desired yield and/or defect criteria for one or more features. For example, the process window can be a set of dose and/or focus values (also referred as dose/focus settings) that are sensitive to failures of individual features and/or a desired yield of the patterning process.

Figure 10:
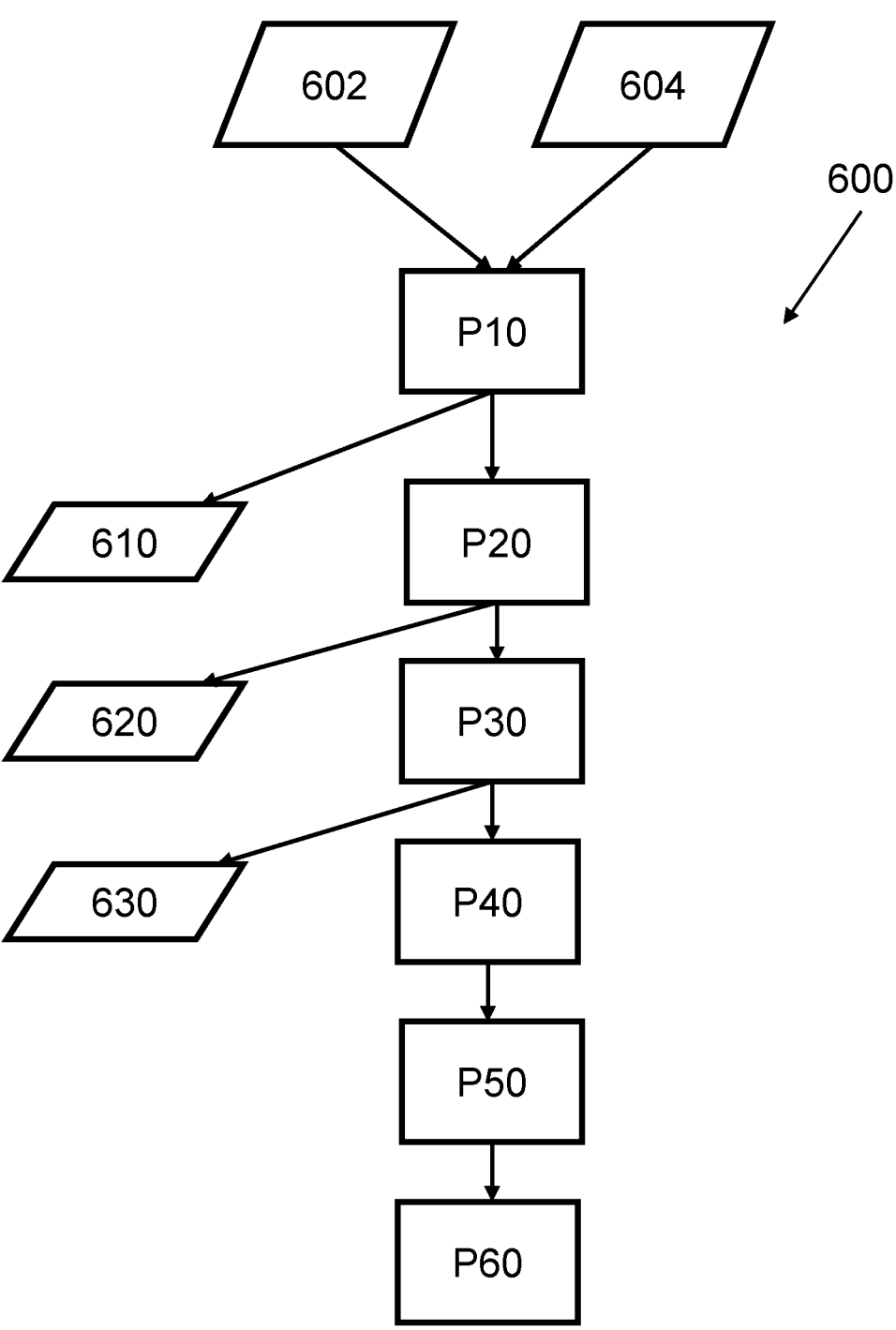
FIG. 10 schematically shows a flow for a method to determine a defect based process window, according to an embodiment.

FIG. 10 is a flow chart of a process 600 to determine a process window based on a desired die yield and/or a failure rate of a patterning process. The process 600 starts when measurements of a parameter 602 (e.g., a CD, overlay, etc.) and a process variable 604 (e.g., dose, focus, etc.) of the patterning process are obtained. For example, the measurements of the process variable may include approximately 20 dose settings (i.e., a range of dose values) and measurements of the parameter of a feature (which appears, for example, $10^6$ times in a pattern) may include CD values for approximately 1000 instance of the feature per setting of the dose. Hence, approximately 1000×20 CD values may be measured. The present disclosure is not limited to total number of measurements. The number of instances may be selected to reach a desired accuracy of the variance. For example, for large number of instances and normal distributions, the standard deviation of the standard deviation is approximately $1/\sqrt(2*\text{number of instances})$, such that the standard deviation of 1000 instances lead to an error in the estimated standard deviation of approximately 2% with a 99.7% confidence interval (i.e. $3\sigma$).

Based on the measurements of the parameter (e.g., CD) and the process variable (dose), in process P10, a functional relationship 610 between the parameter (e.g., CD) and the process variable (e.g., dose) may be determined and/or obtained. For example, the functional relationship 610 may be a mathematical model based on statistical analysis such as linear regression analysis. In an embodiment, the function relationship may be linear, or non-linear such as polynomial, trigonometric, etc. Following is an example functional relationship between CD and dose.

$$f_{CD}(d) = \sum_{n=0} a_n d^n \tag{1}$$

In the example functional relationship (1), (i) $f_{CD}$ (d) refers to the parameter CD defined as a function of dose(d), (ii) n refers to the dose polynomial (d), and (iii) an refers to sensitivity of the CD to the $n^{th}$ dose polynomial dn. In an embodiment, the function relationship (1) can be based on a curve fitting algorithm, for example, that minimizes a mean squared error between the measured values and the fitted values. In an embodiment, the functional relationship may be a linear, a polynomial, or other non-linear function of the process variable. In an embodiment, the measurements 602 can also be used to determine a variance in the parameter values with e.g. a different functional relationship with the intent to suppress noise in the variance in the parameter values.

Figure 11A:
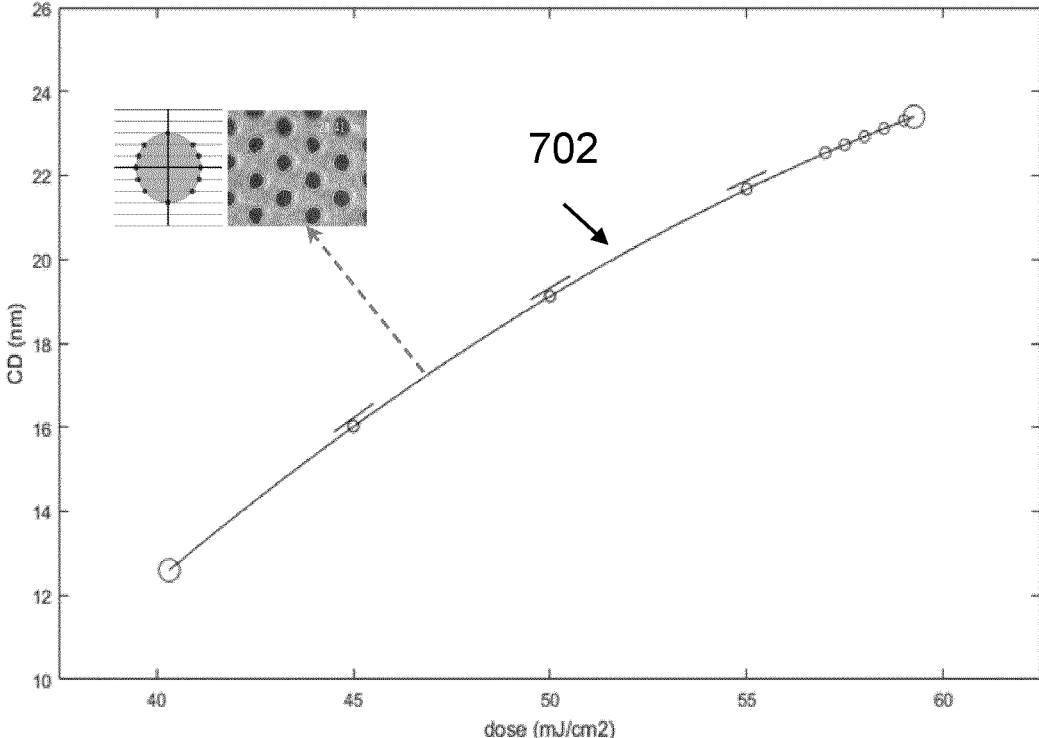
FIG. 11A illustrates an example relationship between measured CD and dose, according to an embodiment.

In another example, FIG. 11A illustrates Bossung curve 702 (which is an example of the functional relationship 610) that defines a relationship between the measured CD and dose values. The Bossung curve 702 may be obtained for various dose settings, for example, 20 dose settings between 40 mJ/cm² to 60 mJ/cm². For each dose setting, 1000 CD values may be obtained, which may be approximately between 12 nm to 24 nm. In an embodiment, Bossung curve may be obtained using modelling and/or simulation of the patterning process.

Referring back to FIG. 10, in process P20, a probability density function (PDF) 620 per setting of the process variable may be computed. Hereinafter, the probability density function (PDF) 620 per setting of the process variable is referred as the process variable PDF 620 for purposes of understanding of the concepts and simplicity of discussion. The process variable PDF 620 is defined a function of the process variable and a variation of the process variable. The process variable PDF 620 enables to capture an impact of any variations in a setting of dose that may eventually affect the parameter. Variations in the process variable per setting may occur, for example, at a particular instant of time during the patterning process or may be inherent to a process variable (e.g., dose). Such variations may affect the parameter of the patterning process leading to, for example, failure of a feature in some cases. In an embodiment, the process variable PDF 620 can be a normal distribution, Poisson distribution, or other standard distributions.

In an embodiment, the process variable PDF 620 can be a distribution computed based on the functional relationship (e.g., $f_{CD}(d)$) between the parameter and the process variable. The computation can be performed by modifying/substituting a variance of, for example, the standard distribution (e.g., normal distribution) with a computed variance. The computed variance may be computed from the variance (e.g., $\sigma_{CD}^2(d)$) of the parameter and the functional relationship (e.g., $f_{CD}(d)$). For example, in case of the parameter CD and dose d, the variance of dose can be defined using the following variance equation (2):

$$\sigma_d = \sigma_{CD} * 1 \Big/ \left( \frac{\partial f_{CD}(d)}{\partial d} \right) \tag{2}$$

In variance equation (2) above, (i) $\sigma_d$ is the standard deviation (also interchangeably used to refer to variance) of the dose; (ii) $\sigma_{CD}$ is the standard deviation (also interchangeably used to refer to variance) of the CD; and (iii) the partial derivative term $$\frac{\partial f_{CD}(d)}{\partial d}$$

provides for a conversion of the variance in CD at a particular dose setting to the variance of the dose at such dose setting.

Figure 11B:
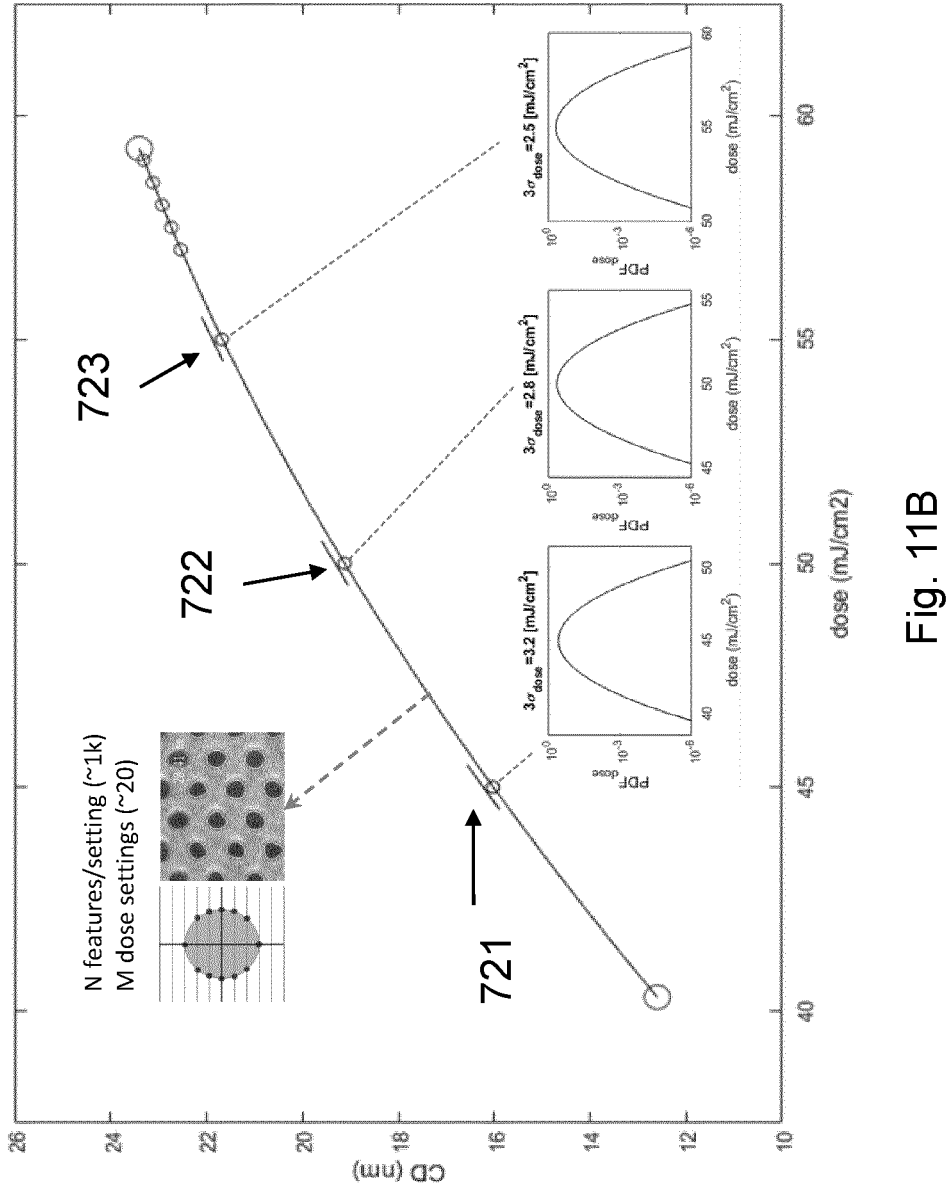
FIG. 11B illustrates example dose PDFs at different dose settings, according to an embodiment.

For example, referring to FIG. 11B, a first dose PDF 721 at a first dose setting 45 mJ/cm², a second dose PDF 722 at a second dose setting 50 mJ/cm², and a third dose PDF 723 at dose setting 55 mJ/cm², etc. may be obtained. Based on the variations in the CD per dose setting, a dose variation may be observed. For example, at a lower dose (e.g., at 45 mJ/cm²), the variation (e.g., $3\sigma_d$) is approximately 3.2 mJ/cm², while at a higher dose (e.g., 55), the variation (e.g., $3\sigma_d$) is approximately 2.5 mJ/cm². Thus, a backward determination of the variation in dose may be obtained based on the CD values at a particular dose setting.

Such computed variance (e.g., in eq. (2)) used to compute the PDF of the process variable (e.g., dose) may enable accounting for stochastic variations (i.e., variations that cannot be explained by, for example, physics of the apparatus) in the patterning process that cause deviations in the parameter. The process variable PDF may enable determination of an improved dose setting of the patterning process and may eventually reduce defects and improve yield of the patterning process.

Referring back to FIG. 10, in process P30, a probability density function (PDF) 630 of the parameter of the patterning process per setting of the process variable may be determined and/or obtained based on the process variable PDF 620 per setting of the process variable (e.g., from process P20), and the functional relationship (e.g., from process P10). Hereinafter, the probability density function (PDF) 630 of the parameter per setting of the process variable is referred as the parameter PDF 630 for purposes of understanding of the concepts and simplicity of discussion.

According to an embodiment, the parameter PDF 630 may be a non-standard distribution when calculated from the process variable PDF 620. Using such non-standard distribution may also account for the any stochastic variations in the patterning process that cause deviations in the parameter, thus providing an improved estimate of probability that a parameter (e.g., CD) value will be within a desired range per process variable setting (e.g., dose) of the patterning process which may be further used to identify probability of defects and a processing window to reduce defects and effectively improve yield.

In an embodiment, the parameter PDF 630, for example, a CD PDF may be computed using dose PDF and a conversion function (or a conversion factor) that converts the dose PDF to a CD PDF based on the following equation (3):

$$PDF_{CD}(CD,\ d) = PDF_d(g_d(CD),\ \sigma_d(g_a(CD))) * \left| \frac{\partial}{\partial d} g_d(CD) \right| \tag{3}$$

In the equation (3) above, (i) $PDF_{CD}(CD,d)$ refers to the CD PDF (which is an example of the parameter PDF 630) and is a function of dose (d), (ii) $g_d(CD)$ is an inverse function of the functional relationship 610 (e.g., in eq. (1)) between the dose and CD, (iii) $PDF_d(g_d(CD), \sigma_d(g_d(CD)))$ is the process variable PDF 620, where $\sigma_d(g_d(CD))$ is a computed variance based on $g_d(CD)$, for example, computed using an equation similar to eq. (2), where the conversion function (or conversion factor) can be a partial derivative of $g_d(CD)$, and (iv) the absolute value of partial derivative term $$\left( \text{i.e.,}\ \left| \frac{\partial}{\partial_d} g_d(CD) \right| \right)$$

is the conversion function (or conversion factor) that converts the process variable PDF to parameter PDF at a particular dose setting.

Thus, the dose PDF is converted to the CD PDF that can be further used to compute a probability that CD will be within a desired range per dose setting, failure probabilities of the patterning process, or other statistically interesting values. According to the present disclosure, computation of failure probabilities (or failure rate) is further discussed with respect to process P60.

In an embodiment, when the original functional relationship 610 may be non-monotonic (i.e. one multiple process values may lead to the same parameter), the right part of eq. 3 will be replaced by a sum over the multiple process-values (e.g. dose).

Figure 11C:
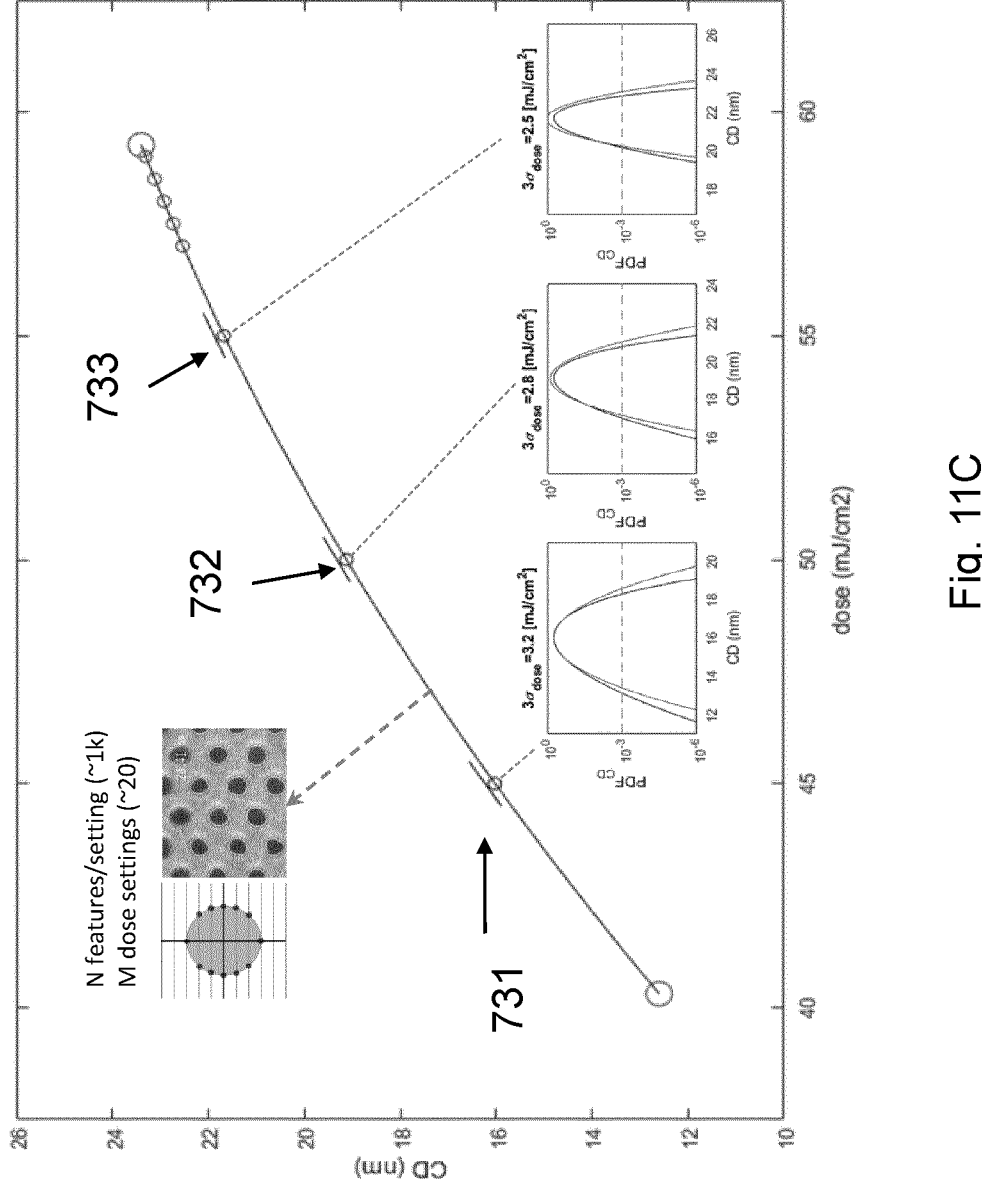
FIG. 11C illustrates example CD PDFs at different dose settings, according to an embodiment.

FIG. 11C, illustrates examples of the CD PDF 630 obtained at different dose settings using, for example, equation (3) above. For example, a first CD PDF 731 at a first dose setting 45 mJ/cm², a second CD PDF 732 at a second dose setting 50 mJ/cm², and a third CD PDF 733 at dose setting 55 mJ/cm², etc. may be obtained. The FIG. 11C also illustrates a standard normal CD PDF at each dose settings to illustrate deviation of the computed CD PDF from standard or normal distribution that typically assumes normal operating condition, while the actual operating conditions may be different from normal conditions; hence such CD PDF (e.g., 731, 732, 733) provide a more realistic estimates (e.g., of failure probabilities) compared to assumed normal operation.

Referring back to FIG. 10, in process P40, failure rates of features with reference to the parameter (e.g., CD) may be obtained/measured per setting of the process variable (e.g., dose). In the present disclosure, the term failure rate and failure probability of a feature may be used interchangeably. In an embodiment, the failure rate of an individual feature can be expressed as, for example, 1 part per million (ppm) or 1 part per billion (ppb) of the feature of the pattern. In other words, 1 ppm may mean that 1 feature out of 1 million occurrences of the feature is expected to fail. In an embodiment, failure rates may correspond to different failure modes such as a physical failure, a transfer failure, and a postponed failure associated with individual features. A failure of a feature can be determined based on, for example, a failure analysis of a SEM image of the substrate or by electrical measurements.

In an embodiment, the physical failure may refer to a failure that can be quantified based on a physical aspect of a feature, for example, resist mechanically fails at a certain CD and/or the feature having certain CD does not transfer to the substrate. For example, the aspect ratio of a pillar (i.e., a vertical thickness to horizontal width ratio), a thickness of a resist, size of a contact hole, etc. or other measurable parameters. Based on the measurements, a physical failure can indicate that the CD of the feature has an aspect ratio greater than a threshold (e.g., >3) which causes the feature to failure. For example, in FIG. 11D, a pillar 771 bends at an angle with respect to the substrate after the pattern transfer process or resist development as the aspect ratio is greater than 3. Hence, although the pillar is transferred to the substrate there is a physical deformation.

In certain cases, a desired pattern may be only partially transferred or not transferred at all to the substrate. Such a failure may be referred to as a transfer failure. For example, out of 20 contact holes only 15 may be transferred and 5 holes may be missing both originally present in resist. Such missing holes may be termed as transfer failures. In an embodiment, the transfer failure may be due to the parameter being outside threshold limits of the patterning process. For example, in FIG. 11E, the contact hole may be too small (e.g., less than 5 nm) and the resist layer may be relatively thick which disallows transfer of such small contact holes. Hence, an incomplete transfer of pattern may be observed such as a footing 772 may be observed where a contact hole may be blocked at the substrate. In another embodiment, a necking 773 may observed in which, a top layer of the resist may not be removed while at the substrate an incomplete hole may be formed. In either case, a hole is not formed throughout the resist up to the substrate. Such transfer failure may be due to, for example, contact hole being too small to transfer to next layer or there may excess etch-loading due to resist thickness or resist type.

The postponed failure of the feature may be a failure that occurs in a next step of the patterning process due to a parameter (e.g. CD) outside its stipulated bounds in a current processing step. For example, failure of a feature occurring in a development stage after the patterning process.

It can be appreciated that the present disclosure is not limited to a type of failure. Also, in some cases, the types of failures may be used interchangeably to mean a failure in general. In an embodiment, the transfer failure may also be referred as a physical failure, or a postponed failure may also be referred as the physical failure. The present disclosure is not limited to a type of failure and generally any deviation from the design intent beyond a certain threshold may be considered as a failure.

Figure 11G:
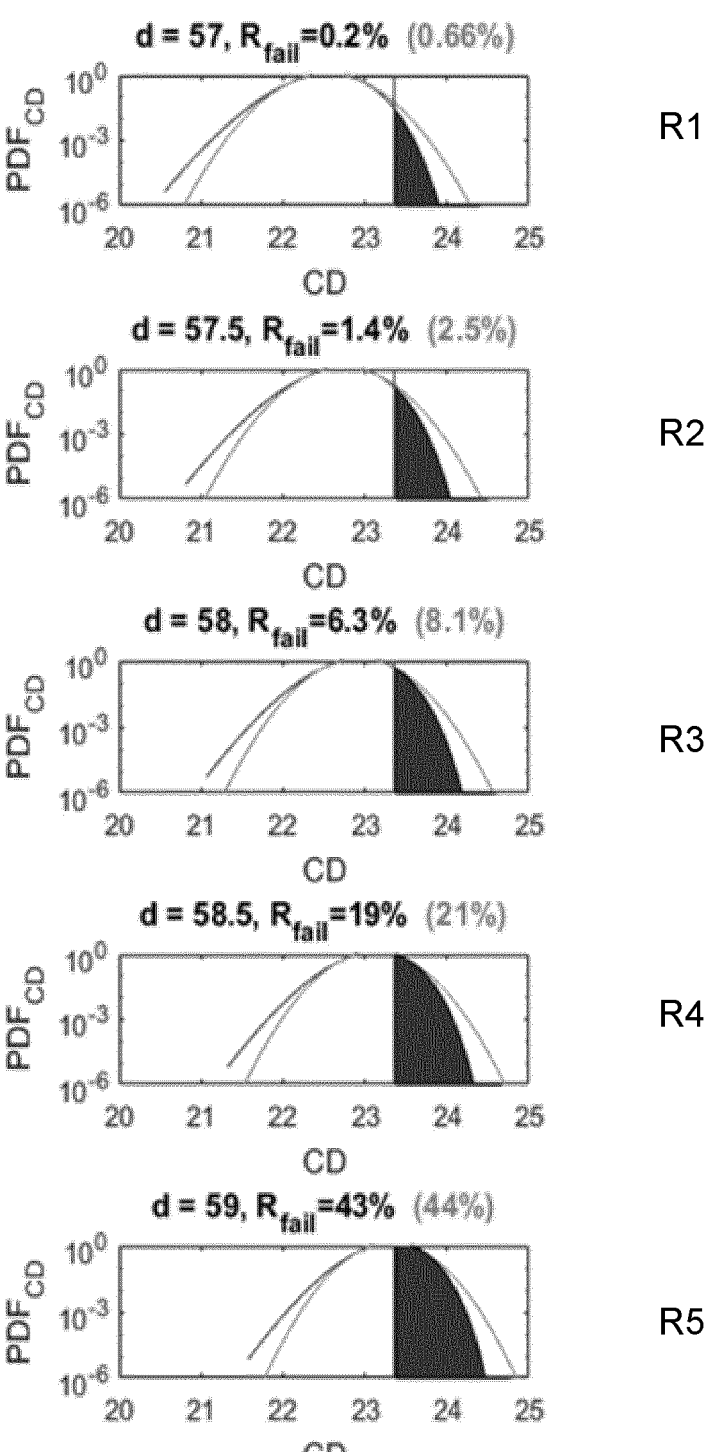
FIG. 11G illustrates an example parameter limit and related failure probabilities at different dose setting, according to an embodiment.

In an embodiment, the failure rates may be measured for failures that occur at ends of a curve fitted between the parameter and the process variable. For example, as shown in FIG. 11F and FIG. 11G, the failure rates may be measured at process parameters R1, R2, R3, R4, and R5. The failure measurement locations may be defined as location on the curve 702 that are beyond certain values of, for example, dose based on experience or prior observed failures. In the present example, the failure rate measurements are defined at both ends of the curve, i.e., having dose values above approximately 55 mJ/cm² and below or around 43 mJ/cm². In an embodiment, the one or more failures of the feature may weighted based on a frequency of a particular failure to generate a weighted failure rate of the feature. For example, if a contact hole failure occurs more often at a dose setting of approximately 43 mJ/cm², then a higher weight may be assigned to such failures at that dose setting. In another embodiment, a weighted function of the process variable may be obtained/generated based on a correlation between the one or more failures and the process variable. For example, the low dose (e.g., below 40 mJ/cm² in the examples herein) may be assigned a higher weight, since higher failures may be observed at such doses compared to other doses. Accordingly, a weighted parameter limit of the parameter and subsequently a process window may be computed based on the weighted function of the process variable.

In an embodiment, measurements of failure rate may be performed in a selective manner based on the process variable and parameter values. Further, a failure of the one or more feature may be correlated (e.g., by linear regression or other statistical techniques) to the parameter and/or the process variable. For example, one or more features may be sensitive to a higher dose and one or more features may be sensitive to a lower dose. In other words, for example, a feature A may have a higher probability of failure at a 50 mJ/cm² dose compared to at 45 mJ/cm² dose. During the patterning process, the dose may vary between different dies, as such the same feature (e.g., feature A) may be exposed at different doses that eventually affects the failure probability of the feature and hence failure probabilities of different dies. As such, depending on the dose and number of instances of a feature in a die, the failure probability may vary among different dies. In other words, for example, if a particular feature is more likely to fail at a high dose and a die of the substrate includes 10⁶ such features, then the failure rate of the die may be high (e.g., 1 per 10⁴) as opposed to a die exposed at a relatively lower dose.

In addition or alternatively, the failure may be related to the parameter such as CD. For example, a CD of a contact hole may be too small (e.g., less than a threshold such as less than 10 nm) which causes footing (i.e., a hole is not transferred to the substrate), a CD of the pillar may be too large that it causes the pillar to bend, CD (i.e., thickness) of the resist layer is too large which causes a necking, or CD is too large that random via contacts are observed, etc. Such correlation also enables determination of a failure rate of each individual feature as a function of the parameter and/or process variable. Hence, based on the failure rate of a feature, a sampling scheme may be defined for optimized measurements.

In an embodiment, based on the failure rate of a feature (e.g., feature A) and a scanner data (e.g., dose values) across a die and/or a substrate, a failure rate map may be generated/obtained by modelling and/or simulation of the relationship between the failure rate and the process variable (e.g., dose). Similarly, a map of the failure rate for the entire substrate may be determined based on the failure rate of a pattern and/or a die. Based on such failure rate map, a sampling scheme may be defined for measurements on the substrate. For example, the sampling scheme may be modified to take more measurements at certain dose values at certain locations on the substrate that have a relatively higher probability of failure, thus reducing the metrology burden and improving the efficiency of the patterning process. Also, based on the failure rate of the one or more features, the process variable, e.g., dose values may be modified to maximize the yield.

According to an embodiment, the failure rate, process variable and parameter may be related. For example, failure rate, dose values and CD are related, hence a CD limit may also be determined for each dose value to limit the failures and increase the yield of the patterning process. A process of determining such CD limit or parameter limit in general is discussed next.

In process P50, a parameter limit may be computed based on the measured failure rates per setting of the process variable and the parameter PDF such as 630. The parameter limit can be a common theoretical limit at which less than a predetermined number or percentage (e.g., 50%) of features fail per setting of the process variable, further discussed with respect to FIGS. 11F and 11G. The parameter limit can be determined in an iterative manner based on a cumulative distribution of the parameter PDF. An example equation to determine a CD limit is provided in the following equation (4):

$$R_{fail} = \int_{CD_{lim}}^{\infty} PDF_{CD}(CD, d)dCD = 1 - CDF_{CD}(CD_{lim}, d) \tag{4}$$

In the equation (4) above, (i) $R_{fail}$ is a failure rate of a feature per setting of the process variable, i.e., dose; (ii) $PDF_{CD}(CD,d)$ refers to the parameter PDF such as PDF 630 obtained in process P30; and (iii) $CDF_{CD}(CD_{lim},d)$ is a cumulative distribution function of the $PDF_{CD}(CD,d)$ that provides a total probability of failure at and beyond the $CD_{lim}$. In an embodiment, $PDF_{CD}(CD,d)$ may be a normal distribution as discussed earlier. The parameter limit can be determined at one or more settings of the process variables (e.g. dose) with corresponding failure rates where the failing features do not influence each other's failure-rate (i.e. one can treat each failure as an "isolated failure"), yet a sufficient amount of them is present to limit the variance of the measured or determined failure-rate. A typical rate can be around approximately 1%. In an embodiment, the parameter limit may be a common parameter limit, the common parameter limit determined based on a plurality of probability density functions of the parameter, each probability density function of the parameter determined at a particular setting of the process variable, for example, as illustrated in FIG. 11G.

The determination of the parameter limit, using the equation (4), is further graphically explained for the parameter CD with respect to FIGS. 11F and 11G. In an example, the measured failure rates that are above a predetermined threshold (e.g., more than or equal to 50%) per setting can be compared to the computed total failure rate using $CDF_{CD}$ $(CD_{lim},d)$ to determine the $CD_{lim}$ of a feature per dose. Such $CD_{lim}$ of the feature suggests that at a particular dose, the CD value of the feature may not exceed the $CD_{lim}$ otherwise a high failure rate may be observed. For example, a $CD_{lim}$ can be 23.5 nm. A parameter limit set at 50% fail-rate represents the academic process-limit in the absence of stochastics. By determining the $CD_{lim}$ at multiple process variables one can validate that the process-variables relates in expected fashion to the related defect-mode.

FIG. 11F shows that at an end of the curve 702, particularly around a relatively high dose value of 58 mJ/cm² for $CD_{lim}$ of 23.5, the failure rate (shaded region) may be 6.3% when computed using the parameter PDF 630 (or 8.1% assuming a nominal distribution of CD). Similarly, FIG. 11G shows, for the $CD_{lim}$ of 23.5 nm, the failure rates at per dose setting may be within the desired limit. For example, the failure rates are: 0.2% at dose 57; 1.4% at dose 57.5; 6.3% at dose 58; 19% at 58.5; and 43% at dose 59. Thus, the $CD_{lim}$ of 23.5 nm satisfies the failure rate specification for several doses.

In another example, the failure rates may also be computed for the feature exposed at a relatively lower dose value (e.g., around 44 mJ/cm², see FIG. 11H) that may result in a second $CD_{lim2}$. Hence, a failure rate equation based on two different $CD_{lim1}$ and $CD_{lim2}$ can be a sum of the resist thickness of the feature at a lower end of the curve 702 and the failure rate at a high end of the curve 702, as follows:

$$R_{fail}(d) = \int_{-\infty}^{CD_{lim1}} PDF_{CD}(CD, d)dCD + \int_{CD_{lim2}}^{\infty} PDF_{CD}(CD, d)dCD \tag{5}$$

Referring back to FIG. 10, in process P60, after the parameter limit is determined, the failure rate equations such as (4) and (5) may also be used to estimate failure rates for any dose values. In other words, the parameter limits may be substituted in the failure rate equation (e.g., eq. 4 or 5) and the failure rate is treated as unknown. Such an equation where failure rate is unknown is referred as an estimated failure rate. The failure rate may be estimated/determined (or solved) for different values of the process variable (e.g., dose).

The estimated failure rate may be further used to determine a process window over the process variable (e.g., dose). For example, the process window can be a range of dose values for which the estimated failure rate may be less than 10⁹. In an embodiment, a desired failure rate may be determined from a desired yield (e.g., 99.9% for 10⁶ features), for example, using the equation (6) below:

$$R_{fail}(d) = (1 - Y(d)) \tag{6}$$

Figure 11H:
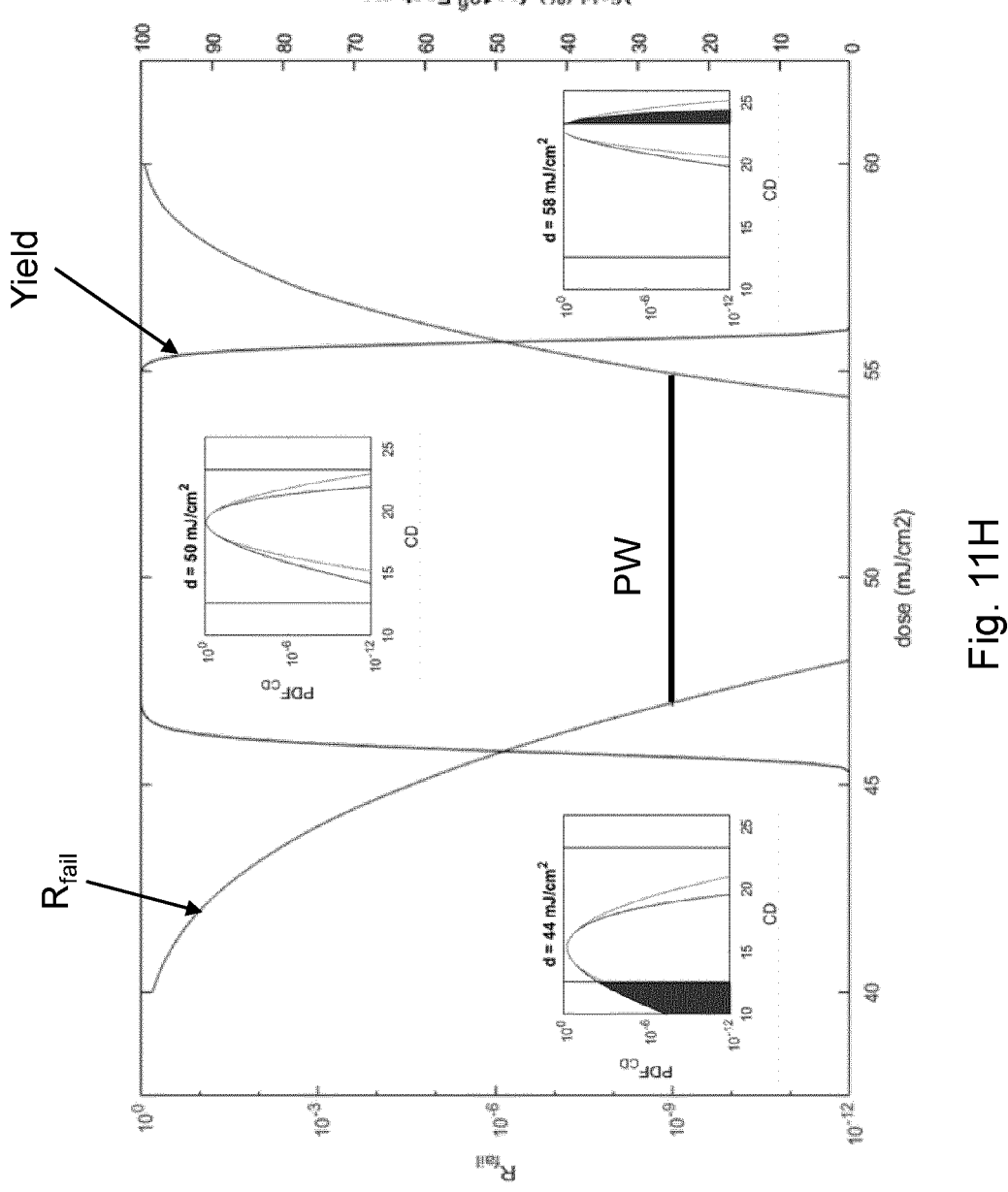
FIG. 11H illustrates an example process window, according to an embodiment.

In an embodiment, the process window may be determined graphically by plotting an estimated failure rate equation, as shown in FIG. 11H. For example, an estimated failure rate graph may be plotted against the process variable (e.g., dose). Then, a horizontal line can be drawn at a desired failure rate (e.g., 10⁻⁹) that may intersect with the estimated failure rate; the intersecting points provide the range of dose values i.e., the process window PW.

In an embodiment, a yield can be computed using the estimated failure rate (e.g., in eq. 4 or 5) as follows:

$$Y(d) = (1 - R_{fail}(d))^N \tag{7}$$

In equation (7) above, Y(d) is the yield at a particular dose (d) for N individual features, and $R_{fail}$(d) is the estimated failure rate (e.g., in eq. 4 or 5). Based on such computed yield, the process window can be selected where the computed yield is greater than or equal to the desired yield (e.g., 99.9%).

In an embodiment, the process window based on the yield may also be determined graphically, see FIG. 11H. For example, a computed yield graph (or estimated failure rate) may be plotted against the process variable (e.g., dose). Then, a line can be drawn at a desired yield (e.g., 99.9%) that may intersect with the yield graph (or the estimated failure rate), then, the intersecting points provide the range of dose values i.e., the process window PW. Thus, the process window not only defines the limits of the parameter of a feature that can be obtained from the patterning process, but also ensures that within such limits the feature is with desired yield or failure rate.

Furthermore, the above method can be extended to compute process window for each individual feature and an overlapping process window of different features may be determined to identify an effective process window for the patterning process. In addition, the process window can be defined over multiple process variables, for example, the above method can be performed at different alternative process-settings such as focus (or overlay, aberrations, track-temperature etc). Here, both the functional forms 610, 620, 630 (e.g. $f_{CD}$(d)), $PDF_d$(d), $PDF_{CD}$(d)) as well as the parameter limits $CD_{lim}$ may have these extra parameters as an additional dimensions (e.g. $CD_{lim}$ also including focus $CD_{lim}$ (focus)). Then, a two-dimensional dose-focus process window can be determined. Such 2-dimensional dose-focus window for different features is illustrated in FIGS. 12A and 12B, and further an overlapping processing window is illustrated in FIG. 12C.

Figure 12A:
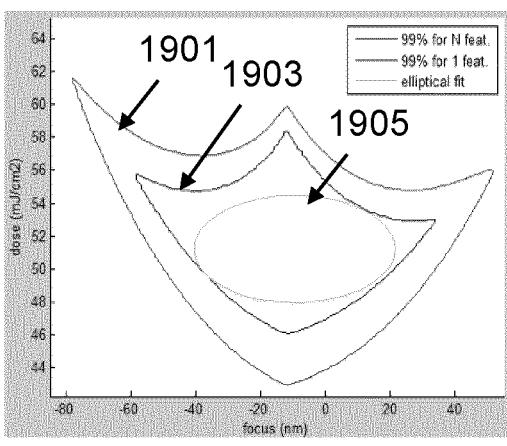
FIG. 12A illustrates an example process window for a first feature, according to an embodiment.

FIG. 12A illustrates a process window for a first feature (e.g., iso-contact hole features having a diameter of approximately 8 nm). A process window 1901 may be for a first feature, and a process window 1903 may be for N features. Further, the process window 1903 can be further refined by determining an elliptical process window 1905 within the bounds of the process window 1903 such that the elliptical process window 1905 has a relatively higher accuracy of (or lower variation in), for example, CD particularly at the boundary of the ellipse compared accuracy at the boundary of the process window 1903. It can be appreciated that the present disclosure is not limited to elliptical fit, and other appropriate fitting such as rectangular fit may be applied depending on other process variables or limitations (e.g. for strong correlation between process parameters, one can use rectangular fits while for non-correlated process parameters an elliptical fit can be used).

Figure 12B:
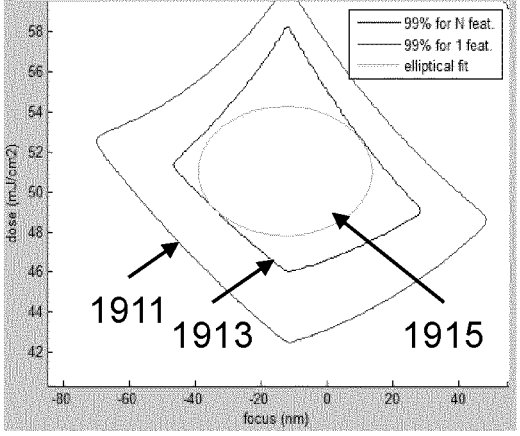
FIG. 12B illustrates an example process window for a second feature, according to an embodiment.

Similarly, in FIG. 12B, a process window for a second feature (e.g., dense-contact holes having a diameter of approximately 13 nm) can be determined. A process window 1911 may be for a single such feature, a process window 1913 can be for N (104) such features, and an elliptical window 1915 fitted within the process window 1913 for improved accuracy of the patterning process.

Figure 12C:
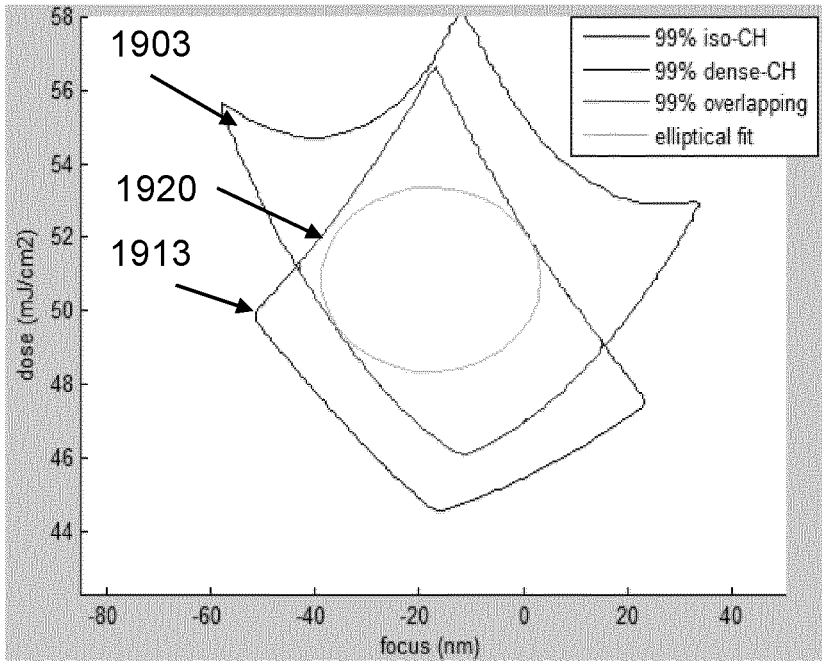
FIG. 12C illustrates an overlapping process window of FIGS. 12A and 12B, according to an embodiment.

Then, as shown in FIG. 12C, an overlapping process window 1920 can be determined from the process window 1903 of the first feature and the process window 1913 of the second window. The overlapping process window 1920 is a common region within the process window 1903 and 1913. For example, the overlapping process window 1920 can be determined by computing the product of the individual yields from which the first process window 1903 and the second process window 1913 were determined, where each process window can be a function of focus and dose. In another example, an intersection operation can be performed, where the process windows 1903 and 1913 are expressed in terms of set of values of, for example, dose and/or focus.

It can be appreciated by a person skilled in the art that the operation is not limited to calculating yield-products or intersection and any other appropriate mathematical operation/graphical approach/simulation can be performed to determine the overlapping process window 1920. Such overlapping process window 1920 between multiple features can be used as the process window for the entire substrate used in the patterning process to obtain a desired yield having with minimum defects.

Figure 13:
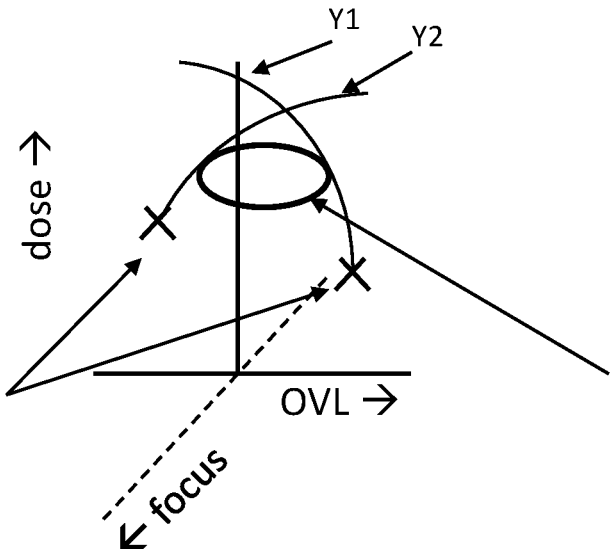
FIG. 13 illustrates a multidimensional process window, according to an embodiment.

Furthermore, the present disclosure is not limited to a two-dimensional process window (e.g., dose-focus process window). The method can be extended to provide a multi-dimensional process window. For example, a third variable, overlay, may be considered. Then, a yield and/or failure rates can be a function of dose, focus, overlay, or a combination thereof. Accordingly, the process window can be determined such that limits or specification based on all three process variables are satisfied. An example, multi-dimensional yield based process window is illustrated in FIG. 13. In FIG. 13, a first yield curve Y1 can be defined between overlay and dose and a second yield curve Y2 can be between focus and dose. Then an elliptical fit can be performed as a function of three variables (i.e., dose, focus, and overlay) such that the ellipse is bounded by the first yield curve Y1 and the second yield curve Y2. Then, the elliptical process window can be considered as the multi-dimensional process window. It can be appreciated that the term curve is used for visual clarity and understanding purposes only and is not limiting. The curve can be any function in general. Also, elliptical fit is also exemplary and other appropriate (e.g., rectangular) fit may be performed depending on process conditions that affect the process window.

In another embodiment, the method of FIG. 10 can be further extended to provide process window for an entire layer of a die having several features, each occurring multiple time per die of the substrate. For example, $$Y_{layer}(CD_{lim}) = \prod_{i=1}^{N} Y_i(CD_{lim}^i) \tag{8}$$

In equation (8) above, the yield $Y_i(CD_{lim}^i)$ refers to the desired yield of individual feature i having a CD limit $CD_{lim}^i$ and N is the total number of features on a particular layer. Then the yield of the layer is a product of the individual feature yield. The yield of the layer can be further used to compute the process window in a similar manner as discussed with respect to step P60, for example, using equations (6) and (7). The features can be grouped into "types" or "classes" when their parameter limits and $PDF_{CD}$ are similar to simplify the evaluation (e.g. a contact-hole and a line) for practical reasons in applications.

In an embodiment, the above method of determining a defect based (or yield based) process window can be further refined to provide a more accurate results. For example, by refining the variation of parameter used to compute the process variable PDF. The refined process variable PDF may be further used to compute a refined parameter PDF, which may give a more accurate processing window. In other words, a better estimate of the variance in parameter, by adjusting for known and/or stochastic variances caused by different factors within the patterning process, may be obtained to further generate more accurate results (i.e., a process window) compared to the above method.

The present disclosure describes a method to obtain a defect-based process window for features in random logic structures.

Figure 14:
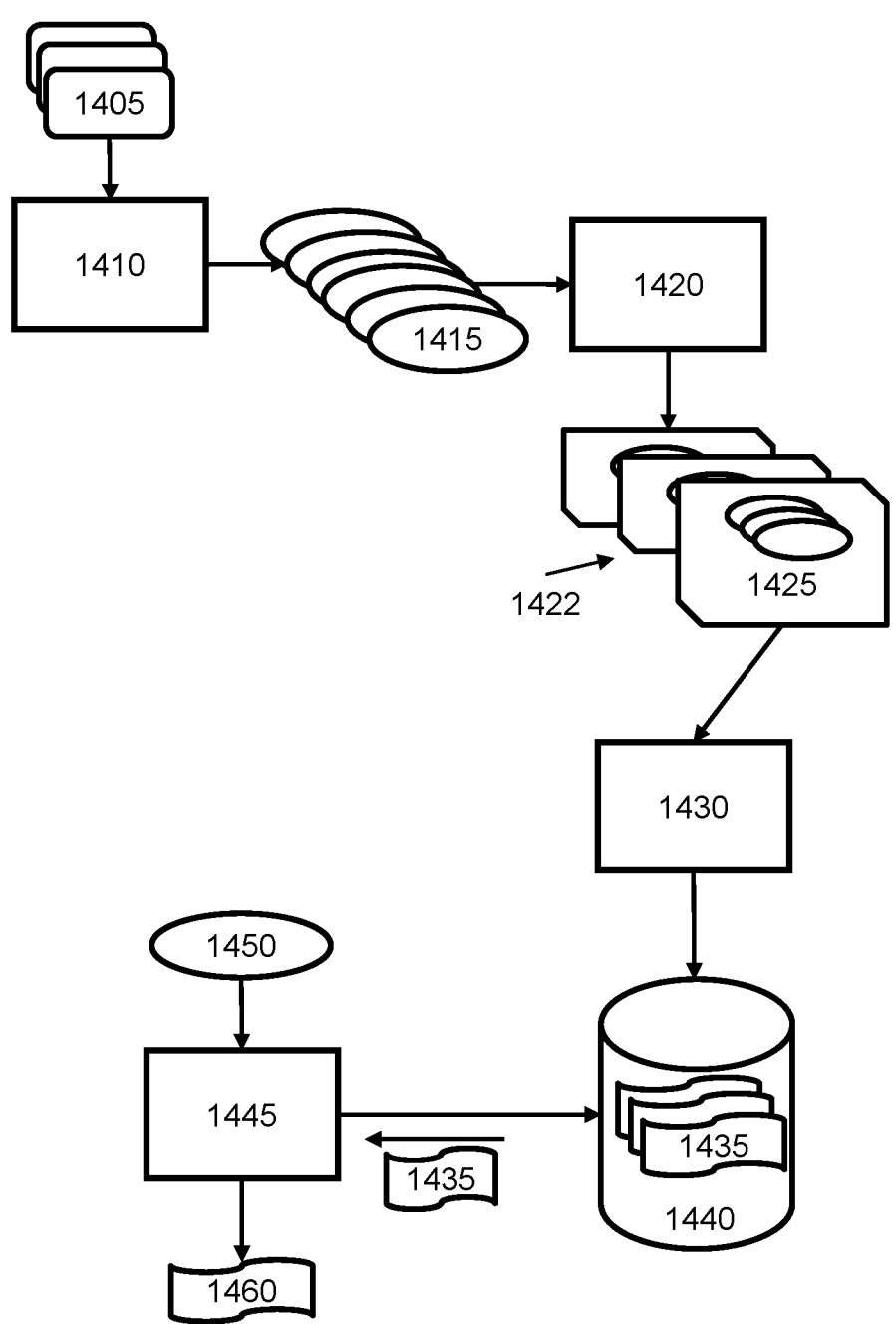
FIG. 14 is a block diagram of an exemplary method for generating a base failure rate model and eventually a feature-specific failure rate model, consistent with various embodiments.

FIG. 14 is a block diagram of an exemplary method for generating a base failure rate model and eventually a feature-specific failure rate model, consistent with various embodiments. As discussed with respect to FIG. 2, inspection tools such as a SEM can be used to obtain various images of the substrate ("SEM images"), which can be used to obtain measurement data associated with various features on the substrate. A number of SEM images 1405 of a substrate are input to a feature selection module 1410. The SEM images 1405 can be of different portions of the substrate and each SEM image can include one or more features printed on the substrate. The feature selection module 1410 analyzes the SEM images 1405 to select those of the features that satisfy a specified criterion as features 1415. In some embodiments, the specified criterion may be related to an occurrence of a feature. For example, the feature selection module 1410 may be configured to select features (a) that are less repetitive within a SEM image or across the SEM images, (b) that occur randomly on the substrate, (c) whose number of occurrences across SEM images is below a first threshold, (d) whose number of occurrences of in a SEM image is below a second threshold, or (e) that are different from other more repetitive features. Typically, the features 1415 are features that appear in random logic structures.

The feature grouping module 1420 groups the features 1415 into a number of feature groups 1422 based on a specified metric. The grouping can be performed using various methods, such as k-means clustering. Each feature group includes one or more features that have similar metric values (e.g., metric values within a predefined range). For example, a feature group 1425 includes features whose metric values are within a first predefined range and another feature group includes features whose metric values are within a second predefined range.

The feature grouping module 1420 may group the features 1415 based on any of a number of metrics, such as CD mean of the features 1415, process window of the features 1415, process window+CD mean of the features, tail CD of the features 1415, focus exposure matrix (FEM) Bossung fit coefficients, raw fail rate of the features 1415, CD distribution probability, etc. Various performance indicators can be used to determine which metric yields a better grouping. One such performance indicator is a probability density function associated with a parameter (e.g., CD) value of a feature (referred to as CD PDF or $PDF_{CD}$), which provides a probability that the parameter value will be within a desired range per process variable setting (e.g., dose) of the patterning process, which may be further used to identify probability of defects and a processing window to reduce defects and effectively improve yield. The $PDF_{CD}$ can be calculated using Eq. 3 as described at least with reference to FIG. 10. In some embodiments, the $PDF_{CD}$ variation of features within a group seem to be the least for the metric process window+CD mean of the features. Accordingly, in some embodiments, the metric process window+CD mean of the features may be used for grouping the features. Additional details with reference to the grouping of features is described at least with reference to FIG. 15 below.

A base FR model generator 1430 processes each of the feature groups to generate a base FR model for the corresponding feature group, and stores the base FR models in a storage system, such as the database 1440. For example, the base FR model generator 1430 processes the feature group 1425 to generate a base FR model 1435 corresponding to the feature group 1425, and processes another feature group to generate another base FR model corresponding to the other feature group. The base FR model 1435 provides an estimated failure rate of the features in the feature group 1425 (or rather for features having a metric value as that of the features within the feature group 1425), which is determined based on the local CD uniformity of features within the feature group 1425. The base FR model generator 1430 may also generate a defect-based process window for the feature group 1425, which is a graph plotted based on a set of dose and focus values for which the estimated failure rate for the features within the feature group 1425 is within a selected or predefined threshold. Additional details of generating the base FR model 1435 is described at least with reference to FIG. 17.

The base FR models can be used to generate a feature-specific FR model, which provides an estimated failure rate of any given feature. A feature-specific FR model generator 1445 determines a metric value associated with a given feature 1450 (e.g., process window+CD mean value), obtains a base FR model from the database 1440 that matches with the metric value of the given feature 1450, and processes the retrieved base model, e.g., by convoluting the base model with measurement data associated with the given feature 1450, to generate the feature-specific FR model 1460. The feature-specific FR model 1460 provides an estimated failure rate of the given feature for various focus and dose values. The feature-specific FR model generator 1445 may also generate a defect-based process window for the given feature 1450, which is a graph plotted based on a set of dose and focus values for which the estimated failure rate for the given feature 1450 is within a selected or predefined threshold. In some embodiments, the base FR model 1435 and the feature-specific FR model 1460 are stored as data structures. Additional details of generating the feature-specific FR model 1460 is described at least with reference to FIG. 18.

Figure 15:
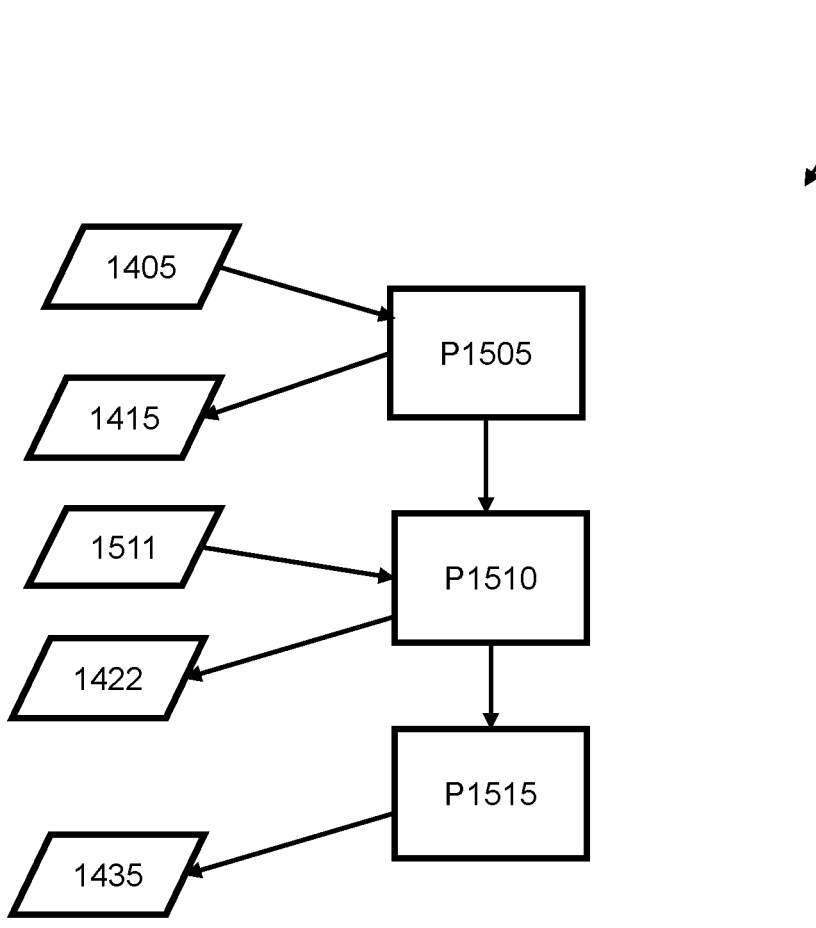
FIG. 15 is a flow diagram of an exemplary method for generating a base failure rate model, consistent with various embodiments.

FIG. 15 is a flow diagram of an exemplary method 1500 for generating a base failure rate model, consistent with various embodiments. At process P1505, a number of features printed on a substrate are obtained. In some embodiments, the features, such as features 1415, which satisfy a specified criterion related to an occurrence of the features (e.g., as described at least with reference to FIG. 14) are obtained. The features 1415 are obtained by analysing the SEM images 1405 of the substrate. In some embodiments, a SEM image is an image of the substrate which is captured using a tool such as a SEM. The SEM images 1405 can be used to obtain various measurement data associated with the features 1415 (e.g., using measurement methods as described at least with reference to FIG. 1). The measurement data associated with the features can include, among other data, mean CD of each of the features 1415 and a process window of each of the features 1415, which is indicative of a set of focus and dose values for which the CD of the corresponding feature is within specification (e.g., ±10% CD variation limit).

At process P1510, the features 1415 are grouped into one or more feature groups 1422 based on a metric. In some embodiments, a metric such as process window+CD mean is chosen from among a number of metrics (e.g., as described at least with reference to FIG. 14). In some embodiments, the metric process window+CD mean is determined to perform better than other metrics, such as CD mean and process window, based on a performance indicator such as the $PDF_{CD}$, as illustrated in FIGS. 16A and 16B.

Figure 16A:
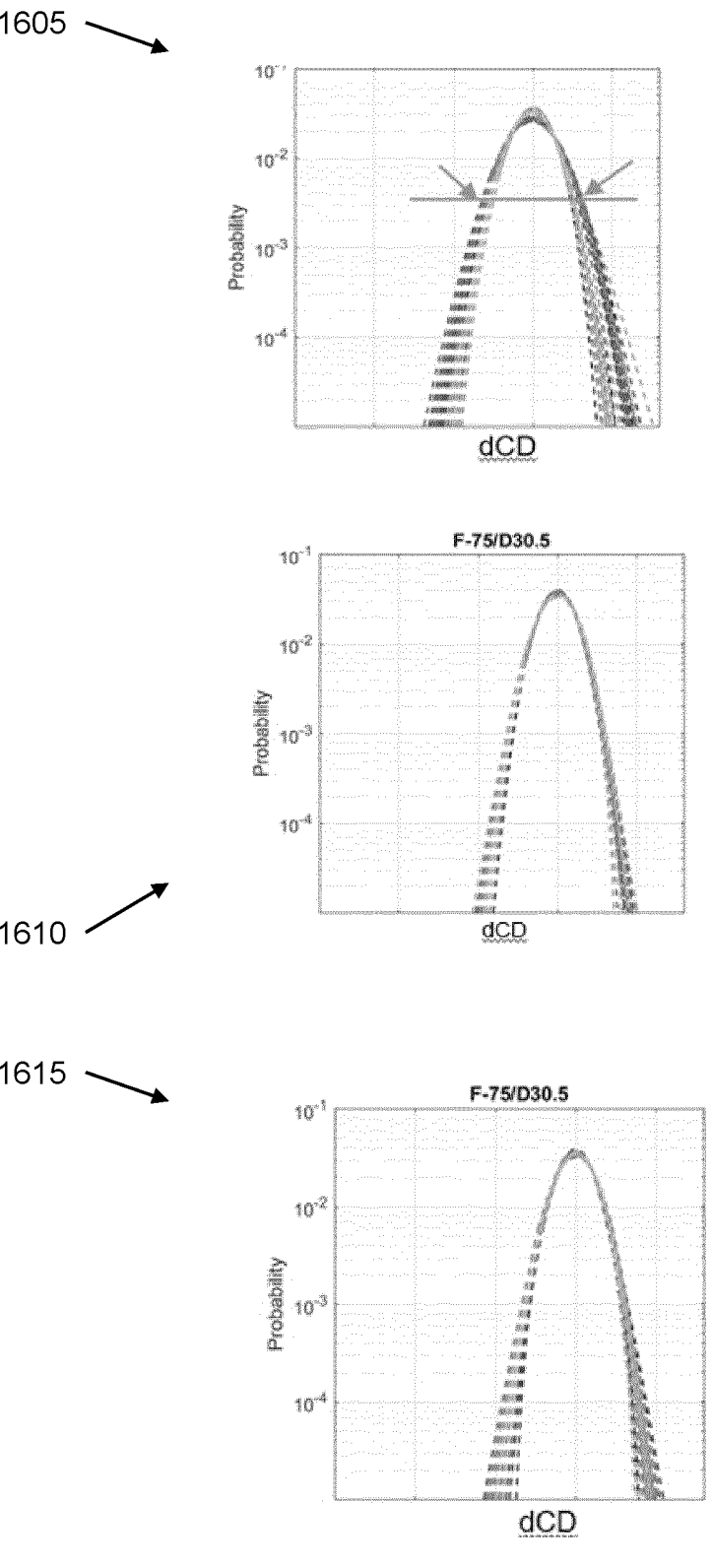
FIG. 16A shows $PDF_{CD}$ graphs of features grouped based on three different metrics, consistent with various embodiments.

FIG. 16A shows $PDF_{CD}$ graphs of features grouped based on three different metrics, consistent with various embodiments. For example, graph 1605 illustrates $PDF_{CD}$ of a feature group that is grouped based on a CD mean metric, graph 1610 illustrates $PDF_{CD}$ of a feature group that is grouped based on a process window+CD mean metric, and graph 1615 illustrates $PDF_{CD}$ of a feature group that is grouped based on a process window metric. In some embodiments, the $PDF_{CD}$ can be calculated using Eq. 3 as described at least with reference to FIG. 10. For example, the $PDF_{CD}$ is calculated for dCD values of each feature in a group, which is CD data of the feature for various focus and dose values with mean CD of the feature removed per SEM image.

Figure 16B:
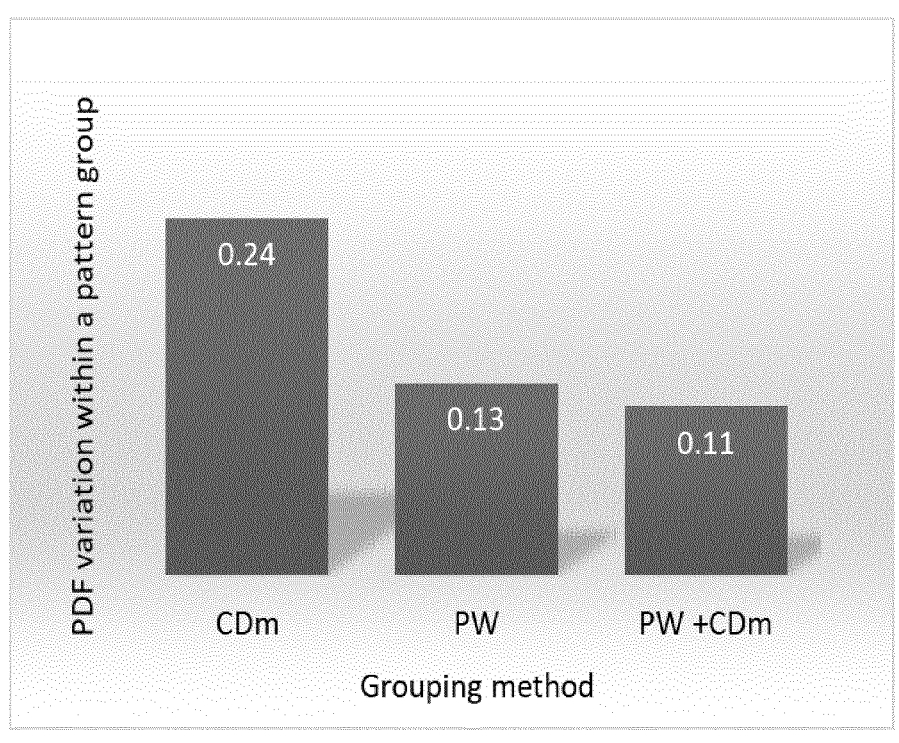
FIG. 16B shows $PDF_{CD}$ variation of features within a group for each of three different metrics, consistent with various embodiments.

FIG. 16B shows $PDF_{CD}$ variation of features within a group for each of three different metrics, consistent with various embodiments. In some embodiments, the $PDF_{CD}$ variation is calculated as average variation the dCD values (e.g., 3 σ) to above and below the mean CD. For example, the $PDF_{CD}$ variation of features with a feature group that is grouped based on a CD mean metric is "0.24", the $PDF_{CD}$ variation of features with a feature group that is grouped based on a process window metric is "0.13", and the $PDF_{CD}$ variation of features with a feature group that is grouped based on a process window+CD mean metric is "0.11." Accordingly, in some embodiments, the $PDF_{CD}$ variation is the least in the process window+CD mean metric and therefore, the process window+CD mean metric is used in grouping the features.

Figure 16C:
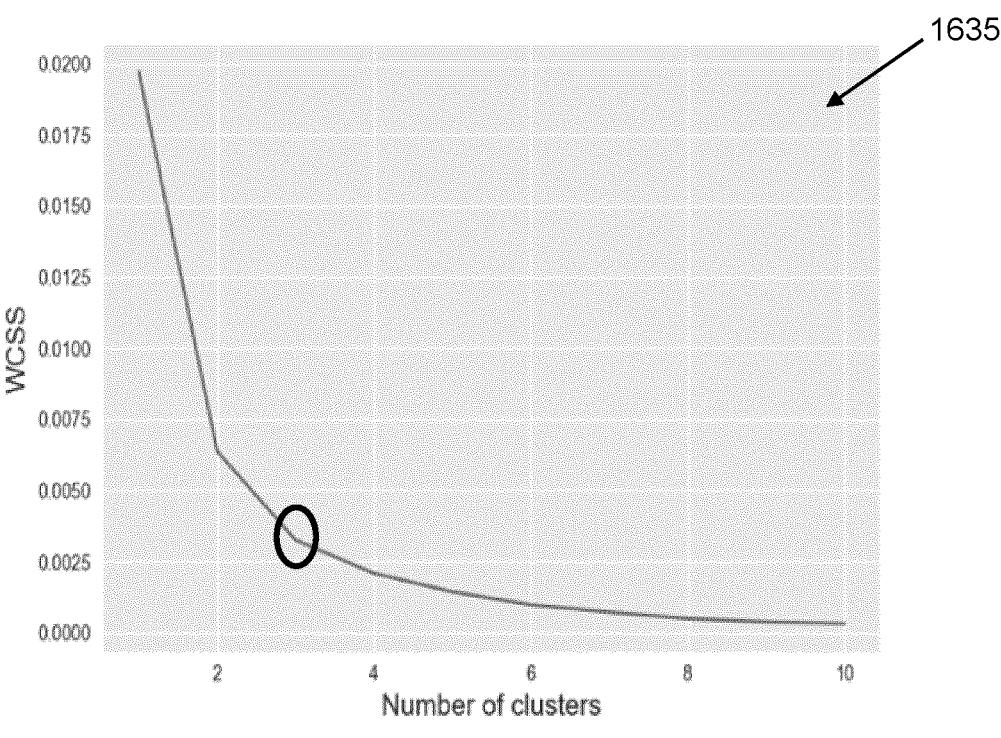
FIG. 16C illustrates an example graph depicting a relation between number of clusters and a metric, consistent with various embodiments.

The features 1415 can be grouped into one or more groups. In some embodiments, the number of groups formed can have an impact on measurement time (e.g., computing resources) and accuracy of failure rate prediction. In some embodiments, lesser number of groups can lead to lower accuracy of the FR prediction and a greater number of groups can consume more measurement time. Accordingly, an optimal number of clusters may have to be determined. In some embodiments, within cluster sum of squares (WCSS) is one such metric that can be used to determine an optimal count for the clusters. FIG. 16C illustrates an example graph depicting a relationship between a number of clusters and a metric, consistent with various embodiments. In the graph 1635, the optimal cluster count is determined to be "3" based on the WCSS.

Figure 16D:
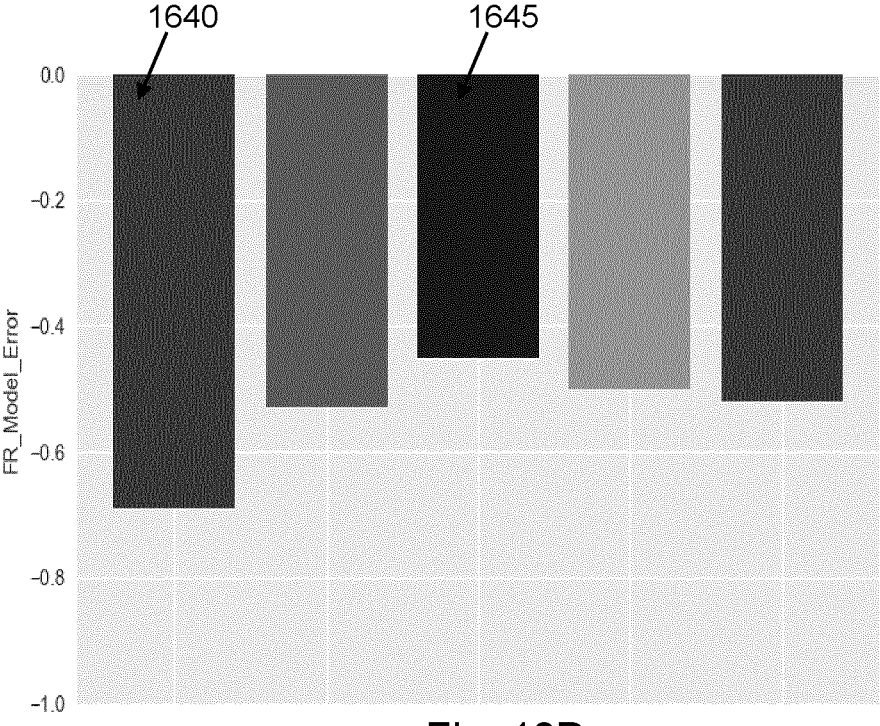
FIG. 16D illustrates an example graph of failure rate prediction accuracy for various feature grouping methods, consistent with various embodiments.

FIG. 16D illustrates an example graph of failure rate prediction accuracy for various feature grouping methods, consistent with various embodiments. The graph 1640 indicates FR error prediction without grouping and the other graphs indicate the FR error prediction for other groupings such as FEM grouping, process window+CD mean grouping, LCDU grouping, and MeanCD grouping, respectively. It can be seen from this example graph that the prediction accuracy improved by 23%, 35%, 28%, and 25%, for the other groupings over without grouping benchmark, with the process window+CD mean grouping 1645 having the best improved accuracy (e.g., 35%) among the groupings.

Referring back to process P1510, in some embodiments, grouping the features 1415 can include determining a metric value 1511 for each of the features 1415 and clustering the features 1415 (e.g., using one of many clustering algorithms such as k-means clustering) based on the metric value 1511 to generate the feature groups 1422. The metric value 1511 of a feature, for a metric such as the process window+CD mean, is determined as a mean CD value of the feature and a plurality of dose values and focus values associated with the mean CD at an edge or boundary of a process window of the feature. As discussed above, a process window of a feature is indicative of a set of focus and dose values for which the CD of the corresponding feature is within specification, and the process window can be plotted as a graph with the focus and dose values as x and y axes, respectively, which results in forming a shape. The shape of the process window includes a boundary or edge and different portions of the edge can correspond to different focus and dose values. The process window of a feature can be generated using any of a number of methods.

The metric value 1511 is calculated for each of the features 1415 and the features 1415 are grouped (e.g., clustered) based on the metric values 1511 into the feature groups 1422. In some embodiments, each feature group has features with a similar metric value (e.g., features having metric values within a specified range). In some embodiments, the $PDF_{CD}$ of the features within a group have minimum variation.

Figure 16E:
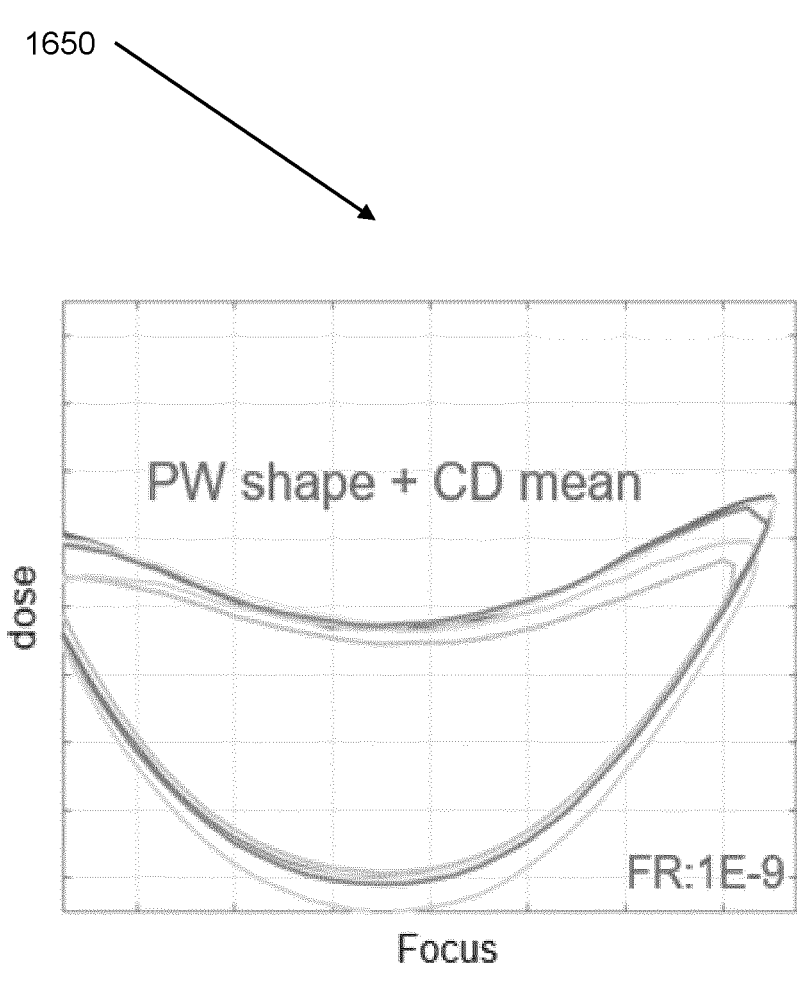
FIG. 16E shows a defect-based process window for a feature group, consistent with various embodiments.

At process P1515, a base FR model is generated for each of the feature groups 1422. For example, a base FR model 1435 is generated for the feature group 1425. As described above, the base FR model 1435 provides an estimated failure rate of the features in the feature group 1425 (or rather for features having a metric value as that of the features within the feature group 1425), which is determined based on the local CD uniformity of features within the feature group 1425. The base FR model 1435 can be stored as a data structure in the database 1440. In some embodiments, the data structure includes a range of focus and dose values and the failure rates of the features in the feature group 1425 for those focus and dose values. A defect-based process window, such as the defect-based process window 1650, can be generated from the base FR model 1435 for the feature group 1425. The defect-based process window 1650 is a graph plotted based on a set of dose and focus values for which the estimated failure rate for the features within the feature group 1425 is within a selected or predefined threshold. FIG. 16E shows a defect-based process window for a feature group, consistent with various embodiments. The defect-based process window 1650 shows a process window (e.g., a range of focus and dose values) within which the failure rate of the features of the feature group 1425 stays within a predefined threshold (e.g., 1E-9 or $1*10^{-9}$). Additional details of generating the base FR model is described at least with reference to FIG. 17.

Figure 17:
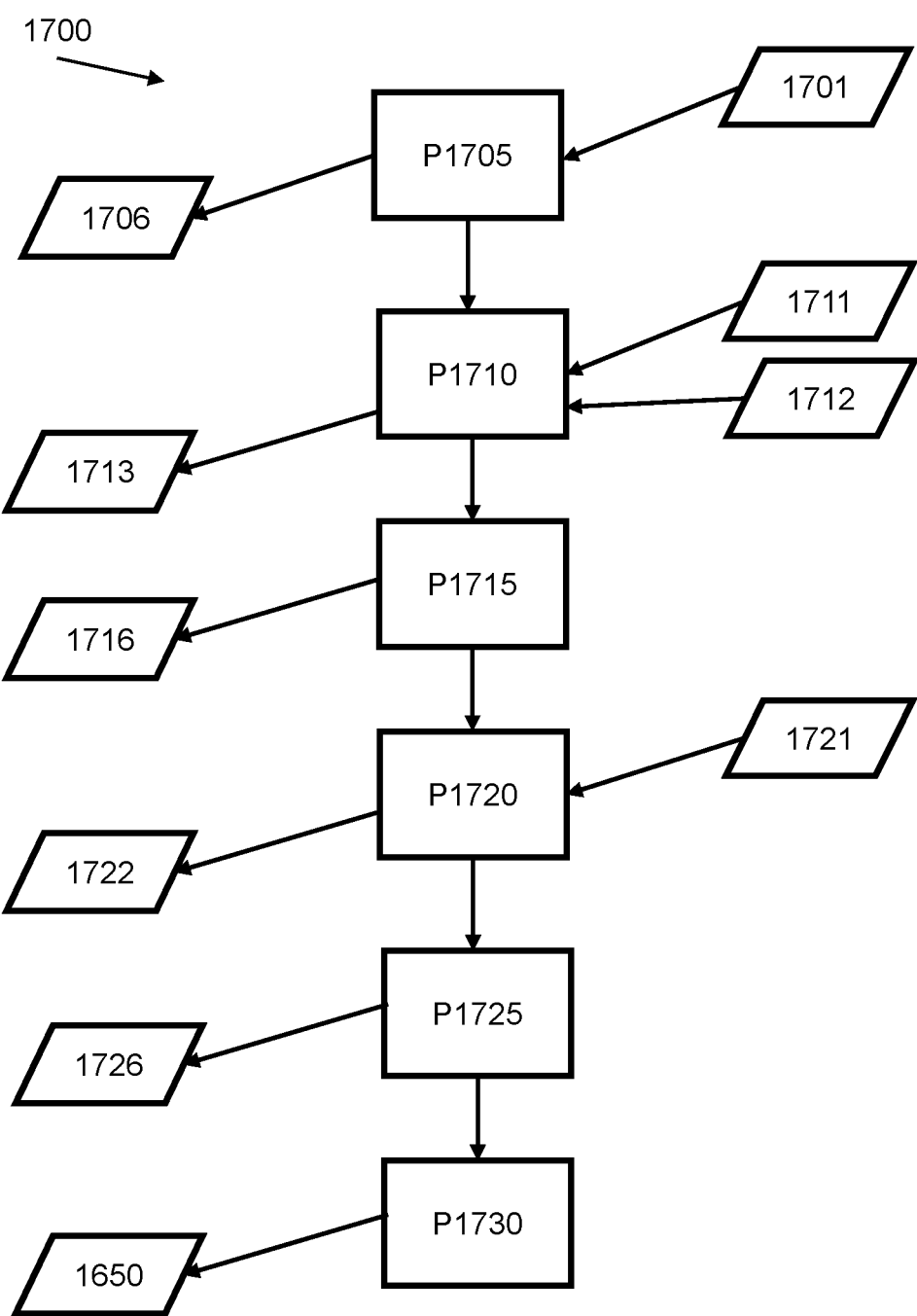
FIG. 17 is a flow diagram of an exemplary method for generating a base failure rate model for a feature group, consistent with various embodiments.

FIG. 17 is a flow diagram of an exemplary method 1700 for generating a base failure rate model for a feature group, consistent with various embodiments. In some embodiments, the method 1700 is executed as part of process P1515 of method 1500. At process P1705, the base FR model generator 1430 obtains measurement data 1701 of the features within a feature group. The measurement data 1701 may include measurements of the parameter (e.g., CD) of the features and process variables (e.g., dose, focus, etc.). For example, the measurement data 1701 may include mean CD of all features within the feature group 1425, and the dose and focus values associated with the mean CD. The measurement data 1701 may then be used for CD uniformity (CDU) modelling, which determines a functional relationship 1706 between the parameter (e.g., mean CD) and the process variable (e.g., dose and focus values) may be established, for example, using eq. (1) as discussed in process P10 of FIGS. 10 and 11A.

At process P1710, the base FR model generator 1430 performs local CD uniformity (LCDU) modelling, which obtains LCDU data 1713 for the feature group 1425. In some embodiments, the LCDU data 1713 is determined by obtaining the LCDU data 1711 of each feature in the feature group 1425 across all the SEM images 1405, and removing from the LCDU data a mean CD 1712 of the feature determined per SEM image. For example, the LCDU modelling can obtain the LCDU data 1713 using eq. (1) as discussed in process P20 of FIG. 10.

At process P1715, the base FR model generator 1430 determines a $PDF_{CD}$ 1716 of the feature group 1425. The $PDF_{CD}$ 1716, which is a function of the mean CD of all the features, a dose value and a variance of the dose value of the patterning process, may be determined and/or obtained based on the LCDU data 1713, and the functional relationship 1706 (e.g., as described at least with reference to process P30 of FIG. 10 and using eq. (3) in process P30).

In some embodiments, as described with reference to FIG. 10, a parameter PDF, such as the $PDF_{CD}$ 1716, provides an estimate of probability that a parameter (e.g., CD) value will be within a desired range per process variable setting (e.g., dose) of the patterning process which may be further used to identify probability of defects and a processing window to reduce defects. In some embodiments, the $PDF_{CD}$ is determined from a process variable PDF (e.g., dose PDF such as PDF 620 of FIG. 10), which is a function of the process variable and a variation of the process variable. The process variable PDF enables to capture an impact of any variations in a setting of dose that may eventually affect the parameter. The $PDF_{CD}$ 1716 can be determined from the dose PDF using a conversion function, as described with reference to process P30 of FIG. 10 and FIG. 11C.

At process P1720, the base FR model generator 1430 performs CD limit modelling, which determines a CD limit 1722 for the feature group 1425. In some embodiments, a CD limit can be a common theoretical limit of CD value of a feature at which less than a predetermined number or percentage of features fail per setting of the process variable (e.g., per focus and dose value). In some embodiments, the CD limit 1722 may be computed based on measured failure rates 1721 per setting of the process variable and the $PDF_{CD}$ 1716, e.g., using eq. (4) described with reference to P50 of FIG. 10. In some embodiments, a pair of CD limits is determined, where a first CD limit is at a lower end of PDF distribution curve and a second CD limit is at higher end of the PDF distribution curve such that a CD value between these CD limits (e.g., CD value is greater than first CD limit and lesser than second CD limit) will keep the failure rates per setting of the process variable (e.g., per focus and dose value) within the predetermined failure rate. Additional details with respect to CD limit are described at least with reference to process P50 of FIG. 10 and FIGS. 11F and 11G.

The failure rates 1721 for determining the CD limit 1722 can be obtained from measured data 1701. In some embodiments, a failure of a feature can be determined based on, for example, a failure analysis of the SEM images. The failure rates of features with reference to the parameter (e.g., CD) may be obtained/measured per setting of the process variable (e.g., dose). In some embodiments, the failure rate of an individual feature can be expressed as, for example, 1 part per million (ppm) or 1 part per billion (ppb) of the feature of the pattern. In other words, 1 ppm may mean that 1 feature out of 1 million occurrences of the feature is expected to fail. In some embodiments, failure rates may correspond to different failure modes such as a physical failure, a transfer failure, and a postponed failure associated with individual features. Additional details with respect to failures and measuring failure rates are described at least with reference to process P40 of FIG. 10 and FIGS. 11D and 11E.

At process P1725, the base FR model generator 1430 determines estimated failure rates 1726 of the features in the feature group 1425 based on the CD limit 1722 and the $PDF_{CD}$ 1716 for various focus or dose values. After the CD limit 1722 is determined, the failure rate equations such as eq. (4) and eq. (5) in processes P40 and P50 of FIG. 10 may be used to estimate failure rates 1726 for any focus and dose values. Additional details with respect to estimating the failure rates are described at least with reference to process P60 of FIG. 10 and FIGS. 11D and 11E.

At process P1730, the base FR model generator 1430 generates a defect-based process window 1650 for the feature group 1425 using the estimated failure rates 1726. For example, the process window can be a range of focus and dose values for which the estimated failure rate may be less than $10^{-9}$.

The base FR model generator 1430 stores the base FR model 1435 in the database 1440. In some embodiments, the base FR model 1435 is a data structure that includes, among other data, $PDF_{CD}$ 1716, CD limit 1722, estimated failure rates 1726 and the defect-based process window 1650 of the features in the feature group 1425.

Figure 18:
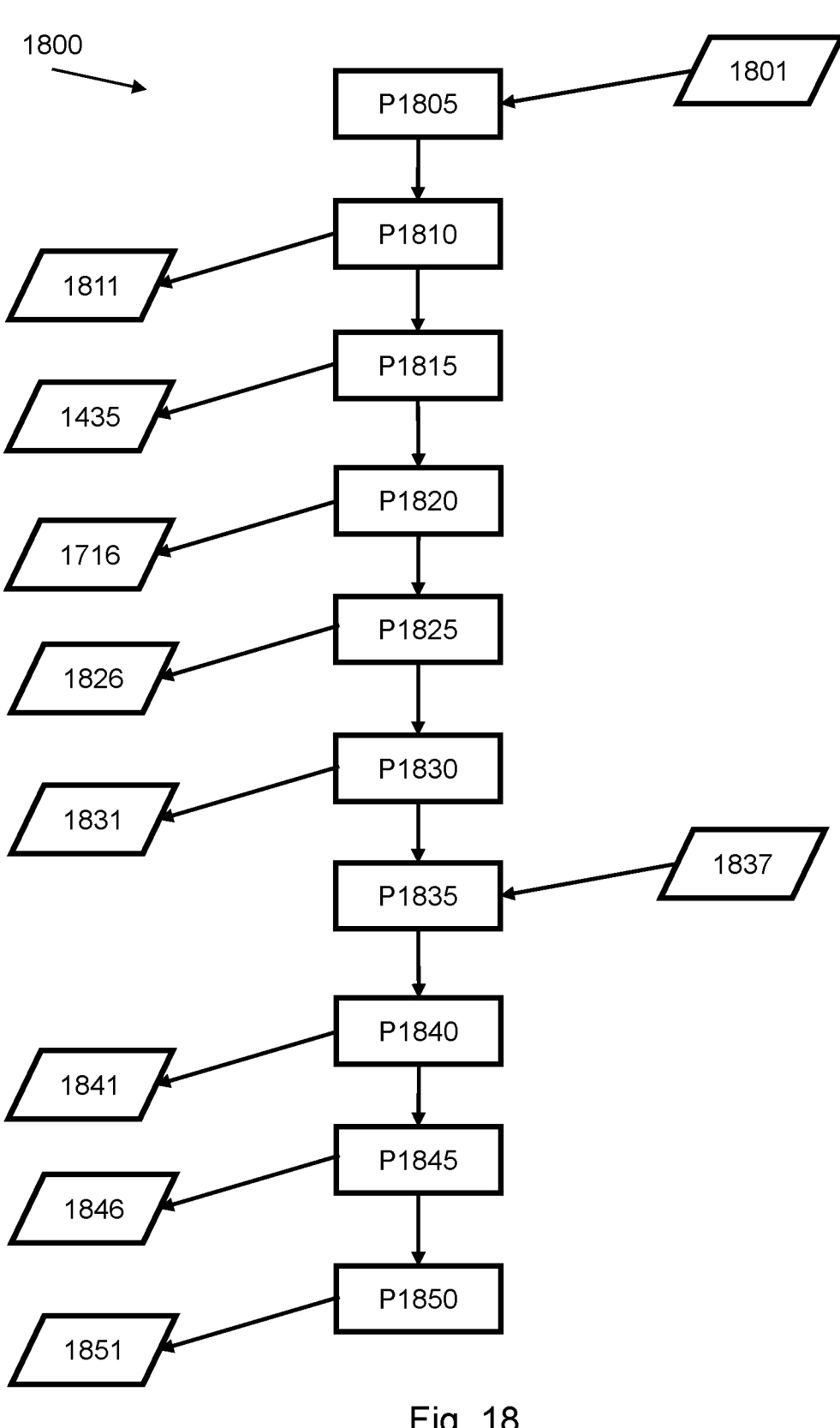
FIG. 18 illustrates a flow diagram of an exemplary method for generating a feature-specific FR model, consistent with various embodiments.

FIG. 18 illustrates a flow diagram of an exemplary method 1800 for generating a feature-specific FR model, consistent with various embodiments. At process P1805, the feature-specific FR model generator 1445 obtains measurement data 1801 associated with a given feature 1450. In some embodiments, the measurement data 1801 can include FEM data of the given feature 1450, which contains the CD value of the given feature 1450 for a range of focus and dose values.

At process P1810, the feature-specific FR model generator 1445 determines a metric value 1811 for the given feature 1450 based on the measurement data 1801. The metric value 1811 of the given feature 1450, for a metric such as the process window+CD mean (e.g., which is a metric used in generating the base FR models), is determined as a mean CD value of the given feature 1450 and a plurality of dose values and focus values associated with the mean CD at an edge or a boundary of a process window of the given feature 1450. The process window can be generated using the measurement data 1801 using any of a number of methods.

At process P1815, the feature-specific FR model generator 1445 selects a base FR model from the database 1440 that has a metric value matching the metric value 1811. For example, the feature-specific FR model generator 1445 selects the base FR model 1435 whose process window+CD mean matches with the process window+CD mean of the given feature 1450. In some embodiments, the metric value of a base FR model is considered to be matching the metric value 1811 if the difference between two metric values does not exceed a specified match threshold.

At process P1820, the feature-specific FR model generator 1445 obtains a $PDF_{CD}$ 1716 from the base FR model 1435.

At process P1825, the feature-specific FR model generator 1445 adjusts a mean CD of the $PDF_{CD}$ 1716 based on the mean CD value of the given feature 1450. In some embodiments, adjusting the mean CD of the $PDF_{CD}$ 1716 includes adding a difference between the mean CD of the $PDF_{CD}$ 1716 and the mean CD value of the given feature 1450 to the mean CD of the $PDF_{CD}$ 1716 to generate an adjusted $PDF_{CD}$ 1826. In some embodiments, generating the adjusted $PDF_{CD}$ is equivalent to shifting the $PDF_{CD}$ 1716 to left or right (in a graph plotted as PDF vs CD) by an amount equal to the difference between the mean CD of the $PDF_{CD}$ 1716 and the mean CD value of the given feature 1450. For example, if the mean CD of the $PDF_{CD}$ 1716 (e.g., "5 nm,") is lesser than the mean CD value of the given feature 1450 (e.g., "7 nm"), the $PDF_{CD}$ 1716 is moved to right of the mean CD of the $PDF_{CD}$ 1716 by the difference (e.g., by "2 nm"). If the mean CD of the $PDF_{CD}$ 1716 (e.g., "8 nm,") is greater than the mean CD value of the given feature 1450 (e.g., "7 nm"), the $PDF_{CD}$ 1716 is moved to the left of the mean CD of the $PDF_{CD}$ 1716 by the difference (e.g., by "1 nm").

At process P1830, the feature-specific FR model generator 1445 determines a CD limit 1831 for the given feature 1450 based on the adjusted $PDF_{CD}$ 1826, e.g., using eq. (4) described with reference to P50 of FIG. 10. In some embodiments, a pair of CD limits may be determined, where a first CD limit is at a lower end of PDF distribution curve and a second CD limit is at higher end of the PDF distribution curve such that a CD value between these CD limits (e.g., CD value is greater than first CD limit and lesser than second CD limit) will keep the failure rates per setting of the process variable (e.g., per focus and dose value) within the predetermined failure rate. Additional details with respect to CD limit are described at least with reference to process P50 of FIG. 10 and FIGS. 11F and 11G.

At process P1835, the feature-specific FR model generator 1445 obtains at least one of an interfield CD variation or intrafield CD variation of the given feature 1450 as CD profile data 1837. In some embodiments, the CD mean variation of the given feature 1450 across different SEM images in a die/field is referred to as intrafield CD variation, and any die-to-die or field-2-field CD mean variation is referred to as interfield CD variation. In some embodiments, if the given feature 1450 is a feature group, e.g., a group of features, then $PDF_{CD}$ of the given feature 1450 is obtained as CD profile data 1837.

At process P1840, the feature-specific FR model generator 1445 convolutes the adjusted $PDF_{CD}$ 1826 based on the CD profile data 1837 to generate a convoluted $PDF_{CD}$ 1841.

At process P1845, the feature-specific FR model generator 1445 determines the failure rates 1846 for the given feature 1450 based on the convoluted $PDF_{CD}$ 1841, e.g., using the failure rate equations such as eq. (4) and eq. (5) in processes P40 and P50 of FIG. 10.

Figure 19A:
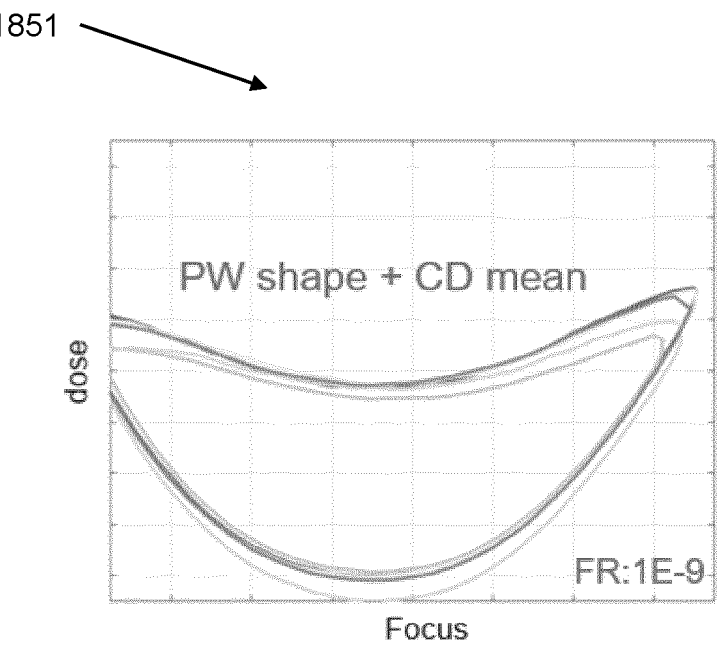
FIG. 19A illustrates a defect-based process window for a given feature, consistent with various embodiments.

At process P1850, the feature-specific FR model generator 1445 generates a defect-based process window 1851 for the given feature 1450 using the estimated failure rates 1846. For example, the process window can be a range of focus and dose values for which the estimated failure rate may be less than $10^{-9}$. FIG. 19A illustrates a defect-based process window 1851 for the given feature 1450, consistent with various embodiments. The feature-specific FR model generator 1445 generates a feature-specific FR model 1460 for the given feature 1450 and stores the feature-specific FR model 1460 in the database 1440. In some embodiments, the feature-specific FR model 1460 is a data structure that includes, among other data, the convoluted $PDF_{CD}$ 1841, CD limit 1831, estimated failure rates 1846 and the defect-based process window 1851 of the given feature 1450.

Figure 19B:
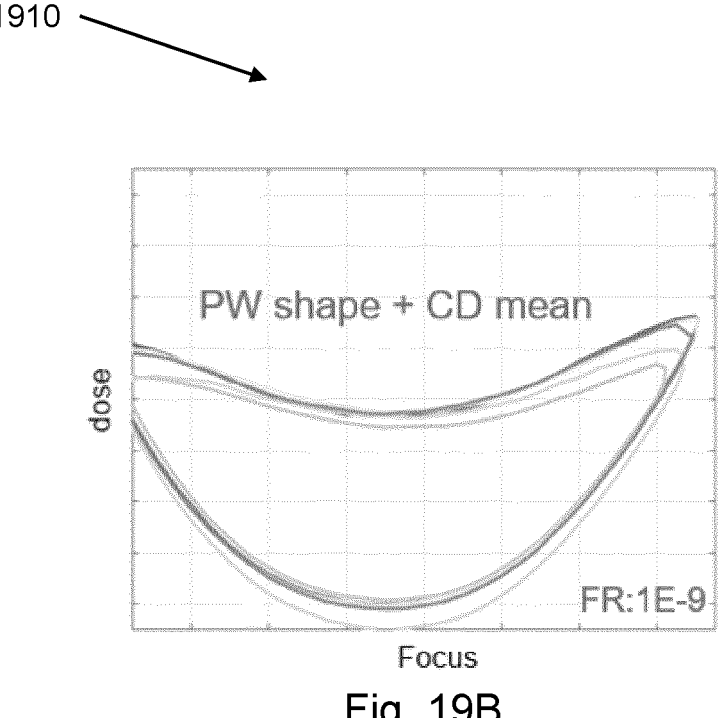
FIG. 19B illustrates a defect-based process window for a given feature group, consistent with various embodiments.

In some embodiments, the feature-specific FR model generator 1445 can determine failure rates and generate a defect-based process window for a given feature group, e.g., a group of features, in a way similar to the given feature 1450 described above. FIG. 19B illustrates a defect-based process window 1910 for a given feature group, consistent with various embodiments.

Figure 21:
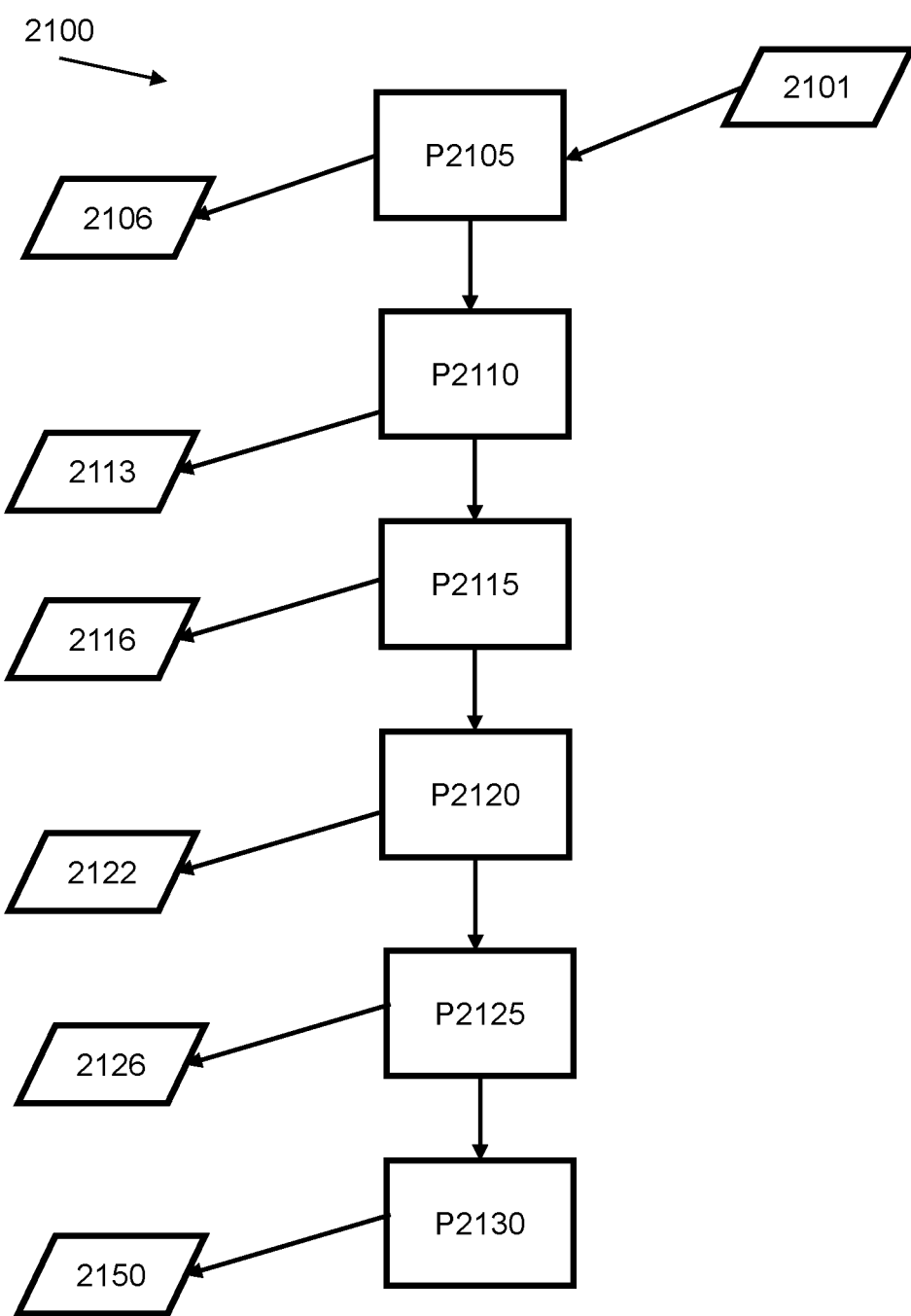
FIG. 21 is a flow diagram of an exemplary method for generating a base failure rate model for a feature group based on CDe data, consistent with various embodiments.
Figure 22:
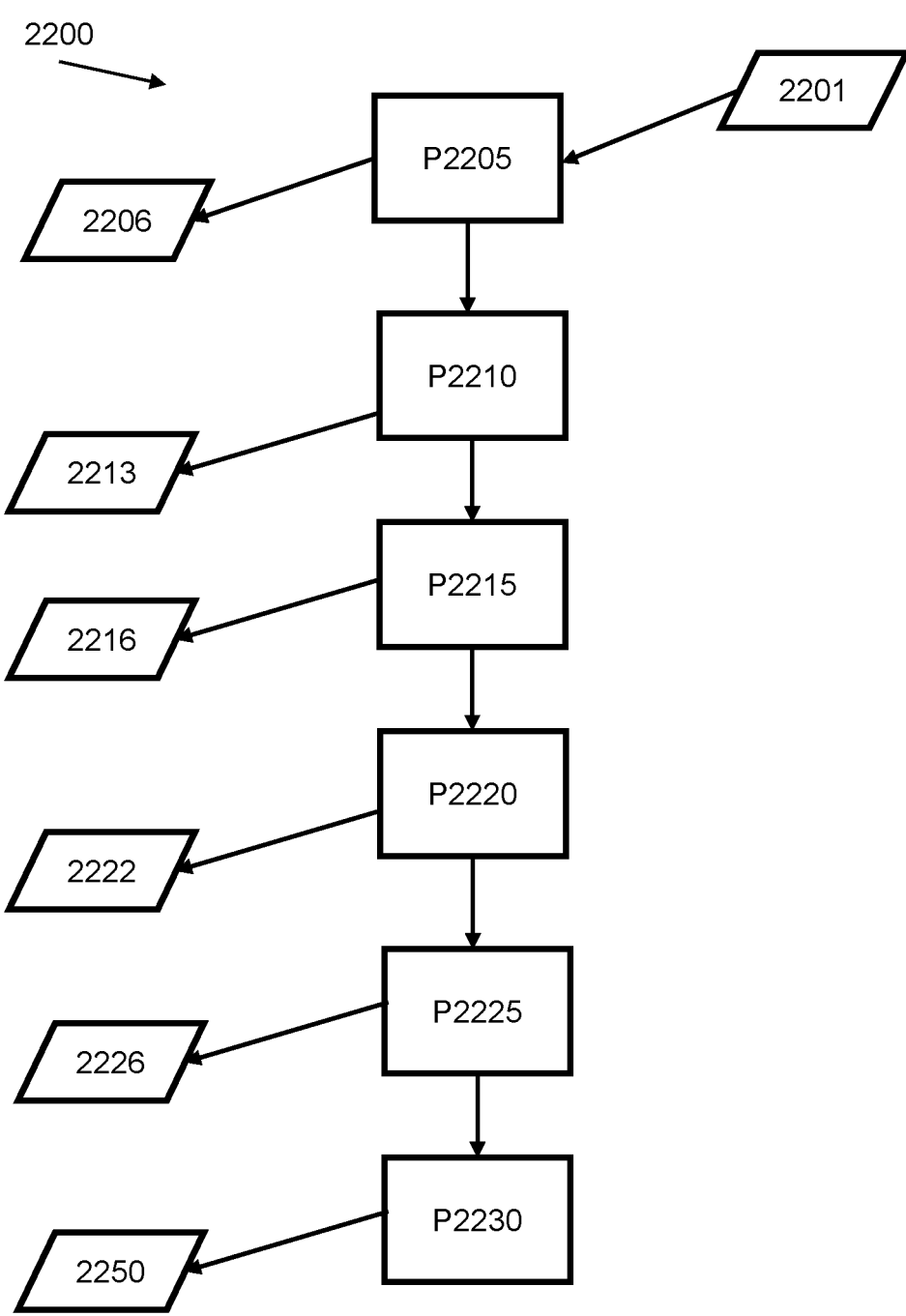
FIG. 22 is a flow diagram of an exemplary method for generating a base failure rate model for a feature group based on PEe data, consistent with various embodiments.

While failure rates can be predicted based on CD data as described in FIG. 17, in some embodiments, failure rates can also be predicted based on other characteristic parameters of the features, such as CDe parameter or PEe parameter. In some embodiments, a characteristic parameter of a feature can be derived from one or more measurement data, such as CD data, edge placement error (EPE) data, or placement error (PE) data. For example, a first characteristic parameter, such as CDe, can be derived from the CD data and the PE data. In another example, a second characteristic parameter, such as PEe, can be derived from target CD data and the PE data. FIG. 21 illustrates a flow diagram for estimating failure rates based on CDe data, and generating an EPE defect-based process window based on the CDe data. In another example, FIG. 22 illustrates a flow diagram for estimating failure rates based on PEe data, and generating a PE defect-based process window based on the PEe data.

Figure 20:
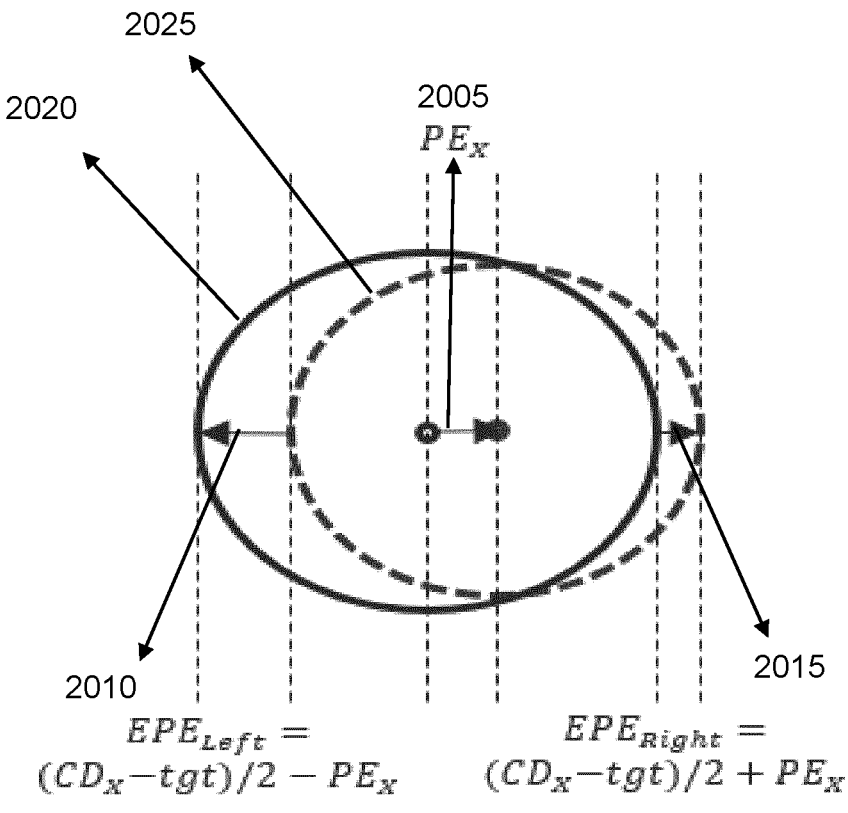
FIG. 20 illustrates an edge placement error of a target feature, consistent with various embodiments.

FIG. 20 illustrates an edge placement error of a target feature, consistent with various embodiments. In some embodiments, an EPE is the deviation of the printed edge of a target feature from the target edge of the target feature. The EPE can be in one or more directions, e.g., along x-axis or along y-axis. For example, FIG. 20 illustrates an $EPE_{left}$ 2010, which can be a deviation of the printed edge 2025 of a feature (e.g., a contact hole) from the target edge 2020 for the left side of a target feature along the x-axis, and an $EPE_{left}$ 2015, which can be a deviation of the printed edge 2025 from the target edge 2020 along the x-axis for the right side of the target feature. The EPEs can be obtained using the following equations:

$$EPE_{Left}=(CD_X-tgt_X)/2-PE_X \tag{9}$$

$$EPE_{Right}=(CD_X-tgt_X)/2+PE_X \tag{10}$$

where $CD_X$ is the CD of the printed feature along the x-direction, $tgt_X$ is the CD of the target feature along the x-direction, and $PE_X$ is the placement error 2005 of the contact hole center, which can be a deviation of a center of the printed contact hole from the center of the target contact hole. The EPE can be defined similarly for other feature types, and along other directions (e.g., $EPE_{up}$ and $EPE_{down}$ in the y-axis). The PE data can also be similarly determined in other directions (e.g., $PE_y$ in the y-axis)

FIG. 21 is a flow diagram of an exemplary method 2100 for generating a failure rate model for a feature group based on CDe data, consistent with various embodiments. In some embodiments, the method 2100 is similar to method 1700, but the method 2100 is based on CDe data instead of or in addition to the CD data of method 1700.

At process P2105, the base FR model generator 1430 obtains measurement data 2101 of the features within a feature group. In some embodiments, like the measurement data 1701, the measurement data 2101 may include mean CD, EPE, and PE data of all features within the feature group 1425, and the dose and focus values associated with the mean CD. The measurement data 2101 may then be used for CDU modelling, which determines a functional relationship 2106 between the parameter (e.g., mean CD) and the process variable (e.g., dose and focus values), for example, using eq. (1) as discussed in process P10 of FIGS. 10 and 11A.

A characteristic parameter may be defined as a function of placement error data, e.g., as a function of EPE or PE values in combination with CD values. The characteristic parameter can be used to construct a failure rate model based on probability distribution function of the characteristic parameter. Given a specified failure rate, the model is configured to calculate the limits of the characteristic parameter and then accordingly derive the corresponding process window. The characteristic parameter can be in any form or mathematical relation of CD, EPE and/or PE without departing from the scope of the present disclosure. Further, the characteristic parameter can be derived from any suitable type of measured data indicative of placement errors of the features.

In some embodiments, the measurement data 2101 may be used to obtain a derived parameter, CDe, of the features. The CDe parameter can be derived from the CD value and the PE value of the features. For example, the CDe can be determined using the following equations:

$$CDe_{Left}=CD_X-2*PE_X \tag{11}$$

$$CDe_{Right}=CD_X+2*PE_X \tag{12}$$

The parameters $CDe_{Left}$ and $CDe_{Right}$ are derived from the equations for the EPE (e.g., equations 9 and 10):

$$CD_X-2*PE_X=tgt+2*EPE_{Left}$$

$$CD_X+2*PE_X=tgt+2*EPE_{Right}$$

The measurement data 2101 may then be used for CDeU modelling, which determines a functional relationship 2106 between the derived parameter (e.g., CDe or EPE) and the process variables (e.g., dose and focus), for example, using eq. (1) as discussed in process P10 of FIGS. 10 and 11A.

At process P2110, the base FR model generator 1430 performs LCDU modelling to obtain LCDU data 2113 (e.g., by using the similar process as obtaining the LCDU data 1713 of process P1710) for the feature group 1425, as described at least with reference to process P1710 of FIG. 17.

In some embodiments, the process P2110 performs LCDeU modelling to obtain LCDeU data 2113 for the feature group 1425 based on the CDe data. The LCDeU modelling can be performed in addition to or instead of LCDU modelling.

At process P2115, the base FR model generator 1430 determines a $PDF_{CDe}$ 2116 of the feature group 1425 (e.g., as described at least with reference to $PDF_{CD}$ 1716 in process P1715). The $PDF_{CDe}$ 2116, which is a function of the CDe of all the features, a dose value and a variance of the dose value of the patterning process, may be determined and/or obtained based on the LCDeU data 2113, and the functional relationship 2106 (e.g., as described at least with reference to process P30 of FIG. 10 and using eq. (3) in process P30).

At process P2120, the base FR model generator 1430 performs CDe limit modelling, which determines a CDe limit 2122 for the feature group 1425 (e.g., as described at least with reference to $CD_e$ limit 1722 in process P1720). In some embodiments, a CDe limit can be a common theoretical limit of CDe value of a feature at which less than a predetermined number or percentage of features fail per setting of the process variable (e.g., per focus and dose value). In some embodiments, the CDe limit 2122 may be computed based on measured failure rates per setting of the process variable and the $PDF_{CDe}$ 2116, e.g., using eq. (4) described with reference to P50 of FIG. 10. In some embodiments, a pair of CDe limits may be determined, where a first CDe limit is at a lower end of PDF distribution curve and a second CDe limit is at higher end of the PDF distribution curve such that a CDe value between these CDe limits (e.g., CDe value is greater than first CDe limit and lesser than second CDe limit) will keep the failure rates per setting of the process variable (e.g., per focus and dose value) within the predetermined failure rate.

At process P2125, the base FR model generator 1430 determines estimated failure rates 2126 of the features in the feature group 1425 based on the CDe limit 2122 and the $PDF_{CDe}$ 2116 for various focus or dose values (e.g., as described at least with reference to estimated failure rates 2126 in process P1725). After the CDe limit 2122 is determined, the failure rate equations such as eq. (4) and eq. (5) in processes P40 and P50 of FIG. 10 may be used to estimate failure rates 2126 for any focus and dose values. Additional details with respect to estimating the failure rates are described at least with reference to process P60 of FIG. 10 and FIGS. 11D and 11E.

At process P2130, the base FR model generator 1430 generates an EPE defect-based process window 2150 for the feature group 1425 using the estimated failure rates 2126. For example, the process window can be a range of focus and dose values for which the estimated failure rate may be less than $10^{-4}$. In some embodiments, more than one EPE defect-based process windows may be generated (e.g., $EPE_{left}$ process window, $EPE_{right}$ process window, $EPE_{up}$ process window and $EPE_{down}$ process window).

FIG. 22 is a flow diagram of an exemplary method 2200 for generating a failure rate model for a feature group based on PEe data, consistent with various embodiments. In some embodiments, the method 2200 is similar to method 1700, but the method 2200 is based on the PEe data instead of or in addition to the CD data of method 1700.

At process P2205, the base FR model generator 1430 obtains measurement data 2201 of the features within a feature group. In some embodiments, like the measurement data 1701, the measurement data 2201 may include mean CD, EPE and PE data of all features within the feature group 1425, and the dose and focus values associated with the mean CD. The measurement data 2201 may then be used for CDU modelling, which determines a functional relationship 2206 between the parameter (e.g., mean CD) and the process variable (e.g., dose and focus values), for example, using eq. (1) as discussed in process P10 of FIGS. 10 and 11A.

In some embodiments, the measurement data 2201 may be used to obtain a derived parameter, PEe, of the features. The PEe parameter can be derived from a target CD value and a PE value of the features. For example, the PEe parameter can be determined using the following equations:

$$PEe_{Left}=tgt_X-2*PE_X \tag{13}$$

$$PEe_{Right}=tgt_X+2*PE_X \tag{14}$$

The measurement data 2201 may then be used for CDU modelling, which determines a functional relationship 2206 between the calculated parameter (e.g., CD) and the process variable (e.g., dose and focus values) may be established, for example, using eq. (1) as discussed in process P10 of FIGS. 10 and 11A.

At process P2210, the base FR model generator 1430 performs LCDU modelling to obtain LCDU data 2213 (e.g., like the LCDU data 1713 of process P1710) for the feature group 1425, as described at least with reference to process P1710 of FIG. 17.

At process P2215, the base FR model generator 1430 determines a $PDF_{PEe}$ 2216 of the feature group 1425 (e.g., as described at least with reference to $PDF_{CD}$ 1716 in process P1715). The $PDF_{PEe}$ 2216, which is a function of the PEe of all the features, a dose value and a variance of the dose value of the patterning process, may be determined and/or obtained based on the LCDU data 2213, and the functional relationship 2206 (e.g., as described at least with reference to process P30 of FIG. 10 and using eq. (3) in process P30).

At process P2220, the base FR model generator 1430 performs PEe limit modelling, which determines a PEe limit 2222 for the feature group 1425 (e.g., as described at least with reference to CD limit 1722 in process P1720). In some embodiments, a PEe limit can be a common theoretical limit of PEe value of a feature at which less than a predetermined number or percentage of features fail per setting of the process variable (e.g., per focus and dose value). In some embodiments, the PEe limit 2222 may be computed based on measured failure rates per setting of the process variable and the $\mathrm{PDF}_{PEe}$ 2216, e.g., using eq. (4) described with reference to P50 of FIG. 10. In some embodiments, a pair of PEe limits may be determined, where a first PEe limit is at a lower end of PDF distribution curve and a second PEe limit is at higher end of the PDF distribution curve such that a PEe value between these PEe limits (e.g., PEe value is greater than first PEe limit and lesser than second PEe limit) will keep the failure rates per setting of the process variable (e.g., per focus and dose value) within the predetermined failure rate.

At process P2225, the base FR model generator 1430 determines estimated failure rates 2226 of the features in the feature group 1425 based on the PEe limit 2222 and the $\mathrm{PDF}_{PEe}$ 2216 for various focus or dose values (e.g., as described at least with reference to estimated failure rates 2226 in process P1725). After the PEe limit 2222 is determined, the failure rate equations such as eq. (4) and eq. (5) in processes P40 and P50 of FIG. 10 may be used to estimate failure rates 2226 for any focus and dose values. Additional details with respect to estimating the failure rates are described at least with reference to process P60 of FIG. 10 and FIGS. 11D and 11E.

At process P2230, the base FR model generator 1430 generates a PEe defect-based process window 2250 for the feature group 1425 using the estimated failure rates 2226. For example, the process window can be a range of focus and dose values for which the estimated failure rate may be less than $10^{-4}$.

While the methods 2100 and 2200 are described as generating process windows for features within a feature group, these methods may also be used, in some embodiments, for generating the process windows for a plurality of features without any grouping (e.g., without feature clustering).

Figure 23:
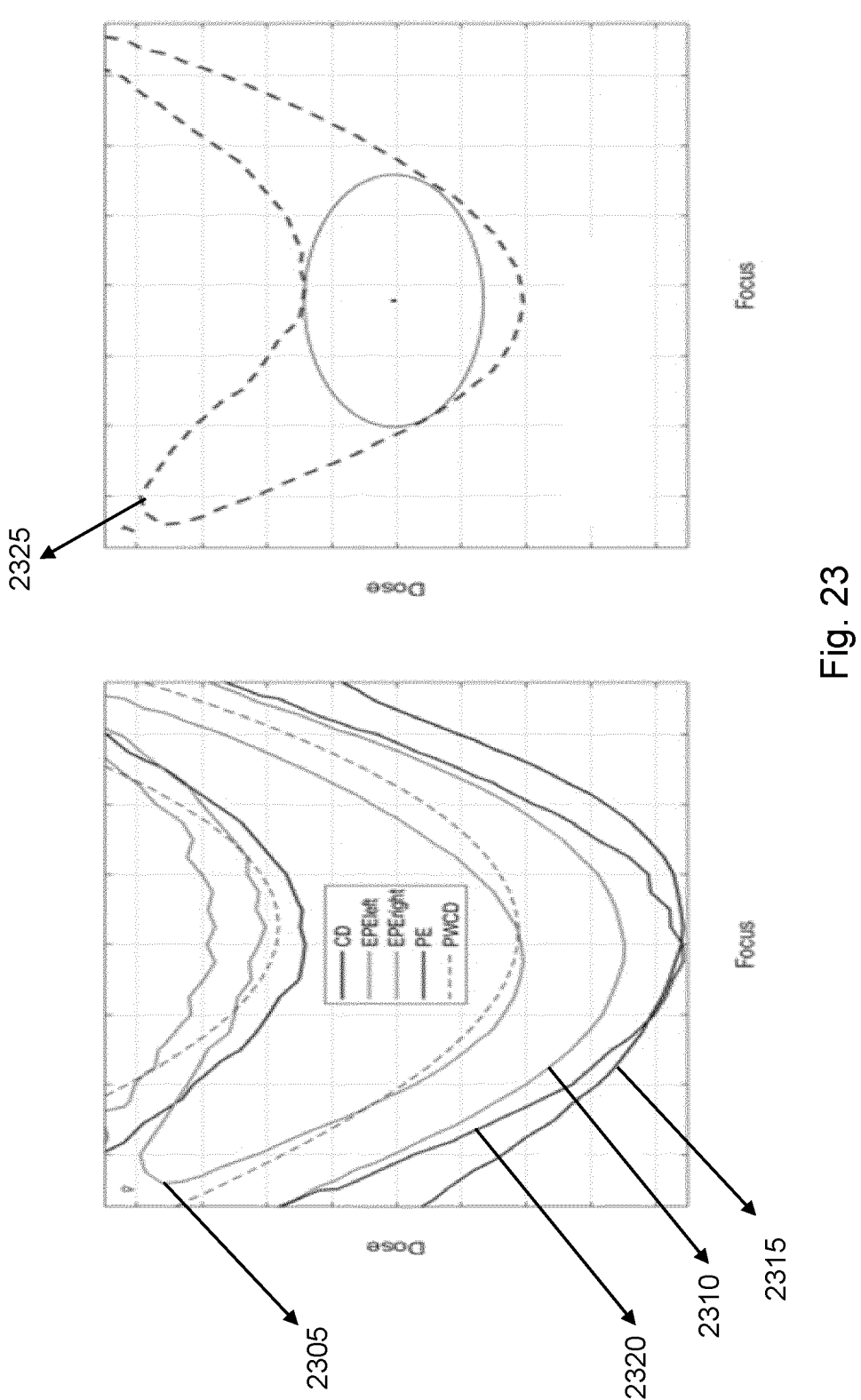
FIG. 23 illustrates various failure rate process windows, consistent with various embodiments.

FIG. 23 illustrates various failure rate process windows, consistent with various embodiments. For example, a first FR process window 2315 is a defect-based process window, such as the defect-based process window 1650, generated based on the CD data. A second FR process window 2305 is an $\mathrm{EPE}_{left}$ defect-based process window, such as the defect-based process window 2150, generated based on the CDe data. A third FR process window 2310 is an $\mathrm{EPE}_{Right}$ defect-based process window, such as the defect-based process window 2150, generated based on the CDe data. A fourth FR process window 2320 is a PEe defect-based process window, such as the defect-based process window 2250, generated based on the PEe data. In some embodiments, multiple FR process windows can be combined (e.g., using any of a number of process window combining methods) to generate a combined FR process window 2325.

In some embodiments, the above methods may be used to optimize (e.g., determine or adjust) "design variables," which includes a set of parameters of a patterning process (e.g., of a lithographic process, a lithographic projection apparatus, etc.), that a user of a lithographic projection apparatus can adjust, or other adjustable parameters such as adjustable parameters of the illumination mode, the patterning device pattern, the projection optics, dose, focus, etc. The above methods can be used in optimizing the design variables such that the failure rates of the features to be printed on the substrate is minimized or within a desired failure rate threshold. Below are some example applications of the above methods.

Example applications of the above methods, such as resist de-scumming, or other post patterning process or resist-type optimization, Source Mask Optimization (SMO), Optical proximity correction (OPC) calibration, can be found in PCT patent application publication no. WO/2019/121486, which is hereby incorporated by reference in its entirety.

Figure 24:
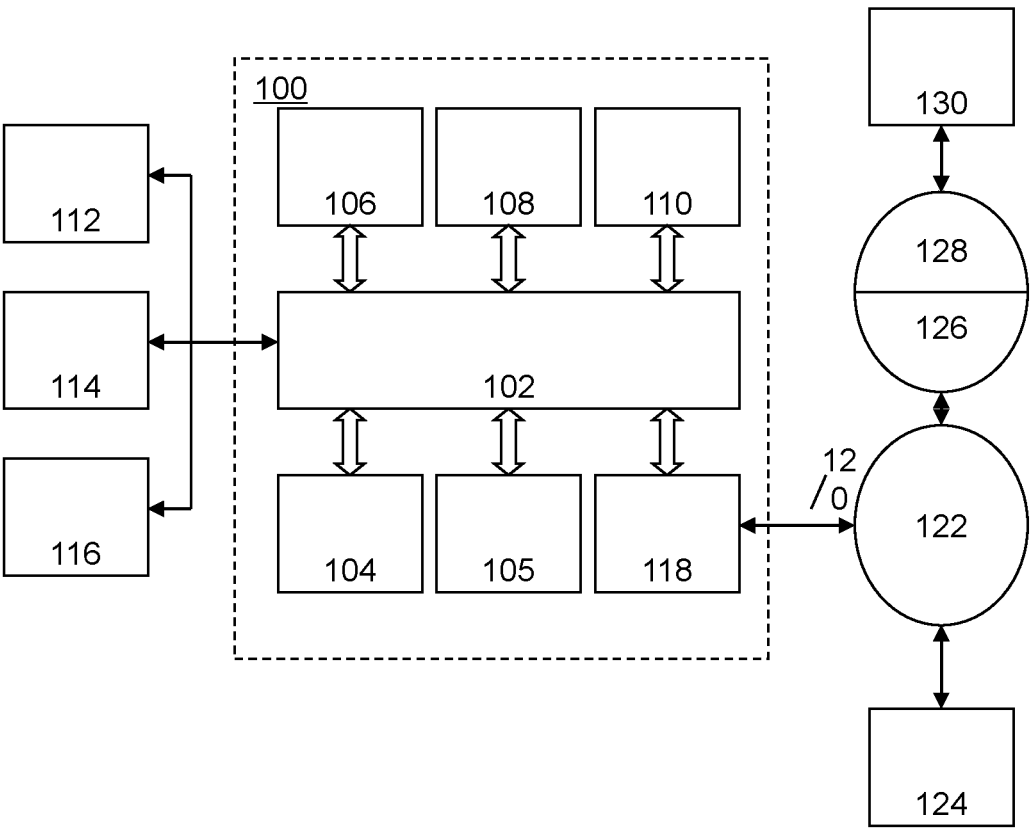
FIG. 24 is a block diagram of an example computer system, according to an embodiment.

FIG. 24 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also desirably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

The present disclosure describes a method for ranking features printed on a substate (e.g., features in random logic structures). The features may be ranked based on one or more metrics (e.g., process window metrics). After the features are ranked, features having metrics satisfying a threshold (e.g., below a threshold) may be identified as critical features. The feature groups (e.g., generated as described above at least with reference to FIGS. 14 and 15) may be analyzed to identify those of the feature groups having a critical feature, and a base FR model may be generated (e.g., as described above at least with reference to FIGS. 14, 15 and 17) for the identified feature groups or a feature-specific FR model may be generated (e.g., as described above at least with reference to FIGS. 14 and 18) for the critical feature.

Figure 25:
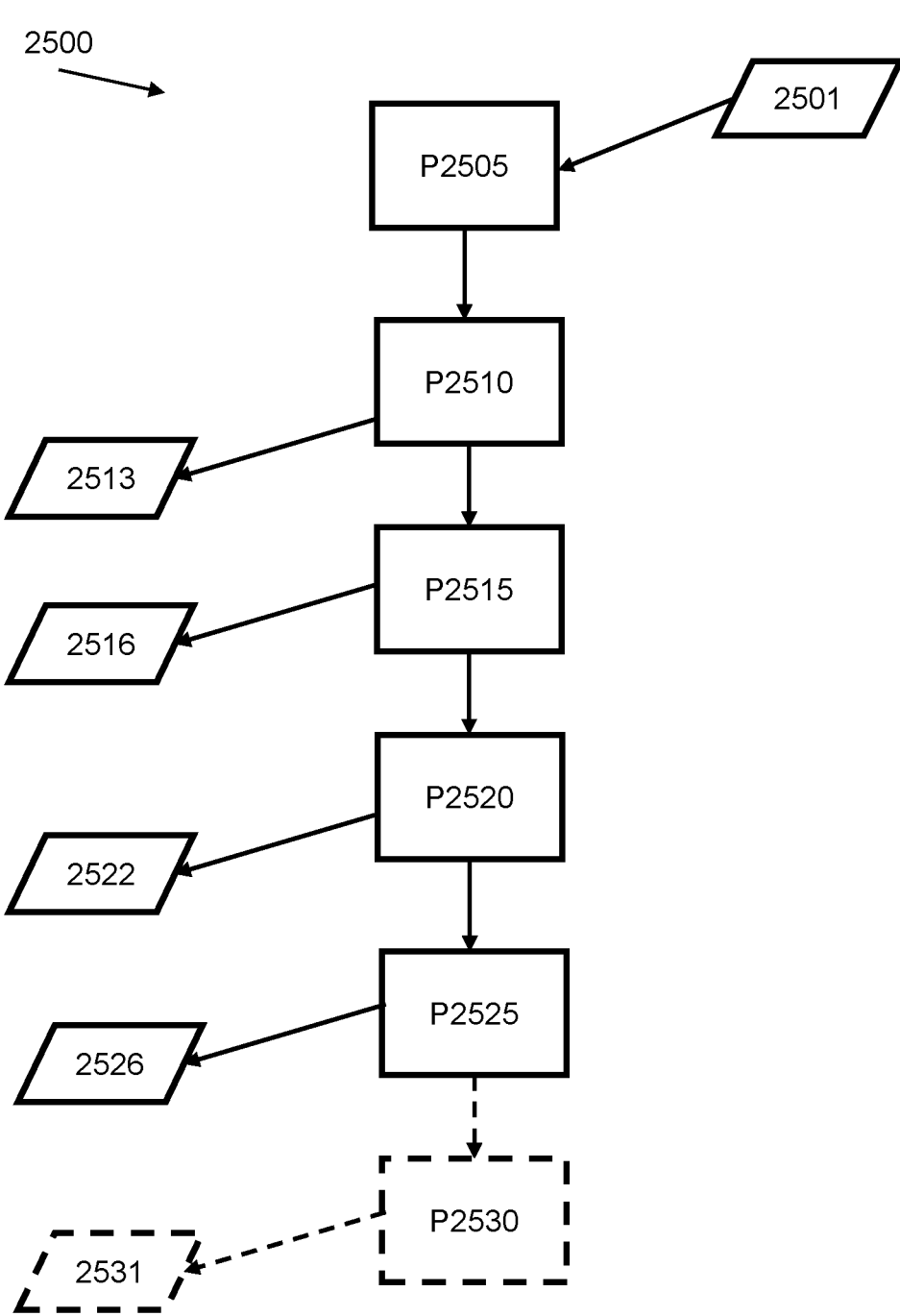
FIG. 25 is a flow diagram of a process for ranking features, in accordance with one or more embodiments.

FIG. 25 is a flow diagram of a process 2500 for ranking features, in accordance with one or more embodiments. In an operation P2505, measurement data 2501 may be obtained for a number of features printed on a substrate. In some embodiments, the features are obtained by analysing SEM images, such as SEM images 1405, of the substrate. In some embodiments, a SEM image is an image of the substrate which is captured using a tool such as a SEM. The SEM images 1405 may be used to obtain various measurement data associated with the features (e.g., using measurement methods as described at least with reference to FIG. 1). The measurement data 2501 may include measurements of one or more characteristic parameters of the features for various process variables (e.g., dose, focus, etc.). For example, the measurement data 1701 may include CD data, defect count, failure rate, edge placement error (EPE), placement error (PE), etc.) of the features for various dose and focus values. In some embodiments, the measurement data 2501 may also include modelled data such as modelled CD data, modelled failure rate data, obtained using simulation models (e.g., CDU modelling, LCDU modelling, CD limit modelling, CDeU modelling, failure rate modelling, etc. at least some of which are described above). In some embodiments, the measurement data 2501 may include the measurement data 1701 of FIG. 17, which is used for determining a base FR model for a feature group.

In an operation P2510, process window data 2513 is obtained for the features using the measurement data 2501. The process window data 2513 may include one or more process windows for each of the features. As discussed above, a process window of a feature is indicative of a set of focus and dose values for which a characteristic parameter of the corresponding feature is within specification. For example, a CD process window for a feature may be a set of dose or focus values for which a deviation of a CD of the feature from a target CD value is within a desired threshold. In another example, a defect free (DF) process window may be a set of dose or focus values for which a measured defects count for the feature is zero. In yet another example, a failure rate (FR) process window (e.g., generated as described at least with reference to FIG. 14, 15, 17 or 18) may be a set of dose or focus values for which a failure rate of the feature is within a desired threshold. In still another example, an EPE process window (e.g., generated as described at least with reference to FIG. 21) may be a set of dose or focus values for which a failure rate determined based on the EPE of the feature is within a desired threshold. In still another example, a PE process window (e.g., generated as described at least with reference to FIG. 22) may be a set of dose or focus values for which a failure rate determined based on the PE of the feature is within a desired threshold.

Figure 26A:
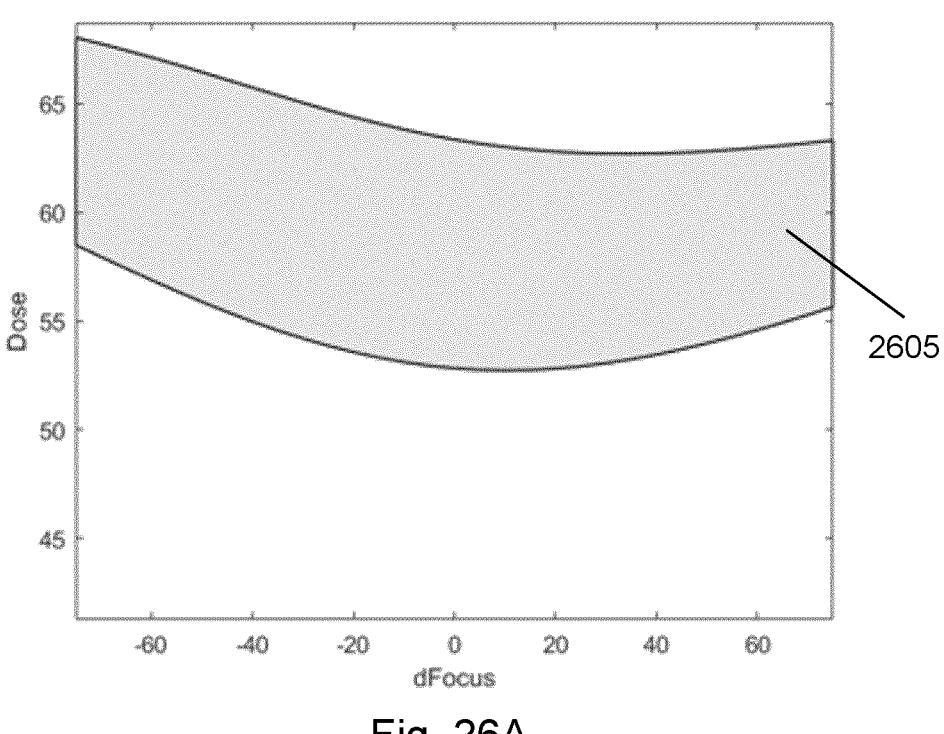
FIG. 26A shows an example CD process window for a feature, in accordance with one or more embodiments.
Figure 26B:
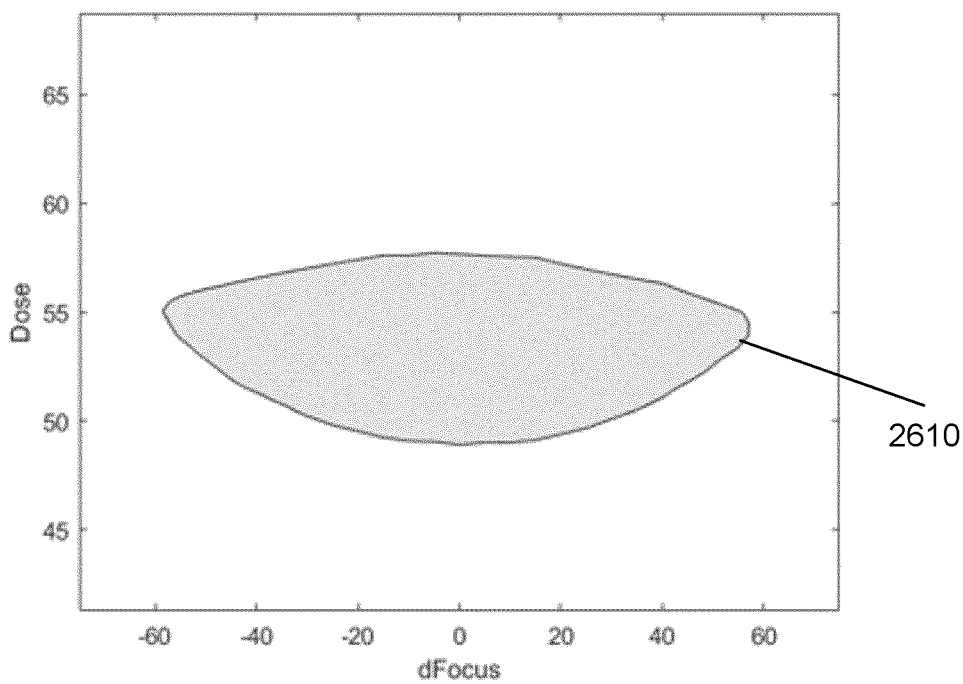
FIG. 26B shows an example failure rate (FR) process window for a feature, in accordance with one or more embodiments.

The process window can be plotted as a graph with the focus and dose values as x and y axes, respectively, which results in forming a shape. The shape of the process window includes a boundary, or an edge, and different portions of the edge may correspond to different focus and dose values. The process window of a feature may be generated using any of a number of methods. FIG. 26A shows an example CD process window 2605 for a feature, in accordance with one or more embodiments. FIG. 26B shows an example FR process window 2610 for a feature, in accordance with one or more embodiments. While the figures illustrate a CD process window and FR process window, various other process windows may be generated (e.g., EPE process window, PE process window, etc.)

Figure 27:
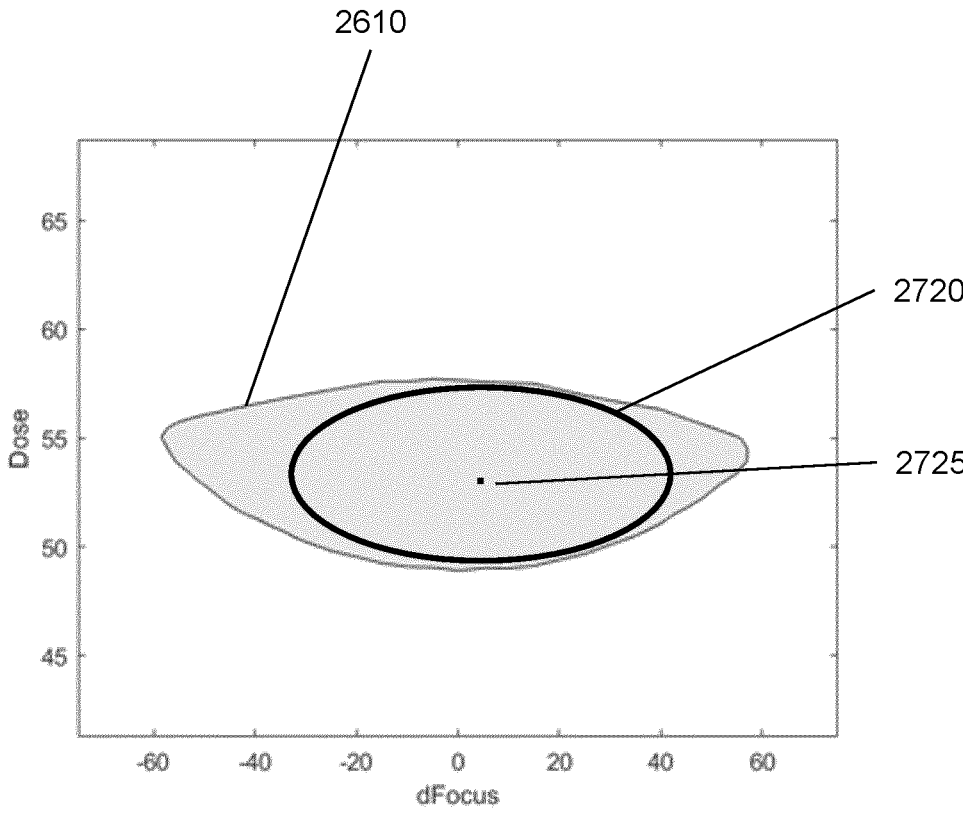
FIG. 27 illustrates an ellipse fit in a FR process window of FIG. 26B, in accordance with one or more embodiments.

In an operation P2515, process window metrics 2516 are obtained for each of the features using the process window data 2513. In some embodiments, the process window metrics 2516 are representative of a characteristic (e.g., size) of a process window. In some embodiments, a process window may be characterized by performing a shape fitting operation, which fits a shape (e.g., an ellipse, rectangle or other shape) in the process window to determine (e.g., quantify) the characteristics of the process window. The process window metrics 2516 may be determined based on the properties of the shape. The process window metrics 2516 may include an exposure latitude, a depth of focus, or an area of a shape. For example, a process window may be characterized using an ellipse as illustrated in FIG. 27. FIG. 27 illustrates an ellipse fit in a FR process window of FIG. 26B, in accordance with one or more embodiments. The ellipse 2720 may be fit into the FR process window 2610 using any of a number of ellipse fitting algorithms. The ellipse 2720 may be fit based on a constraint. For example, the ellipse 2720 may be fit to obtain a maximum area ellipse. In another example, the ellipse 2720 may be fit such that a centre 2725 of the ellipse 2720 is at a specified location in the graph (e.g., at a specified dose or focus value). In another example, the ellipse 2720 may be fit to obtain a specified exposure latitude.

After fitting ellipse in the FR process window 2610, the process window metrics 2516 may be determined as follows. The exposure latitude may be determined as a function of a height of the ellipse 2720 and a dose value corresponding to the centre 2725 of the ellipse 2720. For example, the equation for obtaining the exposure latitude (EL) using an ellipse fit may be represented as follows:

$$EL(\%) = \frac{\text{Ellipse Height}}{\text{Center Dose}} \times 100\% \qquad (15)$$

The ellipse height is a range of dose values to which the ellipse 2720 extends. The depth of focus metric may correspond to the width of the ellipse 2720, which is a range of focus values to which the ellipse 2720 extends. The area metric is the area of the ellipse 2720, which is determined as a function of the height and width of the ellipse 2720.

Figure 28A:
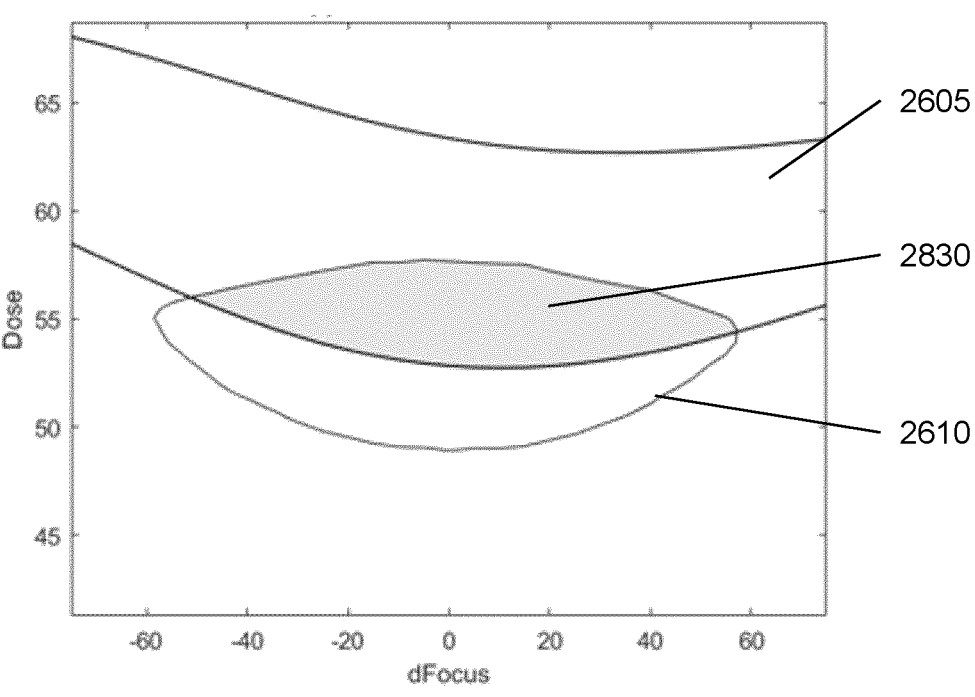
FIG. 28A illustrates an overlap operation to overlap two process windows, in accordance with one or more embodiments.
Figure 28B:
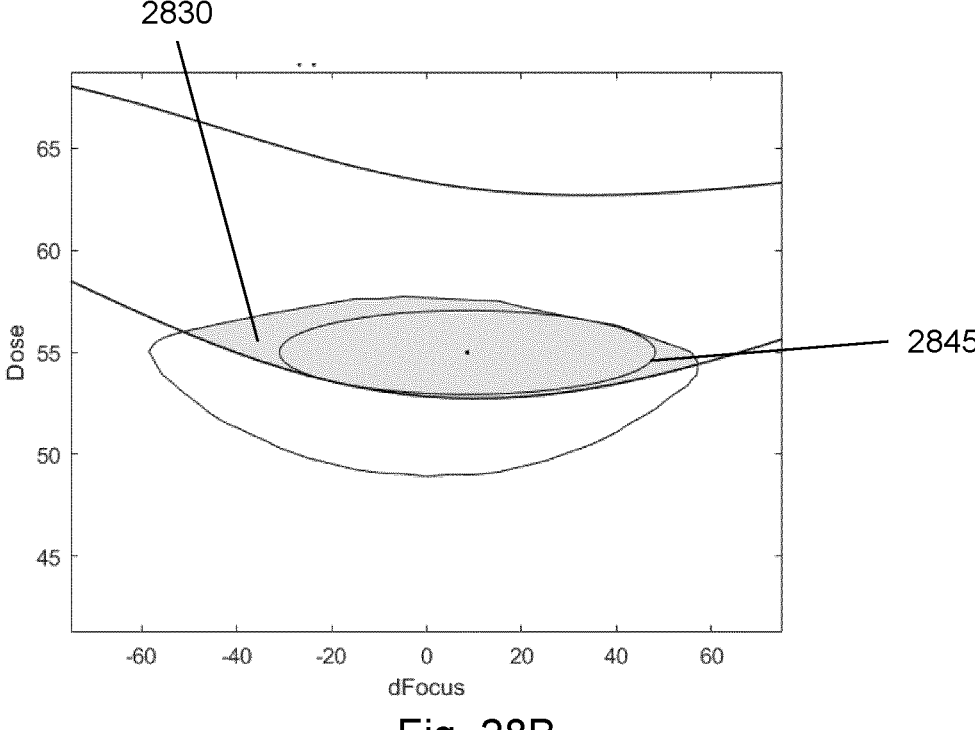
FIG. 28B illustrates an ellipse fit in an overlapped process window of FIG. 28A, in accordance with one or more embodiments.

While the process window metrics 2516 may obtained by fitting a shape in an individual process window, such as the FR process window 2610, the process window metrics 2516 may also be obtained from overlapped process windows as illustrated in FIGS. 28A and 28B. FIG. 28A illustrates an overlap operation to overlap two process windows, in accordance with one or more embodiments. An overlap operation overlaps one process window with another to obtain an overlapped process window, which is an intersection of two process windows. For example, as illustrated in FIG. 28A, the CD process window 2605 is overlapped with the FR process window 2610 to generate an overlapped process window 2830. FIG. 28B illustrates an ellipse fit in an overlapped process window of FIG. 28A, in accordance with one or more embodiments. The ellipse 2845 may be fit into the overlapped process window 2830 and the process window metrics 2516 may be determined using the ellipse 2845 (e.g., as described with reference to ellipse 2720 in FIG. 27).

Note that while FIGS. 28A and 28B illustrate fitting an ellipse in an overlapped process window obtained by overlapping two separate process windows of a feature, the overlapped process window may be obtained by overlapping more than two process windows of the feature.

Further, note that while the foregoing paragraphs describe fitting a shape such as an ellipse to characterize the process window, other shapes (e.g., a rectangle) may also be fit into the process window to characterize the process window using a shape fitting algorithm. Other process window characterization methods may also be used in addition to or instead of shape fitting algorithms to obtain the process window metrics 2516. The operation P2515 is performed to obtain the process window metrics 2516 for each of the features.

In an operation P2520, the features are ranked based on the process window metrics 2516 to generate a ranked list of features 2522. The features may be ranked based on an exposure latitude, a depth of focus, an area of the shape, or other such process window metrics. In some embodiments, the lesser the value of the process window metrics 2516 the more critical is the feature.

In an operation P2525, critical features 2526 are identified based on the ranking. The features having process window metrics 2516 that satisfy a specified threshold (e.g., user defined) are identified as critical features 2526. For example, a feature may be identified as a critical feature based on an exposure latitude of the feature being less than a threshold exposure latitude. In another example, a feature may be identified as a critical feature based on an exposure latitude and a depth of focus of the feature being less than a threshold exposure latitude and a threshold depth of focus, respectively.

The information regarding the critical features 2526 may be used in the process of generating a base FR model for a feature group that contains a critical feature. For example, in an operation P2530, information regarding the critical features 2526 may be input to the base FR model generator 1430 of FIG. 14 to identify a feature group that contains a critical feature, and generate a base FR model 2531 for the identified feature group. In some embodiments, the base FR model generator 1430 may use the information regarding the critical features 2526 for other analyses (e.g., analysing grouping coverage of the critical features 2526).

In some embodiments, after the base FR model generator 1430 generates the base FR models for various feature groups, the feature groups may also be ranked based on the process window metrics 2516 obtained using the FR process windows generated by the base FR model generator 1430 for the feature groups.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multilayer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

Embodiments of the present disclosure can be further described by the following clauses.

1. A non-transitory computer-readable medium having instructions that, when executed by a computer, cause the computer to execute a method for determining process windows of a patterning process, the method comprising:
   obtaining measurement data of a plurality of features printed on a substrate;
   grouping, based on a metric, the plurality of features into a plurality of groups; and generating, based on the measurement data associated with a group of features, a base failure rate model for the group of features, wherein the base failure rate model is configured to identify a process window related to a failure rate of the group of features.

2. The computer-readable medium of clause 1, wherein the metric includes: (a) a process window of each feature of the features, wherein the process window is a function of process variables associated with the corresponding feature, and (b) a characteristic parameter associated with the corresponding feature.

3. The computer-readable medium of clause 2, wherein the process variables include a focus and dose value associated with an apparatus used for the patterning process, and wherein the characteristic parameter includes a critical dimension (CD) value of the corresponding feature.

4. The computer-readable medium of clause 3, wherein grouping the features includes:

for each feature of the features, obtaining as a metric value a mean CD value of the corresponding feature and a plurality of dose values and focus values associated with the mean CD at an edge of a process window of the corresponding feature, and clustering the features into the groups of features based on the metric values for the features, wherein features within a specific group have metric values within a first threshold.

5. The computer-readable medium of any of clauses 1-4, wherein clustering the features includes:

clustering the features using k-means algorithm.

6. The computer-readable medium of clause 5, wherein obtaining the measurement data of the plurality of features includes:

obtaining images having the features printed on the substrate, and analyzing the images to select those of the features that satisfy a specified criterion as the plurality of features.

7. The computer-readable medium of clause 6, wherein the specified criterion includes a number of occurrences of a feature on the substrate being below a first threshold or a number of occurrences of the feature in an image of the images being below a second threshold.

8. The computer-readable medium of clause 6, wherein generating the base failure rate model for the group of features includes:

obtaining mean CD of the group of features;

determining local CD uniformity (LCDU) data of the group of features as the measurement data associated with the group of features;

obtaining, based on the LCDU data, (i) a probability density function of CD of the group of features defined as a function of the mean CD, a dose value and a variance of the dose value of the patterning process, and (ii) a CD limit of the patterning process based on failure rate measurements of features in the group of features;

determining an estimated failure rate of the group of features based on the CD limit and the probability density function of the CD; and generating the base failure rate model, which identifies the process window related to the dose value such that the estimated failure rate of the group of features is less than a predetermined threshold.

9. The computer-readable medium of clause 8, wherein determining the LCDU data of the group of features includes:

determining the LCDU data of the group by:

obtaining the LCDU data of each feature in the group across the plurality of images;

obtaining CD mean of each feature for each image of the plurality of images; and removing the CD mean from the LCDU data.

10. The computer-readable medium of clause 8, wherein obtaining the probability density function of the CD of the group of features includes:

determining the probability density function of a dose for the dose value based on a variance of the dose value; and converting the probability density function of the dose to the probability density function of the CD based on a conversion function, wherein the conversion function is determined based on the function of the dose.

11. The computer-readable medium of clause 1, wherein the failure rate is related to one or more failures of a feature, the one or more failure including a physical failure, a transfer failure, and/or postponed failure of the feature.

12. The computer-readable medium of clause 8 further comprising:

storing the base failure rate model in a database, wherein the database includes a plurality of base failure rate models in which each base failure rate model corresponds to a group of features with a specified metric value.

13. The computer-readable medium of clause 12 further comprising:

using the base failure rate model and characteristic data of the specific feature to generate a feature-specific failure rate model for a specific feature wherein the feature-specific failure rate model identifies a feature-specific process window such that an estimated failure rate of the specific feature is below a specified threshold.

14. The computer-readable medium of clause 12 further comprising:

generating, using the base failure rate model, a feature group-specific failure rate model for a specified group of features, wherein the feature group-specific failure rate model identifies a feature group-specific process window such that an estimated failure rate of the specified group of features is below a specified threshold.

15. The computer-readable medium of clause 13, wherein generating the feature-specific failure rate model includes:

receiving measurement data associated with the specific feature, wherein the measurement data includes CD value of the specific feature for a plurality of dose and focus values;

determining a specified metric value from the measurement data, wherein the specified metric value is determined as a function of a specified mean CD value and a plurality of dose values and focus values associated with the specified mean CD value at an edge of a process window associated with the specific feature; and selecting, from the database, a specified base failure rate model whose metric value matches the specified metric value.

16. The computer-readable medium of clause 15 further comprising:
    obtaining a base probability density function of CD from the specified base failure rate model; and
    adjusting a mean CD of the base probability density function based on the specified mean CD value to generate an adjusted probability density function.

17. The computer-readable medium of clause 16 further comprising:
    determining at least one of a first CD limit or a second CD limit of the patterning process using the adjusted probability density function, wherein the estimated failure rate of the specified feature is within the specified threshold if a CD of the specified feature is above the first CD limit or below the second CD limit.

18. The computer-readable medium of clause 17 further comprising:
    obtaining at least one of an interfield CD variation, intrafield CD variation, a probability density function of CD of the specific feature as CD profile data; and
    convoluting the adjusted probability density function with the CD profile data to generate a convoluted probability density function associated with the specific feature.

19. The computer-readable medium of clause 18 further comprising:
    determining the estimated failure rate of the specific feature based on the first CD limit, the second CD limit and the convoluted probability density function; and
    generating the feature-specific failure rate model configured to identify the feature-specific process window.

20. The computer-readable medium of clause 19 further comprising:
    adjusting of one or more apparatuses of the patterning process based on the process window related to the specified feature to minimize a failure rate associated with the specified feature.

21. The computer-readable medium of clause 6, wherein generating the base failure rate model for the group of features includes:
    obtaining a CDe parameter of the group of features,
    determining local CDe uniformity (LCDeU) data of the group of features as the measurement data associated with the group of features,
    obtaining, based on the LCDeU data, (i) a probability density function of CDe of the group of features defined as a function of the CDe parameter, a dose value and a variance of the dose value of the patterning process, and (ii) a CDe limit of the patterning process based on failure rate measurements of features in the group of features,
    determining an estimated failure rate of the group of features based on the CDe limit and the probability density function of the CDe, and
    generating the base failure rate model, which identifies the process window related to the dose value such that the estimated failure rate of the group of features is less than a predetermined threshold.

22. The computer-readable medium of clause 21, wherein determining the LCDeU data of the group of features includes:
    determining the LCDeU data of the group by:

obtaining the LCDeU data of each feature in the group across the plurality of images,
    obtaining CDe mean of each feature for each image of the plurality of images, and
    removing the CDe mean from the LCDeU data.

23. The computer-readable medium of clause 21, wherein obtaining the CDe parameter includes:
    determining the CDe parameter based on an edge placement error associated with a feature of the group of features.

24. The computer-readable medium of clause 23, wherein the edge placement error is determined based on a CD of the feature, a CD of a target feature corresponding to the feature, and a placement error of the feature.

25. The computer-readable medium of clause 24, wherein the feature is a contact hole, and wherein the placement error is a deviation of a center of the contact hole printed on a substrate from a center of a target contact hole.

26. The computer-readable medium of clause 6, wherein generating the base failure rate model for the group of features includes:
    obtaining a mean CD and a PEe parameter of the group of features,
    determining LCDU data of the group of features as the measurement data associated with the group of features, the LCDU determined based on the mean CD,
    obtaining, based on the LCDU data, (i) a probability density function of PEe of the group of features defined as a function of the PEe parameter, a dose value and a variance of the dose value of the patterning process, and (ii) a PEe limit of the patterning process based on failure rate measurements of features in the group of features,
    determining an estimated failure rate of the group of features based on the PEe limit and the probability density function of the PEe, and
    generating the base failure rate model, which identifies the process window related to the dose value such that the estimated failure rate of the group of features is less than a predetermined threshold.

27. The computer-readable medium of clause 26, wherein obtaining the PEe parameter includes:
    determining the PEe parameter based on a CD of a target feature corresponding to a feature of the group of features and a placement error of the feature.

28. The computer-readable medium of clause 1, wherein obtaining the measurement data includes:
    obtaining a first set of process windows of the features, wherein the first set of process windows is representative of a first characteristic parameter of the features for a first set of dose and focus values, wherein the first set of process windows includes a first process window of a first feature of the features;
    obtaining multiple process window metrics for the features based on the first set of process windows; and
    ranking the features based on one or more of the process window metrics.

29. The computer-readable medium of clause 28 further comprising:
    determining, based on the ranking, critical features, wherein the critical features include those of the features with the one or more of the process window metrics satisfying a specified threshold.

30. The computer-readable medium of clause 29, wherein generating the base failure rate model for the group of features includes:
   determining a first group of features of the groups having one or more of the critical features; and
   generating the base failure rate model for the first group of features.
31. The computer-readable medium of clause 28, wherein obtaining the first set of process windows includes:
   plotting the first characteristic parameter for the first feature against dose and focus values on a graph to generate a shape of the first process window.
32. The computer-readable medium of clause 28, wherein the first characteristic parameter includes one of a CD, a defect count, a failure rate, a stochastic edge place-ment error failure rate, or a stochastic placement error, of the first feature.
33. The computer-readable medium of clause 28, wherein obtaining the process window metrics includes:
   performing a shape fitting operation to insert a shape in the first process window to obtain one or more of an exposure latitude, a depth of focus or an area of the shape as the process window metrics.
34. The computer-readable medium of clause 33, wherein performing the shape fitting operation includes:
   performing the shape fitting operation to fit an ellipse in the first process window based on a specified con-dition.
35. The computer-readable medium of clause 34, wherein the specified condition includes the ellipse having (i) a specified area, (ii) a specified exposure latitude, or (iii) a center at a location representative of a specified dose and focus value on a graph.
36. The computer-readable medium of clause 34, wherein performing the shape fitting operation includes:
   determining the exposure latitude as a function of a height of the ellipse and a dose value corresponding to a center of the ellipse.
37. The computer-readable medium of clause 36, wherein the height is determined by a range of dose values occupied by the ellipse on a graph of the first process window.
38. The computer-readable medium of clause 34, wherein performing the shape fitting operation includes:
   determining the depth of focus based on a width of the ellipse, wherein the width is determined by a range of focus values occupied by the ellipse on a graph of the first process window.
39. The computer-readable medium of clause 28, wherein obtaining the process window metrics for the first feature includes:
   obtaining a second set of process windows of the features, wherein the second set of process windows includes a second process window of the first fea-ture, wherein the second set of process windows is a function of (i) a second characteristic parameter associated with the features and (ii) a second set of dose and focus values associated with the second characteristic parameter;
   performing an overlapping operation with the first process window and the second process window to generate an overlapped processed window, wherein the overlapped processed window is an intersection of shapes of the first process window and the second process window on a graph; and
   obtaining the process window metrics for the first feature based on the overlapped processed window.

40. The computer-readable medium of clause 28 further comprising:
   obtaining a set of process window metrics for each group of the groups of features based on a process window related to a failure rate of the corresponding group; and
   ranking the groups of features based on one or more of the set of process window metrics.
41. A non-transitory computer-readable medium having instructions that, when executed by a computer, cause the computer to execute a method for determining process windows of a patterning process, the method comprising:
   obtaining measurement data of a plurality of features printed on a substrate;
   deriving a characteristic parameter of the plurality of features from the measurement data, wherein the measurement data comprise data indicative of place-ment errors of the plurality of features; and
   generating, based on the characteristic parameter asso-ciated with the features, a failure rate model for the features, wherein the failure rate model is configured to determine a process window corresponding to a failure rate of the features.
42. The computer-readable medium of clause 41, wherein the measurement data comprises one or more of an edge placement error (EPE) value, or a placement error (PE) value associated with a feature of the features.
43. The computer-readable medium of clause 42, wherein the PE value is determined based on a deviation of a portion of the feature from a corresponding portion of a corresponding target feature.
44. The computer-readable medium of clause 42, wherein the EPE value is determined based on a CD value of the feature, the PE value of the feature and a target CD value of a corresponding target feature.
45. The computer-readable medium of clause 42, wherein the characteristic parameter is a parameter that is derived from at least one of the PE value or the EPE value in combination with a CD value.
46. The computer-readable medium of clause 42, wherein the characteristic parameter includes a CDe parameter that is derived from the CD value and the PE value associated with the feature.
47. The computer-readable medium of clause 42, wherein the characteristic parameter includes a PEe parameter that is derived from a target CD value of a target feature corresponding to the feature and the PE value associ-ated with the feature.
48. The computer-readable medium of clause 41, wherein generating the failure rate model for the features includes:
   determining LCDU data of the features based on the characteristic parameter;
   obtaining, based on the LCDU data, (i) a probability density function of the characteristic parameter of the features defined as a function of the characteristic parameter, a dose value and a variance of the dose value of the patterning process, and (ii) a character-istic parameter limit of the patterning process based on failure rate measurements of the features;
   determining an estimated failure rate of the features based on the characteristic parameter limit and the probability density function of the characteristic parameter; and
   generating the failure rate model operable to determine a process window related to the dose value such that the estimated failure rate of the features is less than a predetermined threshold.

49. The computer-readable medium of clause 48, wherein determining the LCDU data of the features includes: determining the LCDU data of the features by:
   obtaining the LCDU data of each feature of the features,
   obtaining mean value of the characteristic parameter of each feature, and
   removing the mean value from the LCDU data.

50. A non-transitory computer-readable medium having instructions that, when executed by a computer, cause the computer to execute a method for determining process windows of a patterning process, the method comprising:
   obtaining measurement data of a plurality of features printed on a substrate, wherein the measurement data includes one or more of a CD value, an edge placement error (EPE) value, or a placement error (PE) value associated with a feature of the features;
   deriving a characteristic parameter of the plurality of features, wherein the characteristic parameter includes a CDe parameter derived from the CD value and the PE value; and
   generating, based on the characteristic parameter associated with the features, a failure rate model for the features, wherein the failure rate model is configured to identify a process window related to a failure rate of the features.

51. The computer-readable medium of clause 50, wherein generating the failure rate model includes:
   determining local CDe uniformity (LCDeU) data of the features based on the CDe parameter;
   obtaining, based on the LCDeU data, (i) a probability density function of CDe of the features defined as a function of the CDe parameter, a dose value and a variance of the dose value of the patterning process, and (ii) a CDe limit of the patterning process based on failure rate measurements of the features;
   determining an estimated failure rate of the features based on the CDe limit and the probability density function of the CDe; and
   generating the failure rate model, which identifies the process window related to the dose value such that the estimated failure rate of the features is less than a predetermined threshold.

52. The computer-readable medium of clause 51, wherein determining the LCDeU data of the features includes: determining the LCDeU data of the features by:
   obtaining the LCDeU data of each feature of the features;
   obtaining CDe mean of each feature; and
   removing the CDe mean from the LCDeU data.

53. A non-transitory computer-readable medium having instructions that, when executed by a computer, cause the computer to execute a method for determining process windows of a patterning process, the method comprising:
   obtaining measurement data of a plurality of features printed on a substrate, wherein the measurement data includes one or more of a CD value, an edge placement error (EPE) value, or a placement error (PE) value associated with a feature of the features;
   deriving a characteristic parameter of the features, wherein the characteristic parameter includes a PEe parameter derived from a target CD value and the PE value; and generating, based on the characteristic parameter associated with the features, a failure rate model for the features, wherein the failure rate model is configured to identify a process window related to a failure rate of the features.

54. The computer-readable medium of clause 53, wherein generating the failure rate model includes:
   obtaining a mean CD of the features;
   determining the LCDU data of the features based on the mean CD;
   obtaining, based on the LCDU data, (i) a probability density function of PEe of the features defined as a function of the PEe parameter, a dose value and a variance of the dose value of the patterning process, and (ii) a PEe limit of the patterning process based on failure rate measurements of features in the features;
   determining an estimated failure rate of the features based on the PEe limit and the probability density function of the PEe; and
   generating the failure rate model, which identifies the process window related to the dose value such that the estimated failure rate of the features is less than a predetermined threshold.

55. A non-transitory computer-readable medium having instructions that, when executed by a computer, cause the computer to execute a method for determining a process window of a patterning process based on a failure rate, the method comprising:
   grouping, based on a metric, a plurality of features into a plurality of groups, wherein each group of the plurality of groups includes a subset of the features;
   generating a base failure rate model for a group of the plurality of groups based on measurement data associated with features in the group, wherein the base failure rate model identifies a process window related to an estimated failure rate of the group of features; and
   generating, using the base failure rate model and measurement data associated with a specified feature, a feature-specific failure rate model for the specified feature, wherein the feature-specific failure rate model identifies a feature-specific process window such that an estimated failure rate of the specified feature is below a specified threshold.

56. The computer-readable medium of any of clauses 55, wherein grouping the features includes:
   for each feature of the features, obtaining a mean CD value of the corresponding feature and a plurality of dose values and focus values associated with the mean CD at an edge of a process window of the corresponding feature, and
   clustering the features into the groups based on metric values for the features, wherein the features within a specific group have metric values that vary within a first threshold.

57. The computer-readable medium of clause 55 further comprising:
   storing the base failure rate model in a database, wherein the database includes a plurality of base failure rate models, wherein each base failure rate model corresponds to a group of features with a specified metric value.

58. The computer-readable medium of clause 57, wherein generating the feature-specific failure rate model includes:

receiving measurement data associated with the specified feature, wherein the measurement data includes mean CD value of the specified feature for a plurality of dose and focus values;

determining a specified metric value from the measurement data associated with the specified feature, wherein the specified metric value is determined as a function of a specified mean CD value and a dose value associated with the specified mean CD value at an edge of a process window associated with the specified feature for a specified focus value; and selecting, from the database, a specified base failure rate model whose metric value matches the specified metric value.

59. The computer-readable medium of clause 58 further comprising:

obtaining a base probability density function of CD from the specified base failure rate model; and adjusting a mean CD of the base probability density function based on the specified mean CD value to generate an adjusted probability density function.

60. The computer-readable medium of clause 59 further comprising:

determining a first CD limit or a second CD limit of the patterning process using the adjusted probability density function, wherein, when a CD of the specified feature is above the first CD limit or below the second CD limit, the estimated failure rate of the specified feature is within the specified threshold.

61. The computer-readable medium of clause 60 further comprising:

obtaining at least one of an interfield CD variation, intrafield CD variation, a probability density function of CD of the specified feature as CD profile data; and convoluting the adjusted probability density function with the CD profile data to generate a convoluted probability density function.

62. The computer-readable medium of clause 61 further comprising:

determining the estimated failure rate of the specific feature based on the first CD limit, the second CD limit and the convoluted probability density function; and generating the feature-specific failure rate model, which identifies the feature-specific process window such that the estimated failure rate of the specified feature is less than the specified threshold.

63. The computer-readable medium of clause 62 further comprising:

adjusting of one or more apparatuses of the patterning process based on the process window related to the specified feature to minimize a failure rate associated with the specified feature.

64. The computer-readable medium of clause 63, wherein the one or more apparatuses includes a lithographic apparatus configured to perform patterning on the substrate based on the feature-specific process window.

65. A method for determining process windows of a patterning process, the method comprising:

obtaining measurement data of a plurality of features printed on a substrate;

grouping, based on a metric, the features into a plurality of groups; and generating, based on the measurement data associated with a group of features, a base failure rate model for the group of features, wherein the base failure rate model is configured to identify a process window related to a failure rate of the group of features.

66. A method for determining process windows of a patterning process, the method comprising:

obtaining measurement data of a plurality of features printed on a substrate;

grouping, based on a metric, the plurality of features into a plurality of groups, wherein each group of the plurality of groups includes a subset of the features;

generating a base failure rate model for a group of the plurality of groups based on the measurement data associated with the group of features, wherein the base failure rate model is configured to identify a process window related to a failure rate of the group of features; and generating, using the base failure rate model and measurement data associated with a specific feature, a feature-specific failure rate model for the specific feature, wherein the feature-specific failure rate model identifies a feature-specific process window such that an estimated failure rate of the specific feature is below a specified threshold.

67. A non-transitory computer-readable medium having instructions recorded thereon, the instructions when executed by a computer implementing the method of any of the above clauses.

68. A non-transitory computer-readable medium having instructions that, when executed by a computer, cause the computer to execute a method for determining critical features printed on a substrate, the method comprising:

obtaining measurement data of a plurality of features printed on a substrate;

obtaining, based on the measurement data, a first set of process windows of the features, wherein the first set of process windows is representative of a first characteristic parameter of the features for a first set of dose and focus values, wherein the first set of process windows includes a first process window of a first feature of the features;

obtaining multiple process window metrics for each of the features based on the first set of process windows; and determining those of the features with the one or more of the process window metrics satisfying a specified threshold as critical features.

69. The computer-readable medium of clause 68, further comprising:

grouping, based on a metric, the plurality of features into a plurality of groups;

determining a group of features of the groups having one or more of the critical features; and generating, based on the measurement data associated with the group of features, a base failure rate model for the group of features, wherein the base failure rate model is configured to identify a process window related to a failure rate of the group of features.

70. The computer-readable medium of clause 68, wherein obtaining the process window metrics includes:

performing a shape fitting operation to insert a shape in the first process window to obtain one or more of an exposure latitude, a depth of focus or an area of the shape as the process window metrics of the first feature.

71. The computer-readable medium of clause 70, wherein performing the shape fitting operation includes:

performing the shape fitting operation to fit an ellipse in the first process window based on a specified condition.

72. The computer-readable medium of clause 71, wherein the specified condition includes the ellipse having (i) a specified area, (ii) a specified exposure latitude, or (iii) a center at a location representative of a specified dose and focus value on a graph.

73. The computer-readable medium of clause 71, wherein performing the shape fitting operation includes:
    determining the exposure latitude as a function of a height of the ellipse and a dose value corresponding to a center of the ellipse.

74. The computer-readable medium of clause 73, wherein the height is determined by a range of dose values occupied by the ellipse on a graph of the first process window.

75. The computer-readable medium of clause 71, wherein performing the shape fitting operation includes:
    determining the depth of focus based on a width of the ellipse, wherein the width is determined by a range of focus values occupied by the ellipse on a graph of the first process window.

76. A non-transitory computer-readable medium having instructions that, when executed by a computer, cause the computer to execute a method for determining critical features printed on a substrate, the method comprising:
    obtaining measurement data of a plurality of features printed on a substrate;
    obtaining, based on the measurement data, a first set of process windows of the features, wherein the first set of process windows is representative of a first characteristic parameter of the features for a first set of dose and focus values, wherein the first set of process windows includes a first process window of a first feature of the features;
    obtaining, based on the measurement data, a second set of process windows of the features, wherein the second set of process windows is representative of a second characteristic parameter of the features for a second set of dose and focus values, wherein the second characteristic parameter is different from the first characteristic parameter, wherein the second set of process windows includes a second process window of the first feature;
    performing an overlapping operation with the first process window and the second process window to generate a first overlapped processed window, wherein the first overlapped processed window is an intersection of shapes of the first process window and the second process window on a graph;
    obtaining multiple process window metrics for each of the features based on an overlapped process window of the corresponding feature; and
    determining those of the features with the one or more of the process window metrics satisfying a specified threshold as critical features.

77. The computer-readable medium of clause 76, further comprising:
    grouping, based on a metric, the plurality of features into a plurality of groups;
    determining a group of features of the groups having one or more of the critical features; and
    generating, based on the measurement data associated with the group of features, a base failure rate model for the group of features, wherein the base failure rate model is configured to identify a process window related to a failure rate of the group of features.

78. The computer-readable medium of clause 76, wherein obtaining the process window metrics includes:
    performing a shape fitting operation to insert a shape in the first process window to obtain one or more of an exposure latitude, a depth of focus or an area of the shape as the process window metrics of the first feature.

79. The computer-readable medium of clause 78, wherein performing the shape fitting operation includes:
    performing the shape fitting operation to fit an ellipse in the first process window based on a specified condition.

80. The computer-readable medium of clause 79, wherein the specified condition includes the ellipse having (i) a specified area, (ii) a specified exposure latitude, or (iii) a center at a location representative of a specified dose and focus value on a graph.

81. The computer-readable medium of clause 79, wherein performing the shape fitting operation includes:
    determining the exposure latitude as a function of a height of the ellipse and a dose value corresponding to a center of the ellipse.

82. The computer-readable medium of clause 81, wherein the height is determined by a range of dose values occupied by the ellipse on a graph of the first process window.

83. The computer-readable medium of clause 79, wherein performing the shape fitting operation includes:
    determining the depth of focus based on a width of the ellipse, wherein the width is determined by a range of focus values occupied by the ellipse on a graph of the first process window.

84. A method comprising:
    obtaining measurement data of a plurality of features printed on a substrate; and
    generating, based on the measurement data associated with a group of features that are different, a base failure rate model for the group of features, wherein the base failure rate model is configured to identify a process window according a failure rate of the group of features.

85. The method of clause 84, further comprising grouping, based on a metric, the plurality of features into a plurality of groups comprising the group.

86. The computer-readable medium of clause 84, wherein the metric includes: (a) a process window of each feature of the features, wherein the process window is a function of process variables associated with the corresponding feature, and (b) a characteristic parameter associated with the corresponding feature.

87. The method of clause 85, wherein the process variables include a focus and dose value associated with an apparatus used for the patterning process, and wherein the characteristic parameter includes a critical dimension (CD) value of the corresponding feature.

88. The method of clause 85, wherein grouping the features includes:
    for each feature of the features, obtaining as a metric value a mean CD value of the corresponding feature and a plurality of dose values and focus values associated with the mean CD at an edge of a process window of the corresponding feature, and

clustering the features into the groups of features based on the metric values for the features, wherein features within a specific group have metric values within a first threshold.

89. The method of clause 84, wherein obtaining the measurement data of the plurality of features includes:

obtaining images having the features printed on the substrate, and analyzing the images to select features that satisfy a specified criterion as the plurality of features.

90. The method of clause 89, wherein the specified criterion includes a number of occurrences of a feature on the substrate being below a first threshold or a number of occurrences of the feature in an image of the images being below a second threshold.

91. The method of clause 84, wherein generating the base failure rate model for the group of features includes:

obtaining mean CD of the group of features;

determining local CD uniformity (LCDU) data of the group of features as the measurement data associated with the group of features;

obtaining, based on the LCDU data, (i) a probability density function of CD of the group of features defined as a function of the mean CD, a dose value and a variance of the dose value of the patterning process, and (ii) a CD limit of the patterning process based on failure rate measurements of features in the group of features;

determining an estimated failure rate of the group of features based on the CD limit and the probability density function of the CD; and generating the base failure rate model, which identifies the process window related to the dose value such that the estimated failure rate of the group of features is less than a predetermined threshold.

92. The method of clause 84 further comprising:

using the base failure rate model and characteristic data of the specific feature to generate a feature-specific failure rate model for a specific feature wherein the feature-specific failure rate model identifies a feature-specific process window such that an estimated failure rate of the specific feature is below a specified threshold.

93. The method of clause 92, wherein generating the feature-specific failure rate model includes:

receiving measurement data associated with the specific feature, wherein the measurement data includes CD value of the specific feature for a plurality of dose and focus values;

determining a specified metric value from the measurement data, wherein the specified metric value is determined as a function of a specified mean CD value and a plurality of dose values and focus values associated with the specified mean CD value at an edge of a process window associated with the specific feature; and selecting, from the database, a specified base failure rate model whose metric value matches the specified metric value.

94. The method of clause 92 further comprising:

obtaining a base probability density function of CD from the specified base failure rate model; and adjusting a mean CD of the base probability density function based on the specified mean CD value to generate an adjusted probability density function.

95. The computer-readable medium of clause 94 further comprising:

obtaining at least one of an interfield CD variation, intrafield CD variation, a probability density function of CD of the specific feature as CD profile data; and convoluting the adjusted probability density function with the CD profile data to generate a convoluted probability density function associated with the specific feature.

96. The computer-readable medium of clause 12 further comprising:

determining the estimated failure rate of the specific feature based on the first CD limit, the second CD limit and the convoluted probability density function; and generating the feature-specific failure rate model configured to identify the feature-specific process window.

97. The method of clause 92 further comprising:

adjusting of one or more apparatuses of the patterning process based on the process window related to the specified feature to minimize a failure rate associated with the specified feature.

98. A non-transitory computer-readable medium having instructions that, when executed by a computer, cause the computer to execute a method as described in clauses 84-97.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

The invention claimed is:

1. A non-transitory computer-readable medium having instructions that, when executed by a computer system, are configured to cause the computer system to at least:

obtain measurement data of a plurality of features printed on a substrate, the measurement data comprising tens of thousands or more data points;

generate, based on the measurement data associated with a group of features that are different, a base failure rate model for the group of features, wherein the base failure rate model is configured to identify a process window according to a failure rate of the group of features; and use the base failure rate model and characteristic data of a specific feature to generate a feature-specific failure rate model for the specific feature, wherein the feature-specific failure rate model identifies a feature-specific process window such that an estimated failure rate of the specific feature is below a specified threshold.

2. The computer-readable medium of claim 1, wherein the instructions are further configured to cause the computer system to group, based on a metric, the plurality of features into a plurality of groups comprising the group.

3. The computer-readable medium of claim 2, wherein the metric includes: (a) a process window of each feature of the features, wherein the process window is a function of process variables associated with the corresponding feature, and (b) a characteristic parameter associated with the corresponding feature.

4. The computer-readable medium of claim 3, wherein the process variables include a focus and dose value associated with an apparatus used for the patterning process, and wherein the characteristic parameter includes a critical dimension (CD) value of the corresponding feature.

5. The computer-readable medium of claim 2, wherein the instructions configured to cause the computer system to group the features are further configured to cause the computer system to:

for each feature of the features, obtain as a metric value a mean CD value of the corresponding feature and a plurality of dose values and focus values associated with the mean CD at an edge of a process window of the corresponding feature, and cluster the features into the groups of features based on the metric values for the features, wherein features within a specific group have metric values within a threshold.

6. The computer-readable medium of claim 1, wherein the instructions configured to cause the computer system to obtain the measurement data are further configured to cause the computer system to:

obtain images having the features printed on the substrate, and analyze the images to select features that satisfy a specified criterion as the plurality of features.

7. The computer-readable medium of claim 6, wherein the specified criterion includes a number of occurrences of a feature on the substrate being below a first threshold or a number of occurrences of the feature in an image of the images being below a second threshold.

8. The computer-readable medium of claim 1, wherein the instructions configured to cause the computer system to generate the base failure rate model for the group of features are further configured to cause the computer system to:

obtain mean CD of the group of features;

determine local CD uniformity (LCDU) data of the group of features as the measurement data associated with the group of features;

obtain, based on the LCDU data, (i) a probability density function of CD of the group of features defined as a function of the mean CD, a dose value and a variance of the dose value of the patterning process, and (ii) a CD limit of the patterning process based on failure rate measurements of features in the group of features;

determine an estimated failure rate of the group of features based on the CD limit and the probability density function of the CD; and generate the base failure rate model, which identifies the process window related to the dose value such that the estimated failure rate of the group of features is less than a predetermined threshold.

9. The computer-readable medium of claim 1, wherein the instructions configured to cause the computer system to generate the feature-specific failure rate model are further configured to cause the computer system to:

receive measurement data associated with the specific feature, wherein the measurement data includes CD values of the specific feature for a plurality of dose and focus values;

determine a specified metric value from the measurement data, wherein the specified metric value is determined as a function of a specified mean CD value and a plurality of dose values and focus values associated with the specified mean CD value at an edge of a process window associated with the specific feature; and select, from the database, a specified base failure rate model whose metric value matches the specified metric value.

10. The computer-readable medium of claim 1, wherein the instructions are further configured to cause the computer system to:

obtain a base probability density function of CD from the specified base failure rate model; and adjust a mean CD of the base probability density function based on the specified mean CD value to generate an adjusted probability density function.

11. The computer-readable medium of claim 10, wherein the instructions are further configured to cause the computer system to:

obtain as CD profile data at least one selected from: an interfield CD variation, intrafield CD variation, and/or a probability density function of CD of the specific feature; and

convolve the adjusted probability density function with the CD profile data to generate a convoluted probability density function associated with the specific feature.

12. The computer-readable medium of claim 11, wherein the instructions are further configured to cause the computer system to:

determine the estimated failure rate of the specific feature based on the convoluted probability density function; and generate the feature-specific failure rate model configured to identify the feature-specific process window.

13. The computer-readable medium of claim 1, wherein the instructions are further configured to cause the computer system to adjust one or more apparatuses of the patterning process based on the process window related to the specified feature to reduce or minimize a failure rate associated with the specified feature.

14. The computer-readable medium of claim 1, wherein the instructions configured to cause the computer system to obtain the measurement data are further configured to cause the computer system to:

obtain a first set of process windows of the features, wherein the first set of process windows is representative of a first characteristic parameter of the features for a first set of dose and focus values, wherein the first set of process windows includes a first process window of a first feature of the features;

obtain multiple process window metrics for the features based on the first set of process windows;

rank the features based on one or more of the process window metrics;

obtain a second set of process windows of the features, wherein the second set of process windows includes a second process window of the first feature, wherein the second set of process windows is a function of (i) a second characteristic parameter associated with the features and (ii) a second set of dose and focus values associated with the second characteristic parameter;

perform an overlapping operation with the first process window and the second process window to generate an overlapped processed window, wherein the overlapped processed window is an intersection of shapes of the first process window and the second process window on a graph; and obtain the process window metrics for the first feature based on the overlapped processed window.

15. A method comprising:

obtaining measurement data of a plurality of features printed on a substrate, the measurement data comprising tens of thousands or more data points;

generating, by a hardware computer system and based on the measurement data associated with a group of features that are different, a base failure rate model for the group of features, wherein the base failure rate model is configured to identify a process window according to a failure rate of the group of features; and using, by the hardware computer system, the base failure rate model and characteristic data of a specific feature to generate a feature-specific failure rate model for the specific feature, wherein the feature-specific failure rate model identifies a feature-specific process window such that an estimated failure rate of the specific feature is below a specified threshold.

16. The method of claim 15, further comprising grouping, based on a metric, the plurality of features into a plurality of groups comprising the group.

17. The method of claim 15, wherein the generating the base failure rate model for the group of features includes:

obtaining mean CD of the group of features;

determining local CD uniformity (LCDU) data of the group of features as the measurement data associated with the group of features;

obtaining, based on the LCDU data, (i) a probability density function of CD of the group of features defined as a function of the mean CD, a dose value and a variance of the dose value of the patterning process, and (ii) a CD limit of the patterning process based on failure rate measurements of features in the group of features;

determining an estimated failure rate of the group of features based on the CD limit and the probability density function of the CD; and generating the base failure rate model, which identifies the process window related to the dose value such that the estimated failure rate of the group of features is less than a predetermined threshold.

18. The method of claim 15, wherein the obtaining the measurement data includes:

obtaining a first set of process windows of the features, wherein the first set of process windows is representative of a first characteristic parameter of the features for a first set of dose and focus values, wherein the first set of process windows includes a first process window of a first feature of the features;

obtaining multiple process window metrics for the features based on the first set of process windows;

ranking the features based on one or more of the process window metrics;

obtaining a second set of process windows of the features, wherein the second set of process windows includes a second process window of the first feature, wherein the second set of process windows is a function of (i) a second characteristic parameter associated with the features and (ii) a second set of dose and focus values associated with the second characteristic parameter;

performing an overlapping operation with the first process window and the second process window to generate an overlapped processed window, wherein the overlapped processed window is an intersection of shapes of the first process window and the second process window on a graph; and obtaining the process window metrics for the first feature based on the overlapped processed window.

19. The method of claim 15, further comprising:

receiving measurement data associated with the specific feature, wherein the measurement data includes CD values of the specific feature for a plurality of dose and focus values;

determining a specified metric value from the measurement data, wherein the specified metric value is determined as a function of a specified mean CD value and a plurality of dose values and focus values associated with the specified mean CD value at an edge of a process window associated with the specific feature; and selecting, from the database, a specified base failure rate model whose metric value matches the specified metric value.

20. The method of claim 15, further comprising:

obtaining a base probability density function of CD from the specified base failure rate model; and adjusting a mean CD of the base probability density function based on the specified mean CD value to generate an adjusted probability density function.

* * * * *